United States Patent
Zhou et al.

(10) Patent No.: US 10,998,331 B2
(45) Date of Patent: May 4, 2021

(54) THREE-DIMENSIONAL INVERSE FLAT NAND MEMORY DEVICE CONTAINING PARTIALLY DISCRETE CHARGE STORAGE ELEMENTS AND METHODS OF MAKING THE SAME

(71) Applicant: SANDISK TECHNOLOGIES LLC, Addison, TX (US)

(72) Inventors: Fei Zhou, San Jose, CA (US); Yingda Dong, San Jose, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 117 days.

(21) Appl. No.: 16/020,505

(22) Filed: Jun. 27, 2018

(65) Prior Publication Data
US 2020/0006375 A1 Jan. 2, 2020

(51) Int. Cl.
*H01L 27/11582* (2017.01)
*H01L 27/1157* (2017.01)
(Continued)

(52) U.S. Cl.
CPC .... *H01L 27/11582* (2013.01); *H01L 27/1157* (2013.01); *H01L 27/11565* (2013.01); *H01L 21/31116* (2013.01); *H01L 29/40117* (2019.08)

(58) Field of Classification Search
CPC ......... H01L 21/28282; H01L 21/31116; H01L 27/11565; H01L 27/1157; H01L 27/11582
(Continued)

(56) References Cited

U.S. PATENT DOCUMENTS

| | | | |
|---|---|---|---|
| 5,915,167 A | 6/1999 | Leedy | |
| 9,524,779 B2 | 12/2016 | Kai et al. | |

(Continued)

FOREIGN PATENT DOCUMENTS

KR 1020100104908 A 9/2010

OTHER PUBLICATIONS

Lue, H.T. et al., "A 128Gb (MLC)/192Gb (TLC) Single-Gate Vertical Channel (SGVC) Architecture 3D NAND using only 16 Layers with Robust Read Disturb, Long-Retention and Excellent Scaling Capability," IEDM Proceedings, pp. IEDM17-461 to IEDM17-464, (2017).

(Continued)

*Primary Examiner* — Lynne A Gurley
*Assistant Examiner* — Vernon P Webb
(74) *Attorney, Agent, or Firm* — The Marbury Law Group PLLC

(57) ABSTRACT

A three-dimensional memory device includes alternating stacks of insulating strips and electrically conductive strips located over a substrate and laterally spaced apart among one another by line trenches. The line trenches laterally extend along a first horizontal direction and are spaced apart along a second horizontal direction. Each line trench fill structure includes a laterally undulating dielectric rail having a laterally undulating width along the second horizontal direction and extending along the first horizontal direction and a row of memory stack structures located at neck regions of the laterally undulating dielectric rail. Each memory stack structure includes a vertical semiconductor channel, a blocking dielectric contacting an outer sidewall of the vertical semiconductor channel, and a charge storage layer contacting an outer sidewall of the blocking dielectric, vertically extending continuously through each level of the electrically (Continued)

FIG. 13D conductive strips, and having a vertically undulating lateral thickness.

20 Claims, 42 Drawing Sheets

(51) Int. Cl.
    *H01L 27/11565*    (2017.01)
    *H01L 21/311*      (2006.01)
    *H01L 21/28*       (2006.01)

(58) Field of Classification Search
    USPC .................................................. 257/314–328
    See application file for complete search history.

(56) References Cited

U.S. PATENT DOCUMENTS

| | | | |
|---|---|---|---|
| 9,620,514 | B2 | 4/2017 | Kai et al. |
| 9,627,399 | B2 | 4/2017 | Kanakamedala et al. |
| 9,666,594 | B2 | 5/2017 | Mizuno et al. |
| 9,728,546 | B2 | 8/2017 | Serov et al. |
| 9,837,431 | B2 | 12/2017 | Nishikawa et al. |
| 9,917,100 | B2 | 3/2018 | Zhang et al. |
| 9,960,180 | B1 | 5/2018 | Zhou et al. |
| 9,985,098 | B2 | 5/2018 | Matsumoto et al. |
| 10,008,570 | B2 | 6/2018 | Yu et al. |
| 2006/0071264 | A1 | 4/2006 | Hemink et al. |
| 2012/0001250 | A1 | 1/2012 | Alsmeier |
| 2016/0149002 | A1* | 5/2016 | Sharangpani ....... H01L 29/1054 257/314 |
| 2016/0276360 | A1 | 9/2016 | Doda et al. |
| 2016/0336342 | A1 | 11/2016 | Ramaswamy et al. |
| 2018/0040623 | A1 | 2/2018 | Kanakamedala et al. |
| 2018/0122905 | A1 | 5/2018 | Ogawa et al. |

OTHER PUBLICATIONS

Lin et al., "Nickel Silicide for Interconnects," 2015 IEEE International Interconnect Technology Conference and 2015 IEEE Materials for Advanced Metallization Conference (IITC/MAM), May 18-21, 2015.
U.S. Appl. No. 15/626,444, filed Jun. 19, 2017, Sandisk Technologies LLC.
U.S. Appl. No. 15/971,525, filed May 4, 2018, Sandisk Technologies LLC.
U.S. Appl. No. 16/002,294, filed Jun. 7, 2018, Sandisk Technologies LLC.
U.S. Appl. No. 62/630,408, filed Feb. 14, 2018, Sandisk Technologies LLC.
Notification of Transmittal of the International Search Report and Written Opinion of the International Searching Authority for International Patent Application No. PCT/US2019/018621, dated Jun. 5, 2019, 11 pages.

* cited by examiner

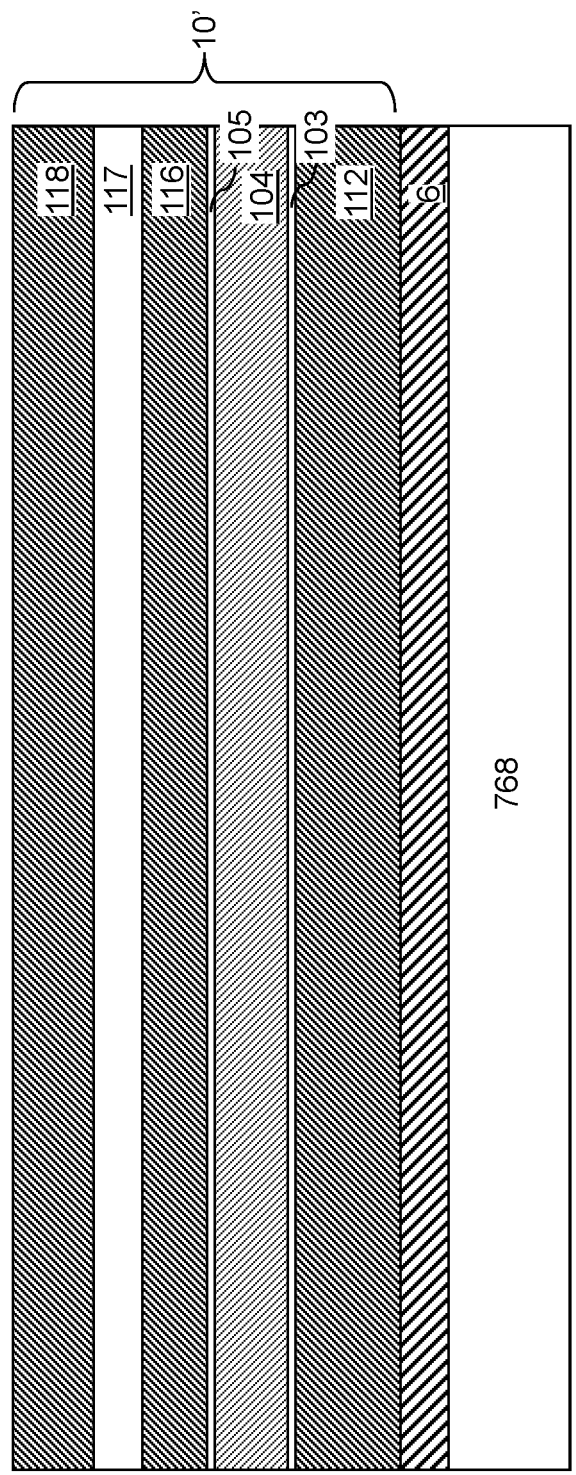

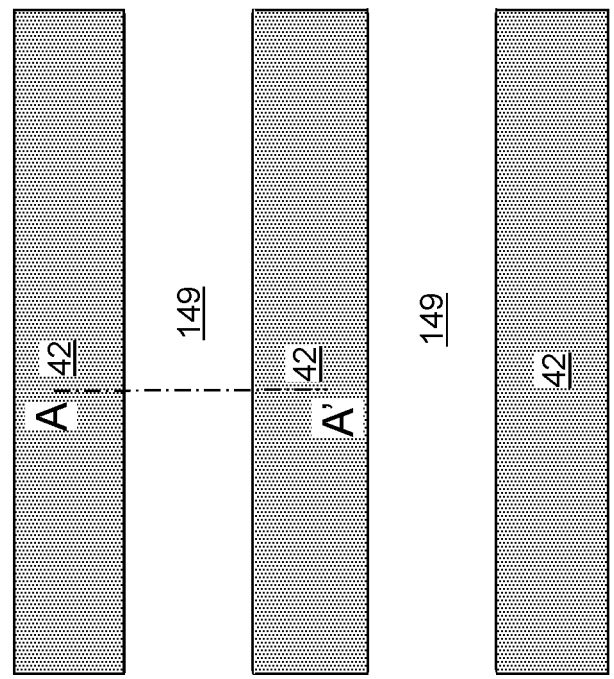
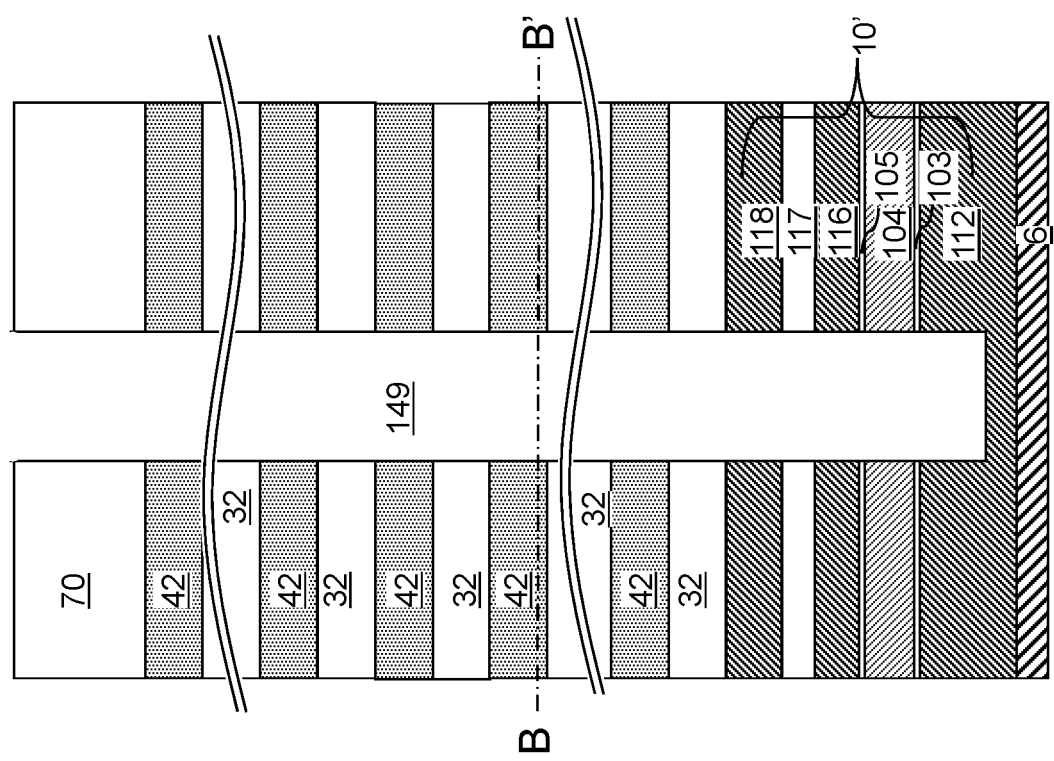
FIG. 5B
FIG. 5A

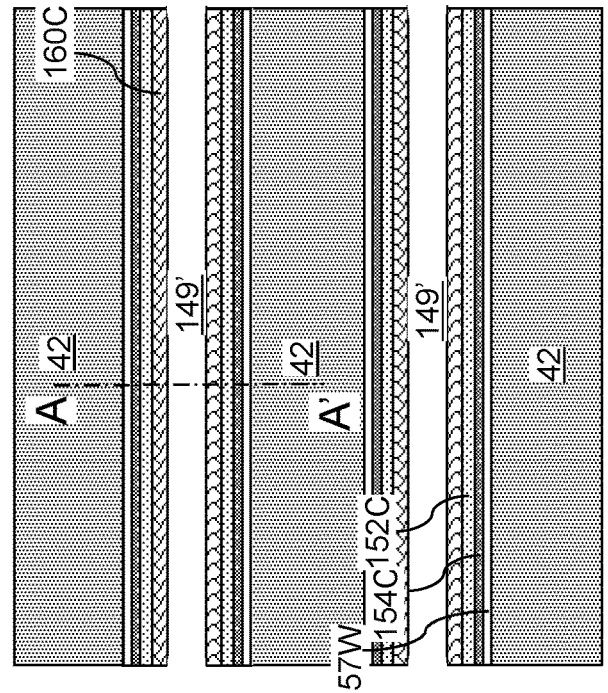
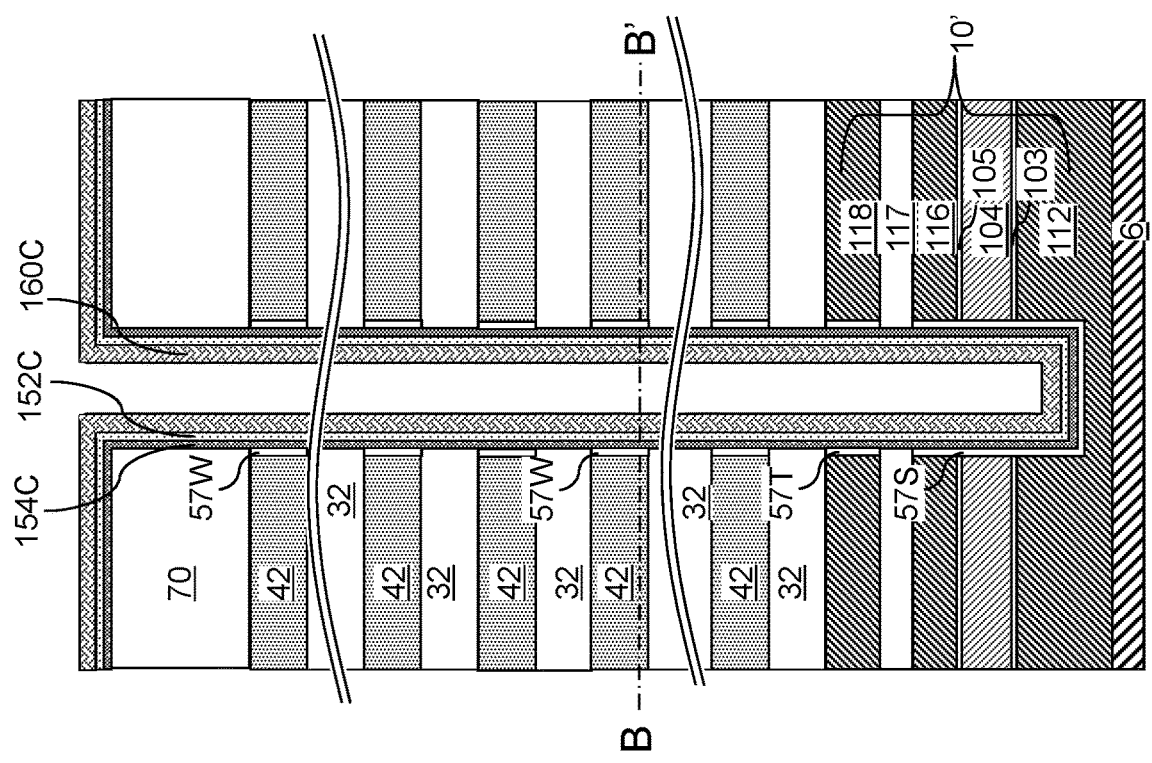
FIG. 6B
FIG. 6A

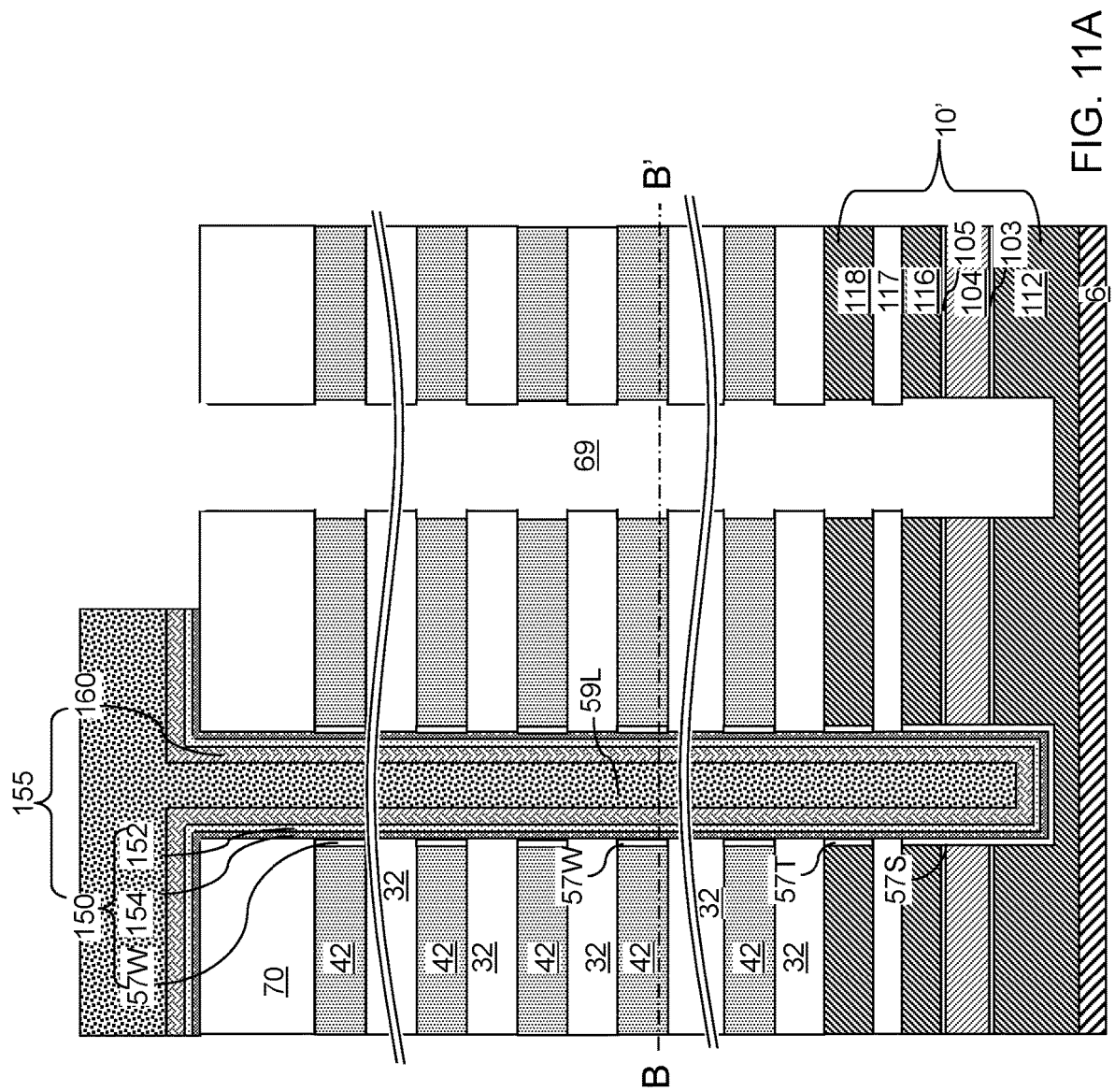

THREE-DIMENSIONAL INVERSE FLAT NAND MEMORY DEVICE CONTAINING PARTIALLY DISCRETE CHARGE STORAGE ELEMENTS AND METHODS OF MAKING THE SAME

FIELD

The present disclosure relates generally to the field of semiconductor devices, and particular to a three-dimensional inverse flat NAND memory device including partially discrete charge storage elements and methods of manufacturing the same.

BACKGROUND

A configuration of a three-dimensional NAND memory device employs flat memory cells in which tunneling dielectrics have flat vertical surfaces. Such flat memory device are described in an article by Hang-Ting Lue et al., titled "A 128 Gb (MLC)/192 Gb (TLC) Single-gate Vertical Channel (SGVC) Architecture 3D NAND using only 16 Layers with Robust Read Disturb, Long-Retention and Excellent Scaling Capability," IEDM Proceedings (2017) page 461.

SUMMARY

According to an aspect of the present disclosure, a three-dimensional memory device is provided, which comprises: alternating stacks of insulating strips and electrically conductive strips located over a substrate and laterally spaced apart among one another by line trenches, wherein the line trenches laterally extend along a first horizontal direction and are spaced apart along a second horizontal direction; and line trench fill structures located in the line trenches, wherein each line trench fill structure comprises a laterally undulating dielectric rail having a laterally undulating width along the second horizontal direction and extending along the first horizontal direction and a row of memory stack structures located at neck regions of the laterally undulating dielectric rail, wherein each memory stack structure comprises a vertical semiconductor channel, a blocking dielectric contacting an outer sidewall of the vertical semiconductor channel, and a charge storage layer contacting an outer sidewall of the blocking dielectric, vertically extending continuously through each level of the electrically conductive strips, and having a vertically undulating lateral thickness.

According to another aspect of the present disclosure, a method of forming a three-dimensional memory device, comprises forming alternating stacks of insulating strips and sacrificial material strips and line trench fill structures over a substrate, wherein the alternating stacks laterally extend along a first horizontal direction and are laterally spaced apart among one another by the line trench fill structures along a second horizontal direction, and wherein each line trench fill structure comprises a laterally undulating dielectric rail having a laterally undulating width along the second horizontal direction and extending along the first horizontal direction and a row of in-process memory stack structures located at neck regions of the laterally undulating dielectric rail and comprising a respective in-process continuous charge storage layer and in-process semiconductor channel. The method further comprises forming backside recesses by removing the sacrificial material strips selective to the insulating strips and selective to the in-process memory stack structures, selectively growing a charge storage material on physically exposed surfaces of the in-process continuous charge storage layers in the backside recesses, wherein each contiguous combination of an in-process continuous charge storage layer and selectively grown portions of the charge storage material constitutes a charge storage layer, and forming a tunneling dielectric and an electrically conductive strip within each of the backside recesses.

BRIEF DESCRIPTION OF THE DRAWINGS

FIG. 1B is a vertical cross-sectional view of the stack of the insulating spacer layer, the buried conductive layer, and the in-process source level layers of the exemplary structure of FIG. 1A.

FIG. 5A is a vertical cross-sectional view of a line trench in the exemplary structure of FIGS. 4A and 4B.

FIG. 5B is a horizontal cross-sectional view along the plane B-B' of FIG. 5A.

FIG. 6A is a vertical cross-sectional view of a line trench after formation of a continuous charge storage material layer, a continuous blocking dielectric material layer, and a semiconductor channel material layer according to an embodiment of the present disclosure.

FIG. 6B is a horizontal cross-sectional view along the plane B-B' of FIG. 6A.

FIG. 11A is a vertical cross-sectional view of a region of the exemplary structure after removal of portions of the semiconductor channel material layer, the continuous blocking dielectric material layer, and the continuous charge storage material layer around each vertical cavity according to an embodiment of the present disclosure.

DETAILED DESCRIPTION

Figure 1A:
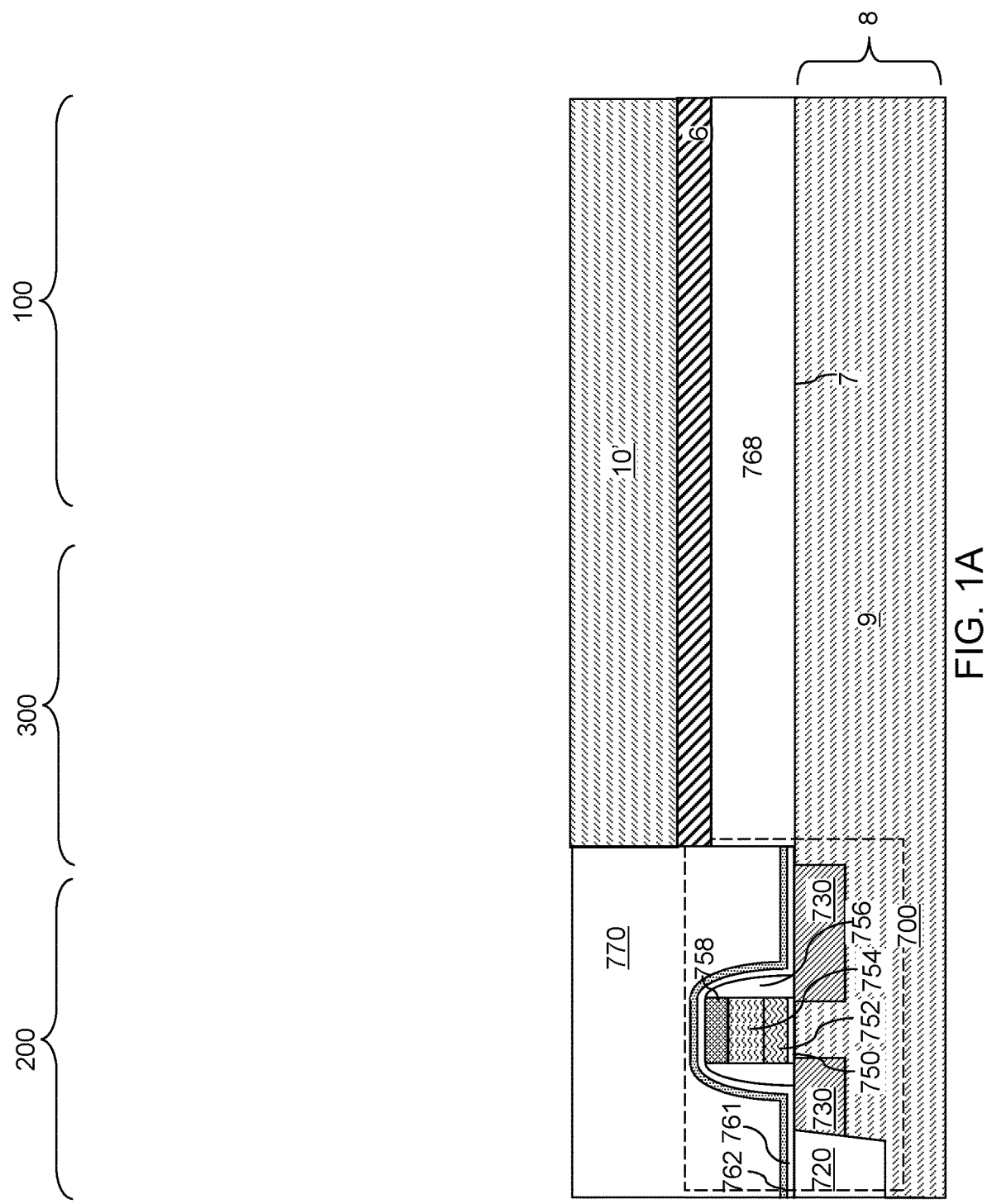
FIG. 1A is a schematic vertical cross-sectional view of an exemplary structure after formation of at least one peripheral device, an insulating spacer layer, a buried conductive layer, and in-process source level layers according to an embodiment of the present disclosure.

As discussed above, the embodiments of the present disclosure are directed to a three-dimensional memory device including an inverse flat NAND memory cells including partially discrete charge storage elements and methods of manufacturing the same, the various aspects of which are discussed herein in detail. The charge storage layers have a vertically modulating lateral thickness that is greater at levels of electrically conductive strips to provide the partially discrete charge storage elements and is less at levels of insulating strips. Sufficient charge storage capacity is provided at levels of the electrically conductive strips, while charge leakage through the levels of the insulating strips is limited through the lesser thickness of the charge storage layer at the levels of the insulating strips.

The flat memory cells of an embodiment of the present disclosure can provided in an inverse configuration, in which the tunneling dielectric is located adjacent to the control gate electrode and the blocking dielectric is located adjacent to the semiconductor channel. The inverse flat memory provides a wider programming window and a wider erase window than prior art flat memory cells. Thus, the embodiments of the present disclosure are directed to three-dimensional memory devices including device including flat inverse NAND memory cells and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIGS. 1A and 1B, an exemplary structure according to a first embodiment of the present disclosure is illustrated, which can be employed, for example, to fabricate a device structure containing vertical NAND memory devices. The exemplary structure includes a substrate 8, such as a silicon wafer or a silicon on insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive strips are to be subsequently formed.

Figure 2:
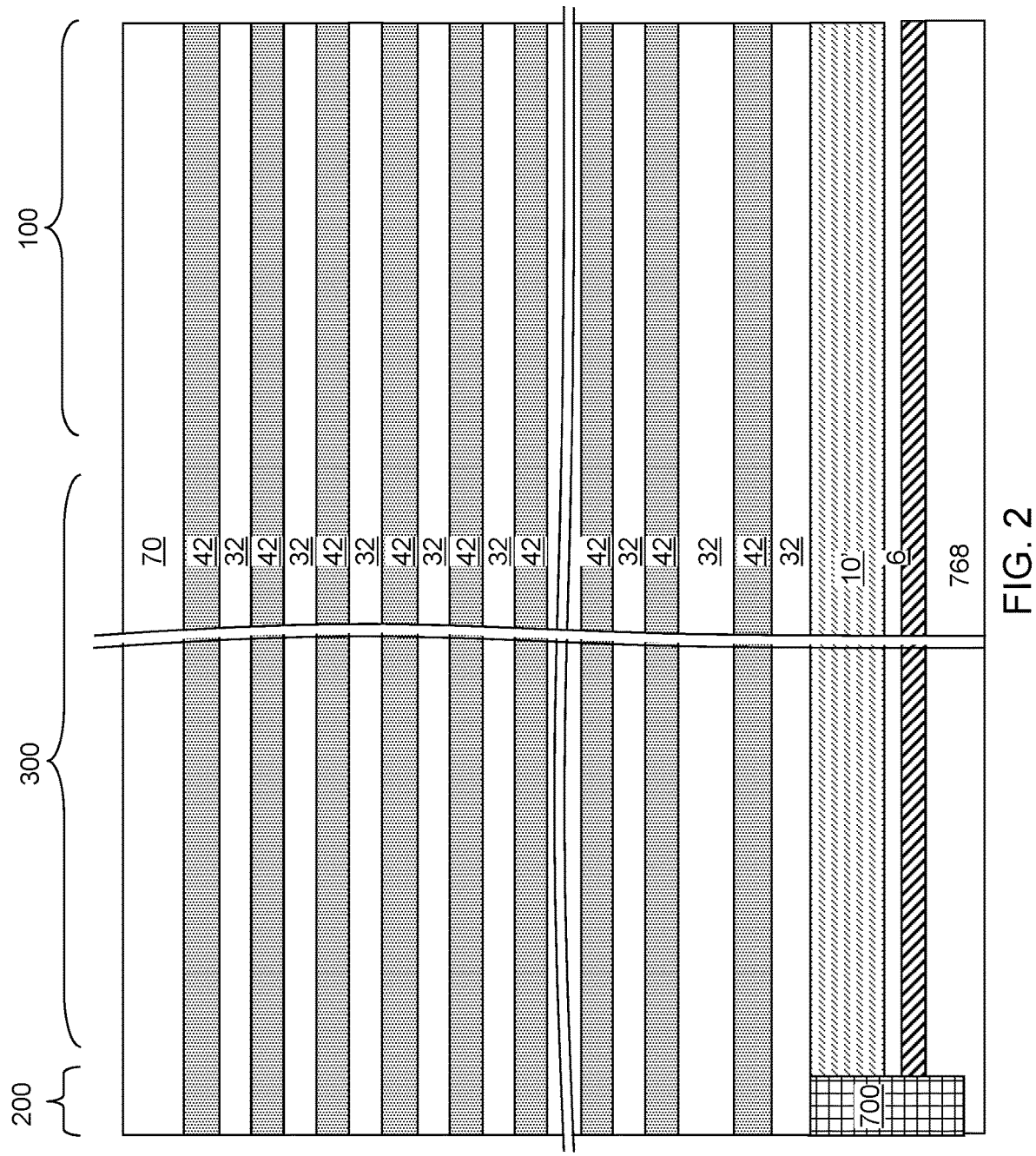
FIG. 2 is a schematic vertical cross-sectional view of the exemplary structure after formation of a vertically alternating sequence of insulating layers and spacer material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating sequence (32, 42). In one embodiment, the alternating sequence (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating sequence (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive strips, embodiments are expressly contemplated herein in which the sacrificial material layers are formed as electrically conductive strips. In this case, steps for replacing the spacer material layers with electrically conductive strips can be omitted.

An insulating cap layer 70 can be formed over the alternating sequence (32, 42). The insulating cap layer 70 includes a sacrificial material that is different from the material of the sacrificial material layers 42. In one embodiment, the insulating cap layer 70 can include a silicate glass material such as undoped silicate glass or a doped silicate glass. Examples of doped silicate glasses include borosilicate glass, phosphosilicate glass, borophosphosilicate glass, and organosilicate glass. The insulating cap layer 70 can be formed by a chemical vapor deposition process. For example, tetraethylorthosilicate (TEOS) can be thermally decomposed in the present or absence of dopant gases to form a doped silicate glass or an undoped silicate glass. The thickness of the insulating cap layer 70 can be in a range from 50 nm to 300 nm, although lesser and greater thicknesses can also be employed.

Figure 3:
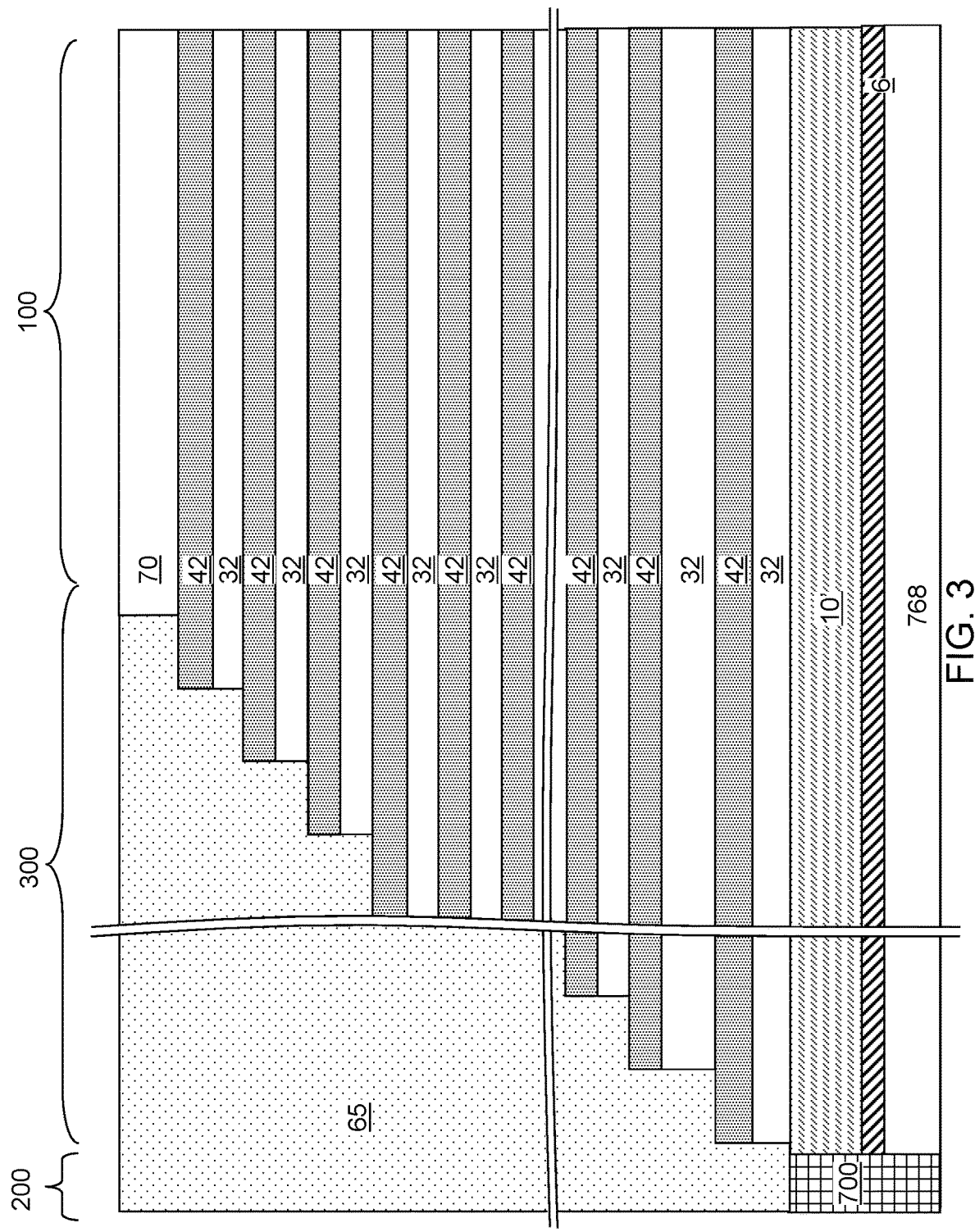
FIG. 3 is a schematic vertical cross-sectional view of the exemplary structure after formation of stepped terraces and a retro-stepped dielectric material portion according to an embodiment of the present disclosure.
Figure 4A:
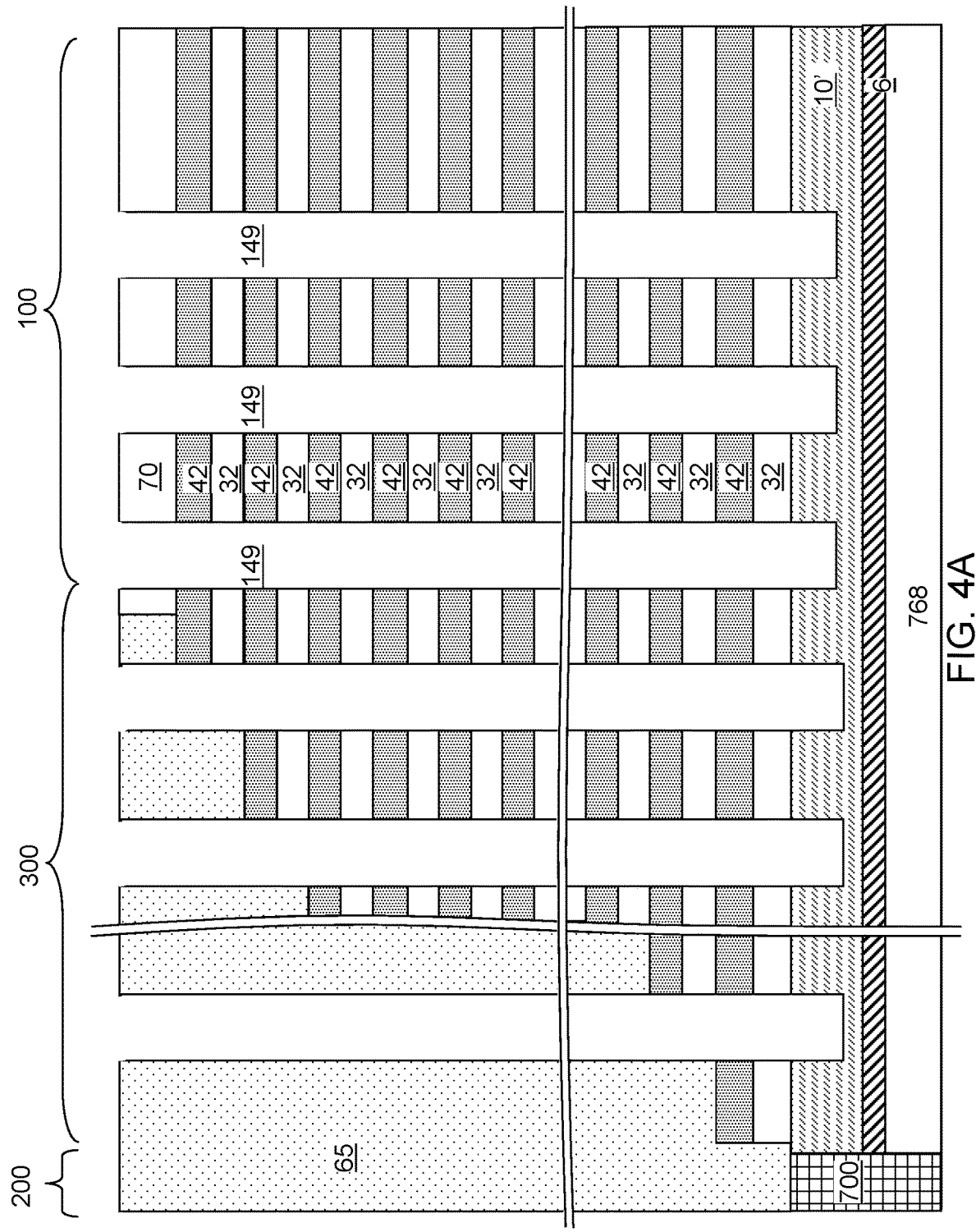
FIG. 4A is a schematic vertical cross-sectional view of the exemplary structure after formation of line trenches according to an embodiment of the present disclosure.
Figure 4B:
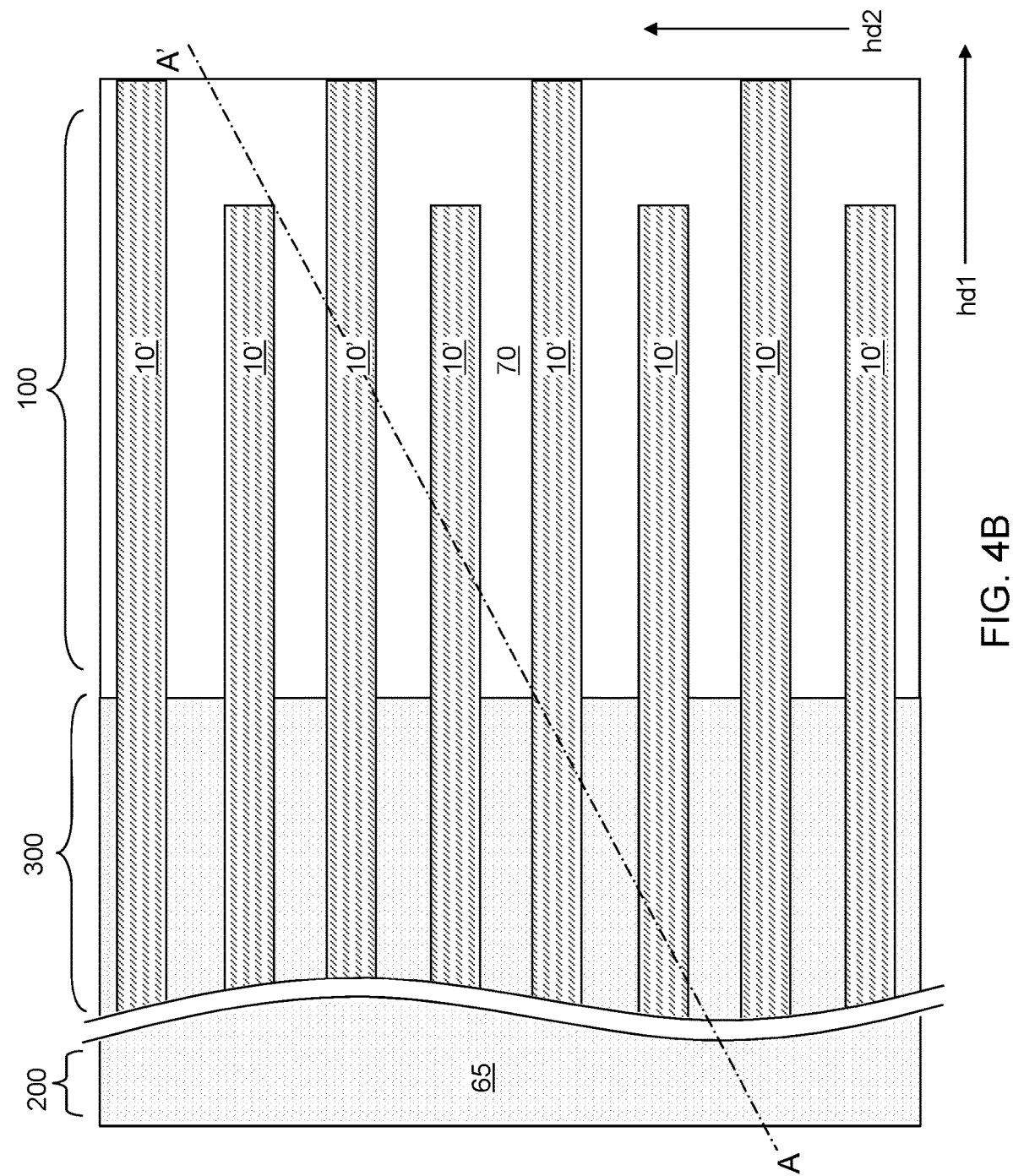
FIG. 4B is a top-down view of the exemplary structure of FIG. 4A. The vertical plane A-A' is the plane of the cross-section for FIG. 4A.

Referring to FIG. 3, the vertically alternating sequence of the insulating layers 32 and the spacer material layers (i.e., the sacrificial material layers 42) can be patterned to form stepped surfaces that continuously extend from a bottommost layer of the vertically alternating sequence (32, 42) to a topmost layer of the alternating sequence (32, 42) in the contact region 300. A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the vertically alternating sequence (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the vertically alternating sequence (32, 42). Each sacrificial material layer 42 other than a topmost sacrificial material layer 42 within the vertically alternating sequence (32, 42) laterally extends farther than any overlying sacrificial material layer 42 within the vertically alternating sequence (32, 42). The terrace region includes stepped surfaces of the vertically alternating sequence (32, 42) that continuously extend from a bottommost layer within the vertically alternating sequence (32, 42) to a topmost layer within the vertically alternating sequence (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A, 4B, 5A, and 5B, a lithographic material stack (not shown) including at least a photoresist layer can be formed over the insulating cap layer 70 and the retro-stepped dielectric material portion 65, and can be lithographically patterned to form line-shaped openings therein. The line-shaped openings laterally extend along a first horizontal direction hd1, and has a uniform width along a second horizontal direction hd2 that is perpendicular to the first horizontal direction hd1. The pattern in the lithographic material stack can be transferred through the insulating cap layer 70 or the retro-stepped dielectric material portion 65, and through the vertically alternating sequence (32, 42) by at least one anisotropic etch that employs the patterned lithographic material stack as an etch mask. Portions of the vertically alternating sequence (32, 42) underlying the line-shaped openings in the patterned lithographic material stack are etched to form line trenches 149. As used herein, a "line trench" refers to a trench that has laterally extends straight along a horizontal direction.

The line trenches 149 laterally extend along the first horizontal direction hd1 through the vertically alternating sequence (32, 42). In one embodiment, the line trenches 149 have a respective uniform width that is invariant under translation along the first horizontal direction hd1. In one embodiment, the line trenches 149 can have the same width throughout, and the spacing between neighboring pairs of the line trenches 149 can be the same. In this case, the line trenches 149 can constitute a one-dimensional periodic array of line trenches 149 having a pitch along a second horizontal direction hd2 that is perpendicular to the first horizontal direction hd1. The width of the line trenches 149 along the second horizontal direction hd2 can be in a range from 30 nm to 500 nm, such as from 60 nm to 250 nm, although lesser and greater widths can also be employed.

The line trenches 149 extend through each layer of the vertically alternating sequence (32, 42) and the retro-stepped dielectric material portion 65. The chemistry of the anisotropic etch process employed to etch through the materials of the vertically alternating sequence (32, 42) can alternate to optimize etching of the first and second materials in the vertically alternating sequence (32, 42). The anisotropic etch can be, for example, a series of reactive ion etches. The sidewalls of the line trenches 149 can be substantially vertical, or can be tapered. The patterned lithographic material stack can be subsequently removed, for example, by ashing.

The line trenches 149 laterally extend through the entire memory array region 100, and laterally extend into the contact region 300. The line trenches 149 may laterally extend through the entire contact region 300 along the first horizontal direction hd1, or may laterally extend only through part of a width, but not the entire width along the first horizontal direction hd1, of the contact region 300. The line trenches 149 can be laterally spaced among one another along a second horizontal direction hd2, which is perpendicular to the first horizontal direction hd1. In one embodiment, an overetch into the semiconductor material layer 10 may be optionally performed after the top surface of the semiconductor material layer 10 is physically exposed at a bottom of each line trench 149. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the line trenches 149 can be coplanar with the topmost surface of the semiconductor material layer 10.

Each of the line trenches 149 may include a sidewall (or a plurality of sidewalls) that extends substantially perpendicular to the topmost surface of the substrate. The substrate semiconductor layer 9 and the semiconductor material layer 10 collectively constitute a substrate (9, 10), which can be a semiconductor substrate. Alternatively, the semiconductor material layer 10 may be omitted, and the line trenches 149 can be extend to a top surface of the substrate semiconductor layer 9.

Referring to FIGS. 6A and 6B, cover silicon oxide portions (57S, 57T, 57W) can be formed within each line trench 149. For example, a thermal oxidation process can be performed to convert physically exposed surface portions of the lower source-level material layer 112, the source-level sacrificial layer 104, and the upper source-level material layer 116 into source-level cover silicon oxide portions 57S, to convert physically exposed surface portions of the optional source-select-level conductive layer 118 into optional source-select-level cover silicon oxide portions 57T, and to covert physically exposed surface portions of the sacrificial material layers 42 into word-line-level cover silicon oxide portions 57W. In this case, the cover silicon oxide portions (57S, 57T, 57W) can be formed as multiple discrete portions. The thickness of the various cover silicon oxide portions (57S, 57T, 57W) can be in a range from 1 nm to 10 nm, such as from 2 nm to 6 nm, although lesser and greater thicknesses can also be employed.

A continuous charge storage material layer 154C, a continuous blocking dielectric material layer 152C, and a semiconductor channel material layer 160C are sequentially formed in the line trenches 149 and over the insulating cap layer 70. The continuous charge storage material layer 154C can be formed on the sidewalls of the insulating layers and on the cover silicon oxide portions (57S, 57T, 57W). In one embodiment, the continuous charge storage material layer 154C can be a dielectric charge trapping material, which can be, for example, silicon nitride. The continuous charge storage material layer 154C can be formed, for example, by chemical vapor deposition (CVD), atomic layer deposition (ALD), physical vapor deposition (PVD), or any suitable deposition technique for storing electrical charges therein. The thickness of the continuous charge storage material layer 154C can be in a range from 0.5 nm to 5 nm, such as from 1 nm to 3 nm, although lesser and greater thicknesses can also be employed.

The continuous blocking dielectric material layer 152C can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric material layer 152C can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to the semiconductor channels. In one embodiment, the continuous blocking dielectric material layer 152C includes hafnium oxide or aluminum oxide. In one embodiment, the continuous blocking dielectric material layer 152C can include multiple dielectric metal oxide layers having different material compositions.

Alternatively or additionally, the continuous blocking dielectric material layer 152C can include a dielectric semiconductor compound such as silicon oxide, silicon oxynitride, silicon nitride, or a combination thereof. In one embodiment, the continuous blocking dielectric material layer 152C can include silicon oxide or a combination of silicon oxide and hafnium oxide. In this case, the dielectric semiconductor compound of the continuous blocking dielectric material layer 152C can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The semiconductor channel material layer 160C can be deposited on the continuous blocking dielectric material layer 152C. The semiconductor channel material layer 160C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 160C includes amorphous silicon or polysilicon. The semiconductor channel material layer 160C can be formed by a conformal deposition method such as low pressure chemical vapor deposition (LPCVD). The thickness of the semiconductor channel material layer 160C can be in a range from 2 nm to 10 nm, although lesser and greater thicknesses can also be employed. In one embodiment, the semiconductor channel material layer 160C can have a doping of the first conductivity type, which is the same conductivity type as the conductivity type of the doping of the semiconductor material layer 10. In one embodiment, the semiconductor channel material layer 160C can comprise a semiconducting material including electrical dopants at an atomic concentration in a range from $1.0 \times 10^{14}/cm^3$ to $1.0 \times 10^{18}/cm^3$.

Figure 7B:
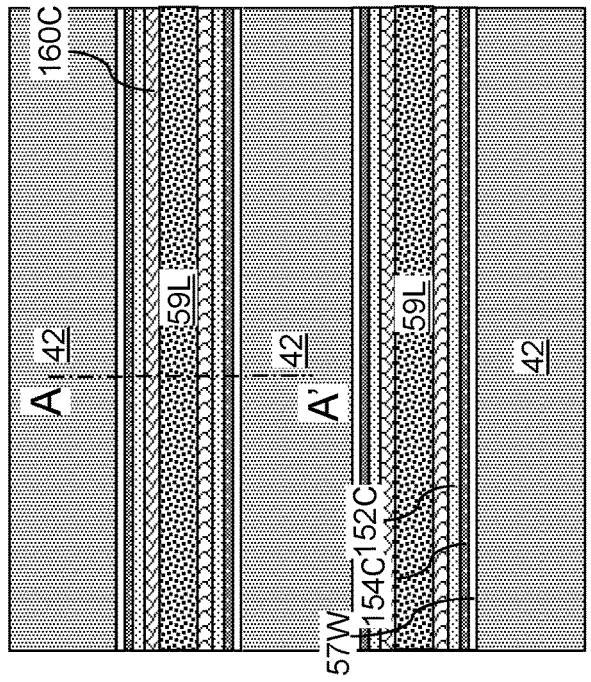
FIG. 7B is a horizontal cross-sectional view along the plane B-B' of FIG. 7A.
Figure 7A:
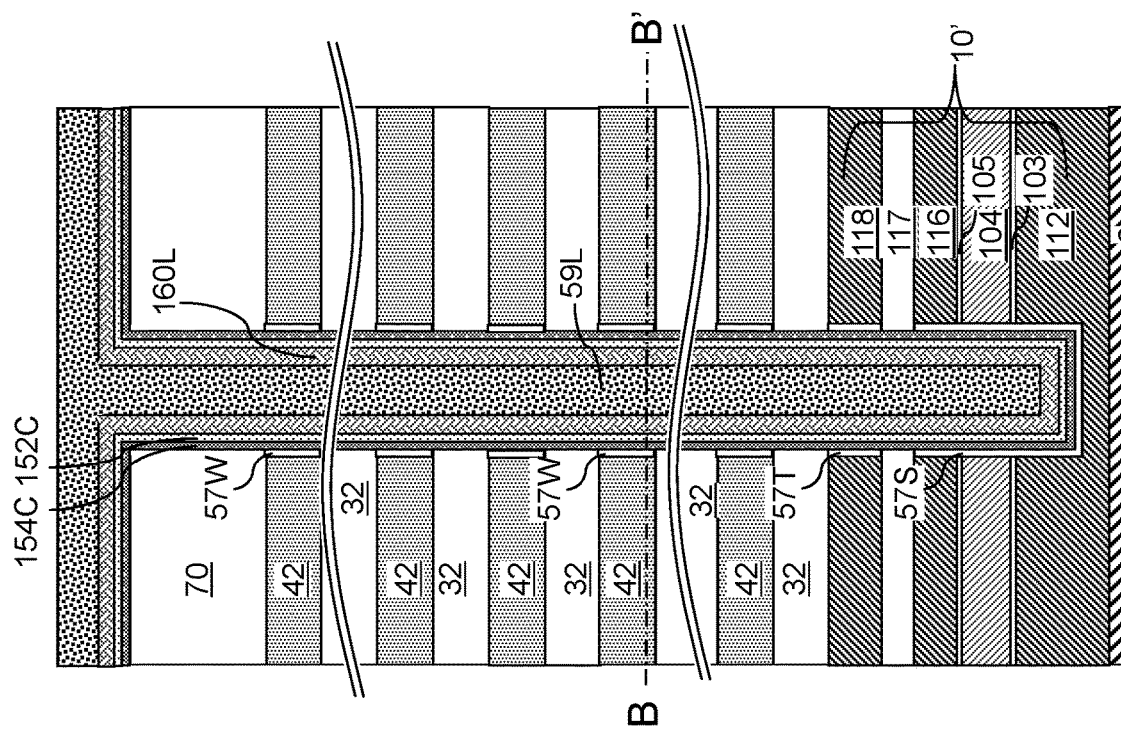
FIG. 7A is a vertical cross-sectional view of a line trench after formation of a sacrificial line trench fill material layer according to an embodiment of the present disclosure.

Referring to FIGS. 7A and 7B, a sacrificial line trench fill material layer 59L can be formed by filling remaining volumes of the line trenches 149 with a sacrificial line trench fill material. The sacrificial line trench fill material comprises a material that can be subsequently removed selective to the material of the semiconductor channel material layer 160C. In one embodiment, the sacrificial line trench fill material layer 59L can include a spin-on sacrificial material such as spin-on carbon (SOC). In one embodiment, the spin-on-carbon material can include amorphous carbon in a volatile solvent that is removed after curing.

Figure 8A:
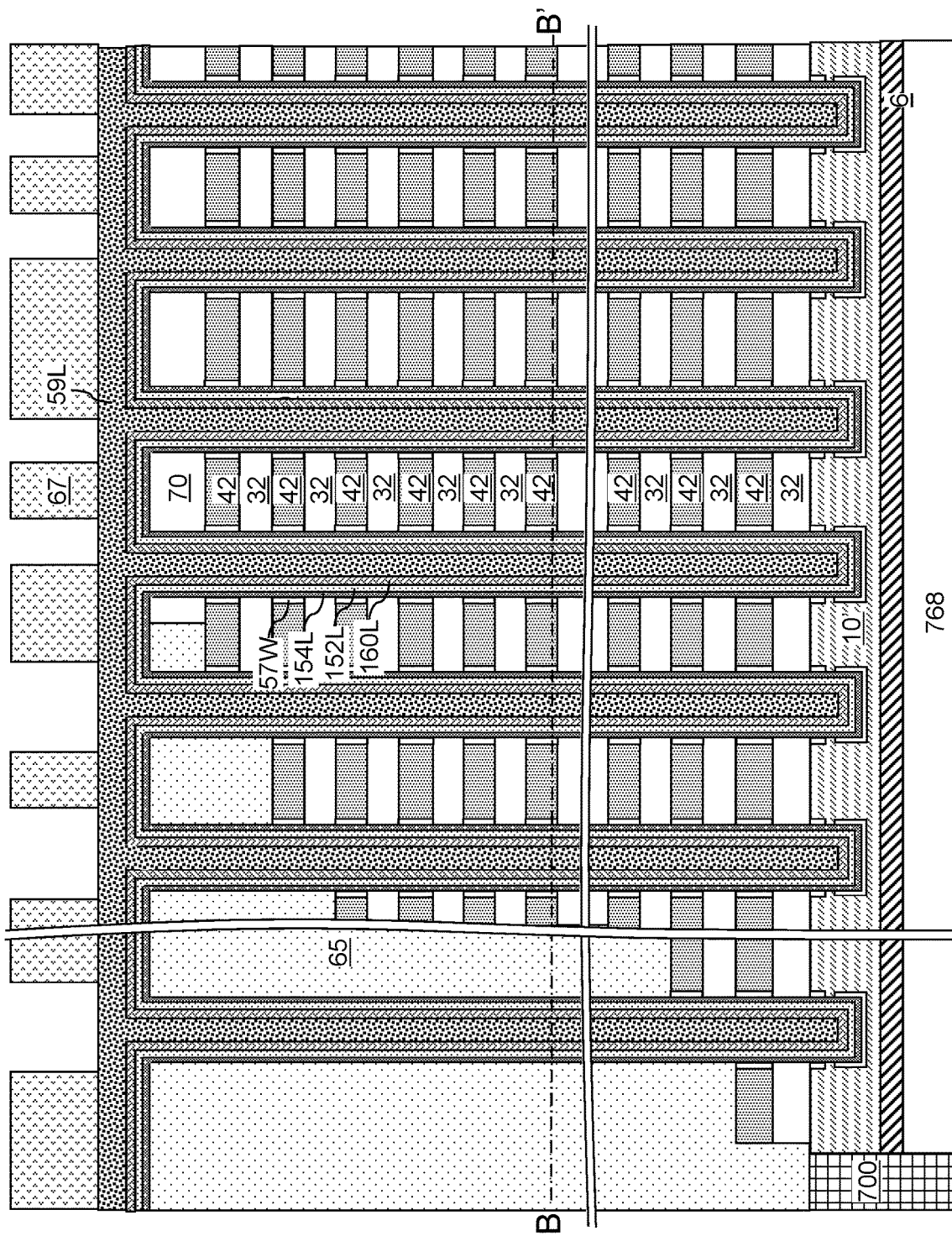
FIG. 8A is a vertical cross-sectional view of the exemplary structure after formation of a patterned photoresist layer according to an embodiment of the present disclosure.
Figure 8B:
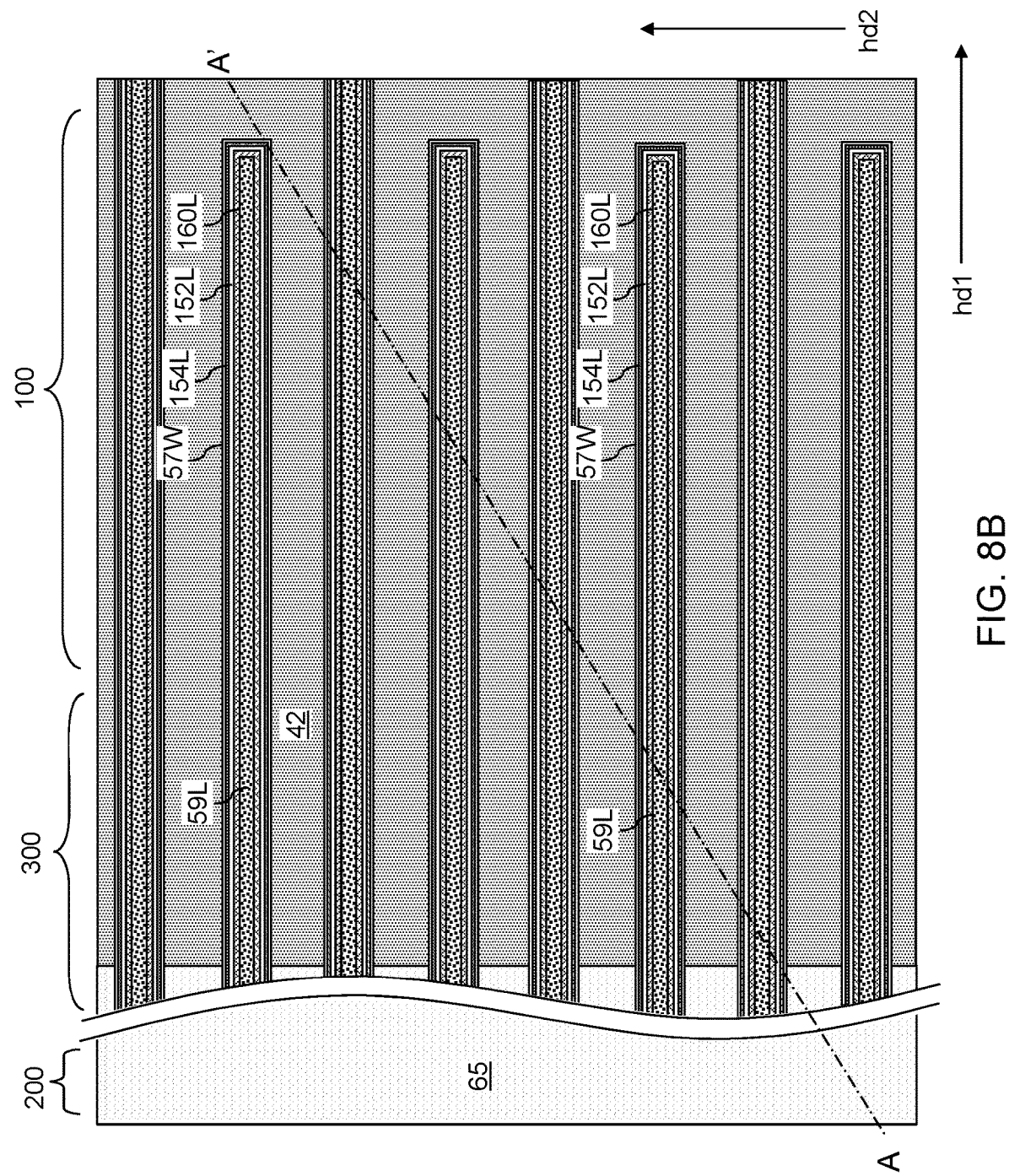
FIG. 8B is a horizontal cross-sectional view of the exemplary structure along the plane B-B' of FIG. 8A.
Figure 8C:
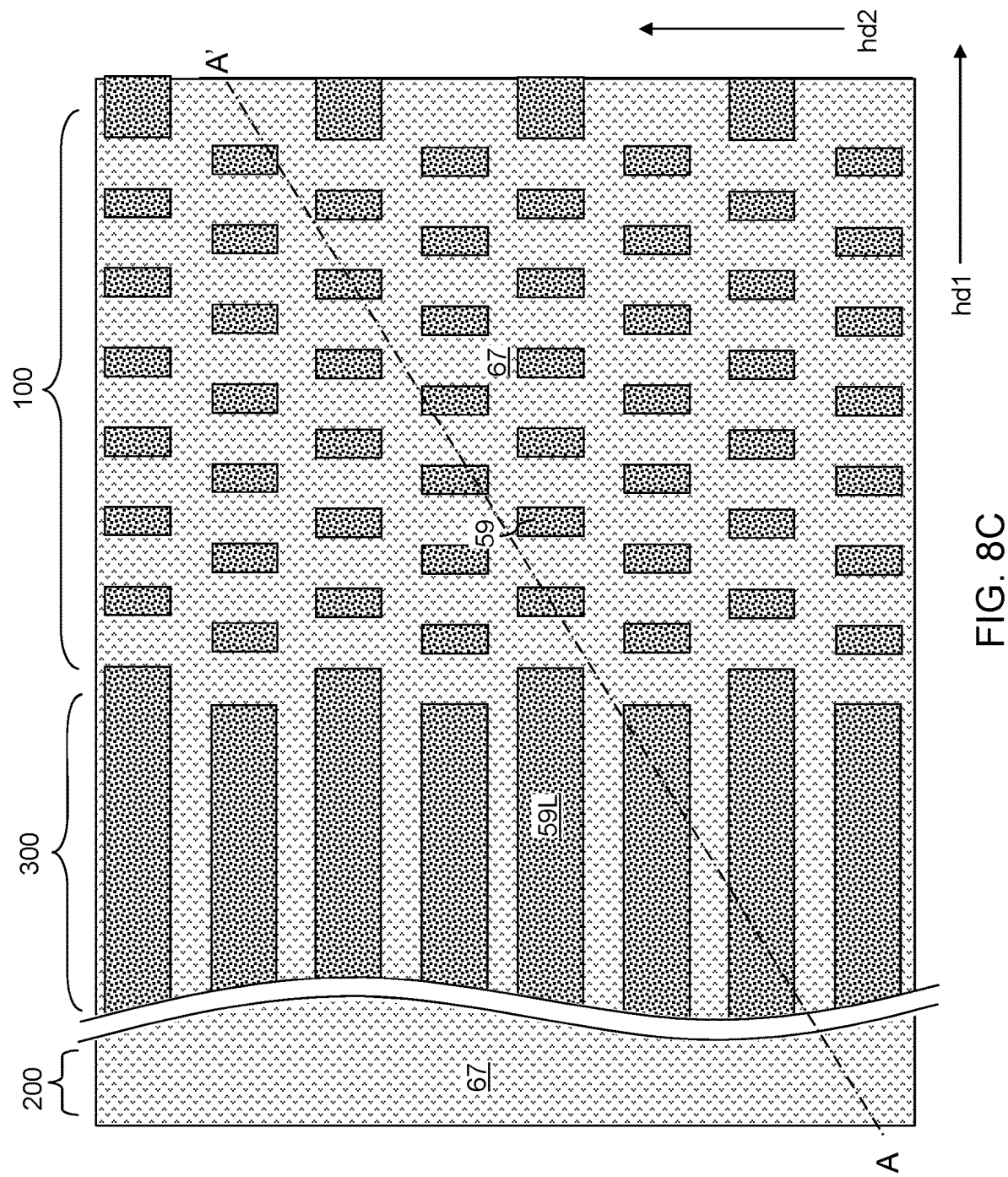
FIG. 8C is a top-down view of the exemplary structure of FIGS. 8A and 8B.

Referring to FIGS. 8A-8C, a photoresist layer 67 can be applied over the sacrificial line trench fill material layer 59L, and can be lithographically patterned to form openings in the memory array region 100 and in the contact region 300. The pattern of opening in the memory array region 100 includes a two-dimensional array of discrete openings each corresponding to an area in which dielectric isolation pillars are to be subsequently formed. In one embodiment, the two-dimensional array of discrete openings can be a periodic two-dimensional array of discrete openings. The openings in the contact region 300 may be elongated along the first horizontal direction hd1, and may extend along the entire length of the staircase region (i.e., the stepped surfaces of the vertically alternating sequence (32, 42)) along the first horizontal direction hd1. Each opening in the photoresist layer 67 can overlie a respective area in which the sacrificial line trench fill material layer 59L vertically extends through the vertically alternating sequence (32, 42).

Figure 9A:
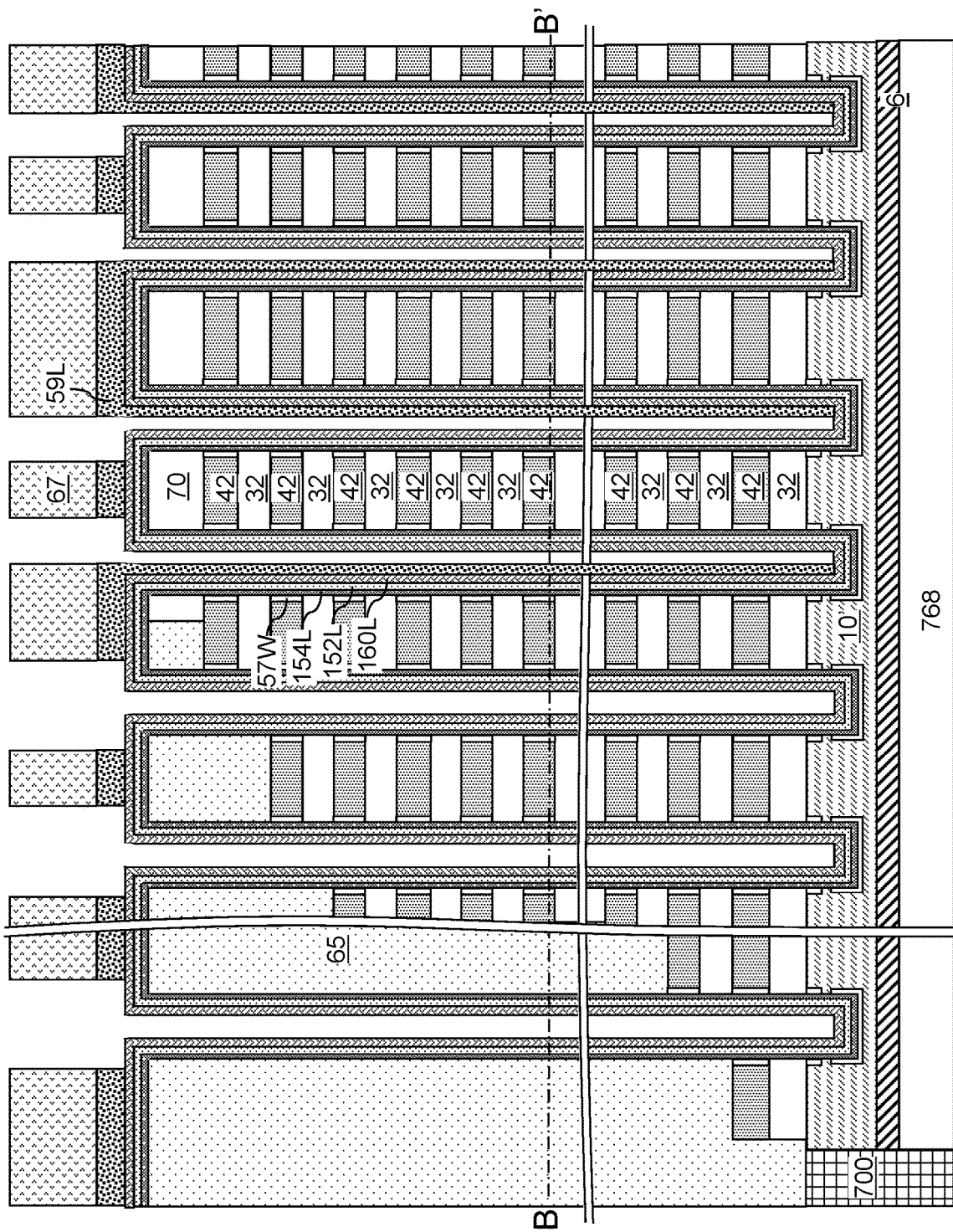
FIG. 9A is a vertical cross-sectional view of the exemplary structure after anisotropically etching unmasked portions of the sacrificial line trench fill material layer and formation of pillar cavities according to an embodiment of the present disclosure.
Figure 9B:
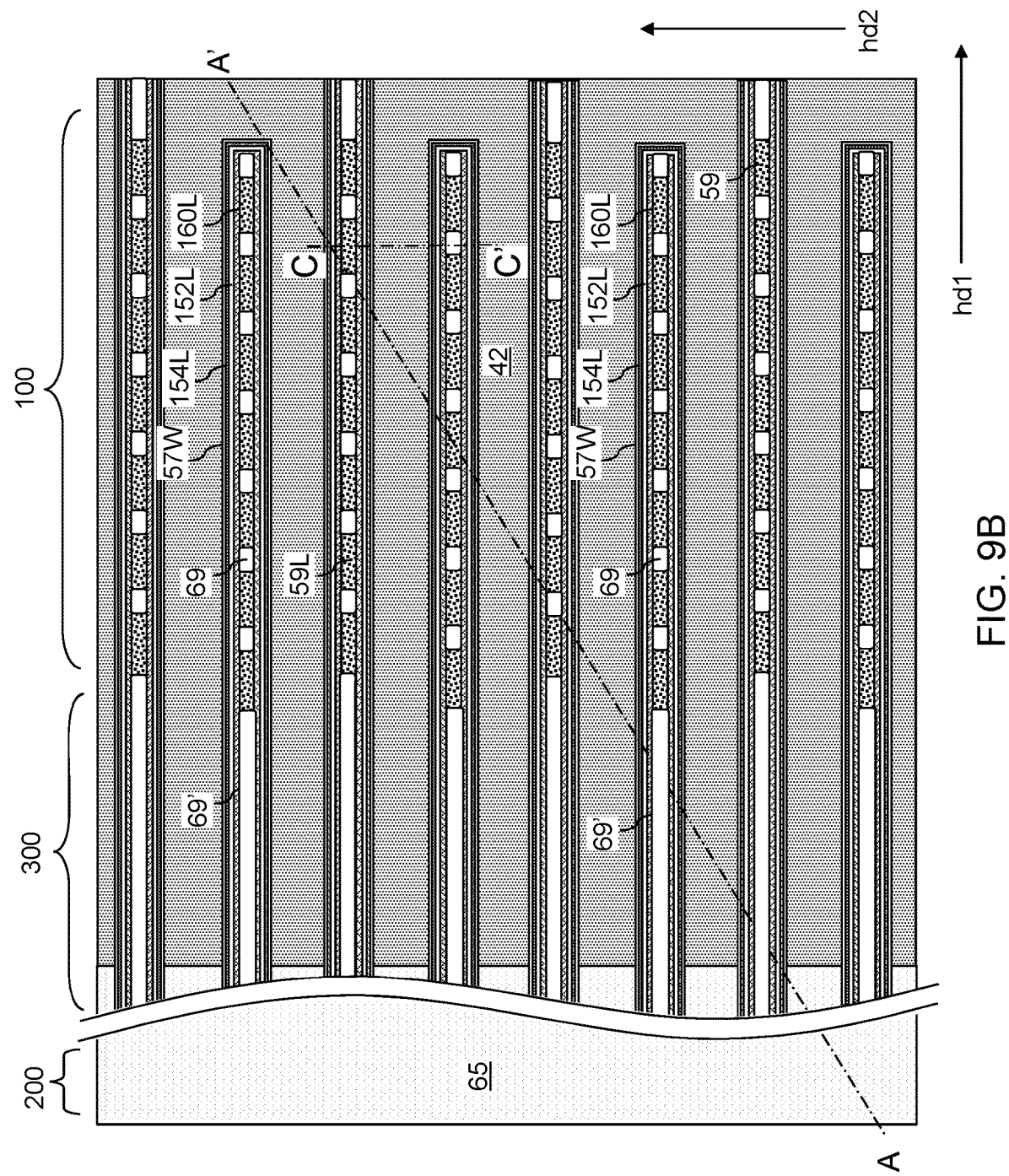
FIG. 9B is a horizontal cross-sectional view of the exemplary structure along the plane B-B' of FIG. 9A.
Figure 9C:
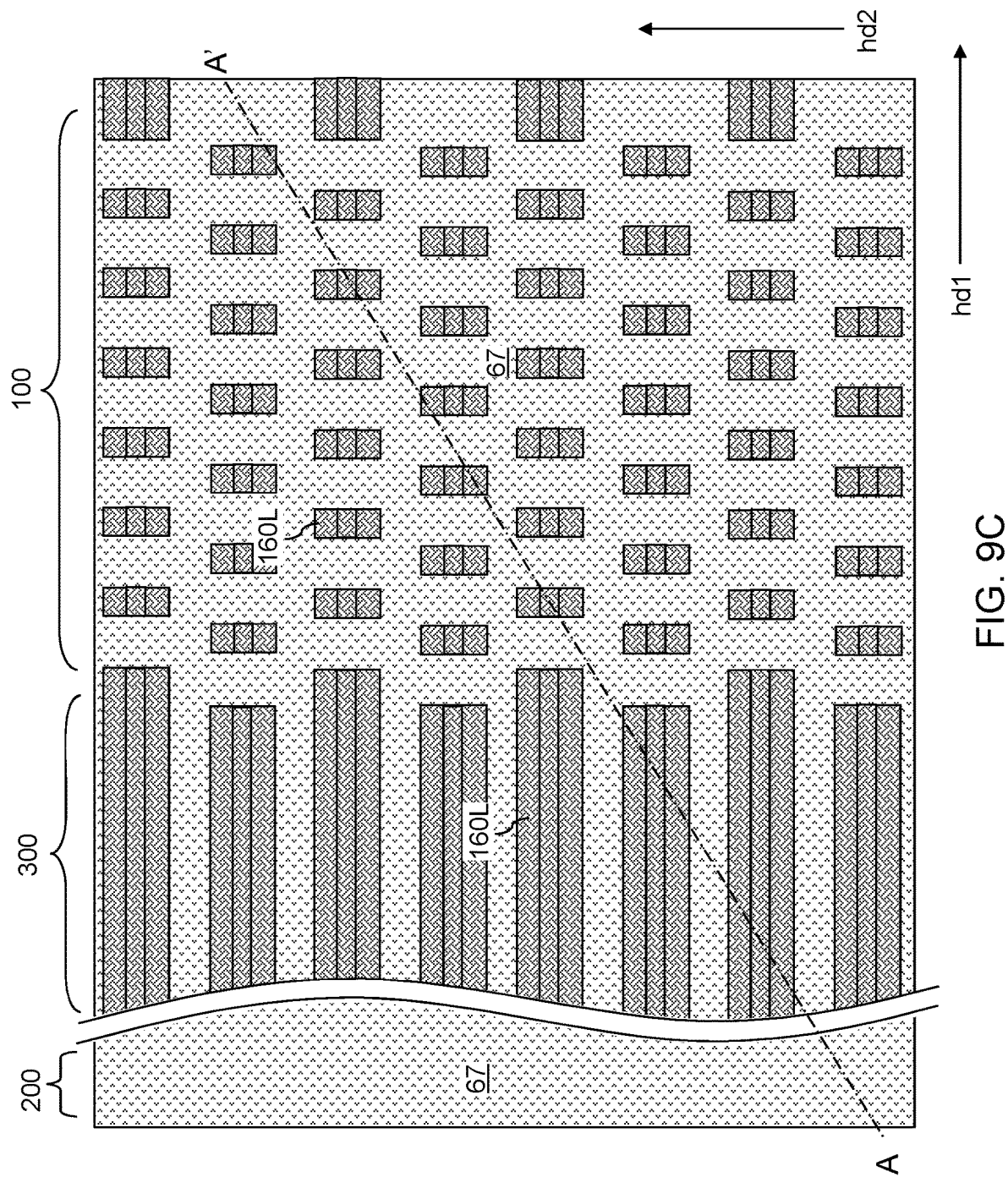
FIG. 9C is a top-down view of the exemplary structure of FIGS. 9A and 9B.

Referring to FIGS. 9A and 9B, the unmasked portions of the sacrificial line trench fill material layer 59L can be etched underneath each opening in the photoresist layer 67 by an anisotropic etch process. The anisotropic etch process can employ a chemistry that etches the sacrificial line trench fill material selective to the material of the semiconductor channel material layer 160C. In one embodiment, a gas mixture for etching amorphous carbon selective to silicon can be employed as the etchant gas during the anisotropic etch process. For example, a combination of carbonyl sulfide (COS) and $O_2$ or other reactive ion etch gas for etching carbon can be employed. An array of pillar cavities 69 are formed in the volumes within the memory array region 100 from which the sacrificial line trench fill material is removed. Line cavities 69' are formed in volumes within the contact region 300 from which the sacrificial line trench fill material is removed. Thus, a plurality of vertical cavities (69, 69') extend through the sacrificial line trench fill material layers 59L, which continuously extends over the insulating cap layer 70 within multiple cavities (69, 69') therethrough.

Figure 10A:
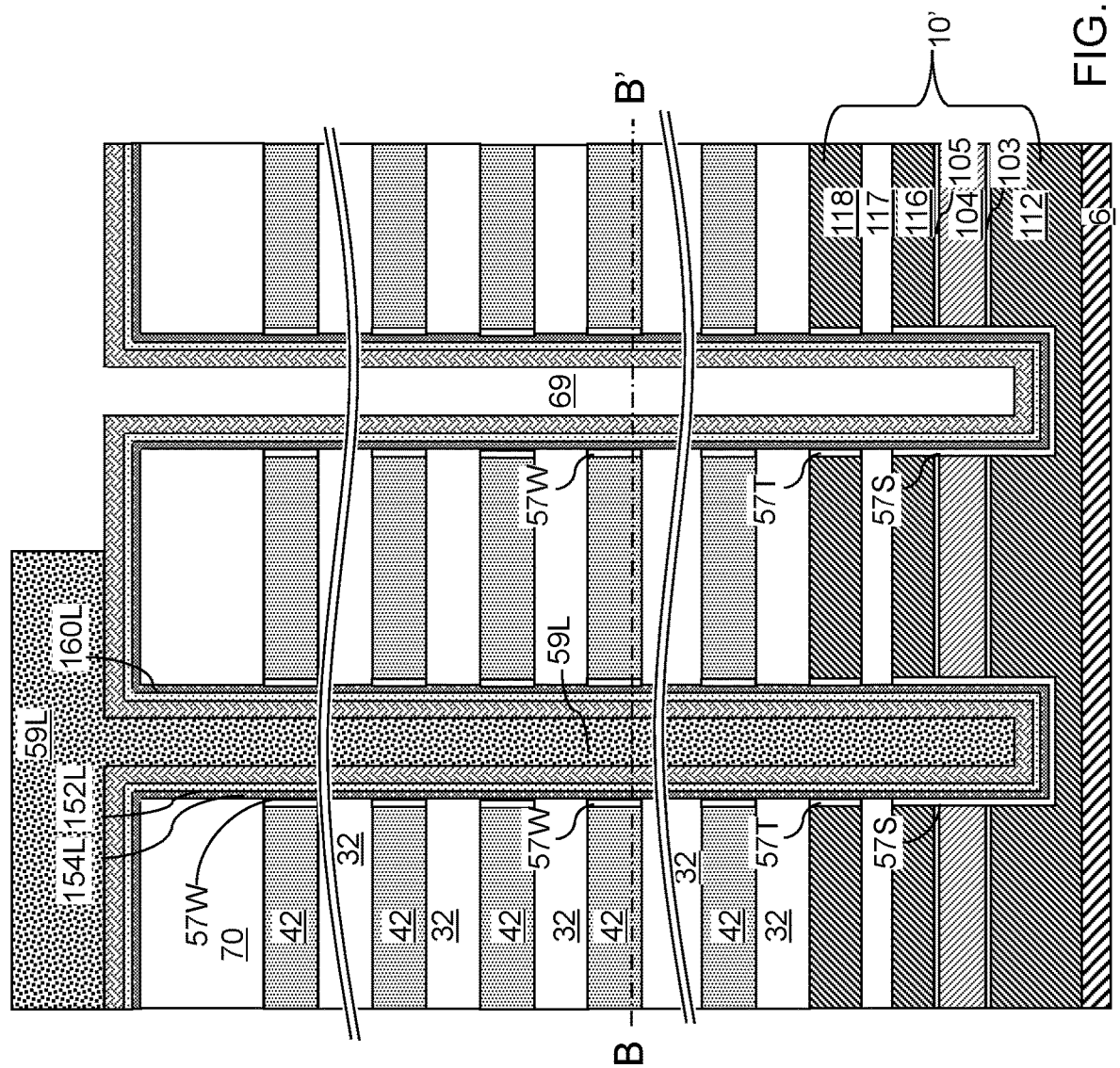
FIG. 10A is a vertical cross-sectional view of a region of the exemplary structure after removal of the patterned photoresist layer according to an embodiment of the present disclosure.
Figure 10B:
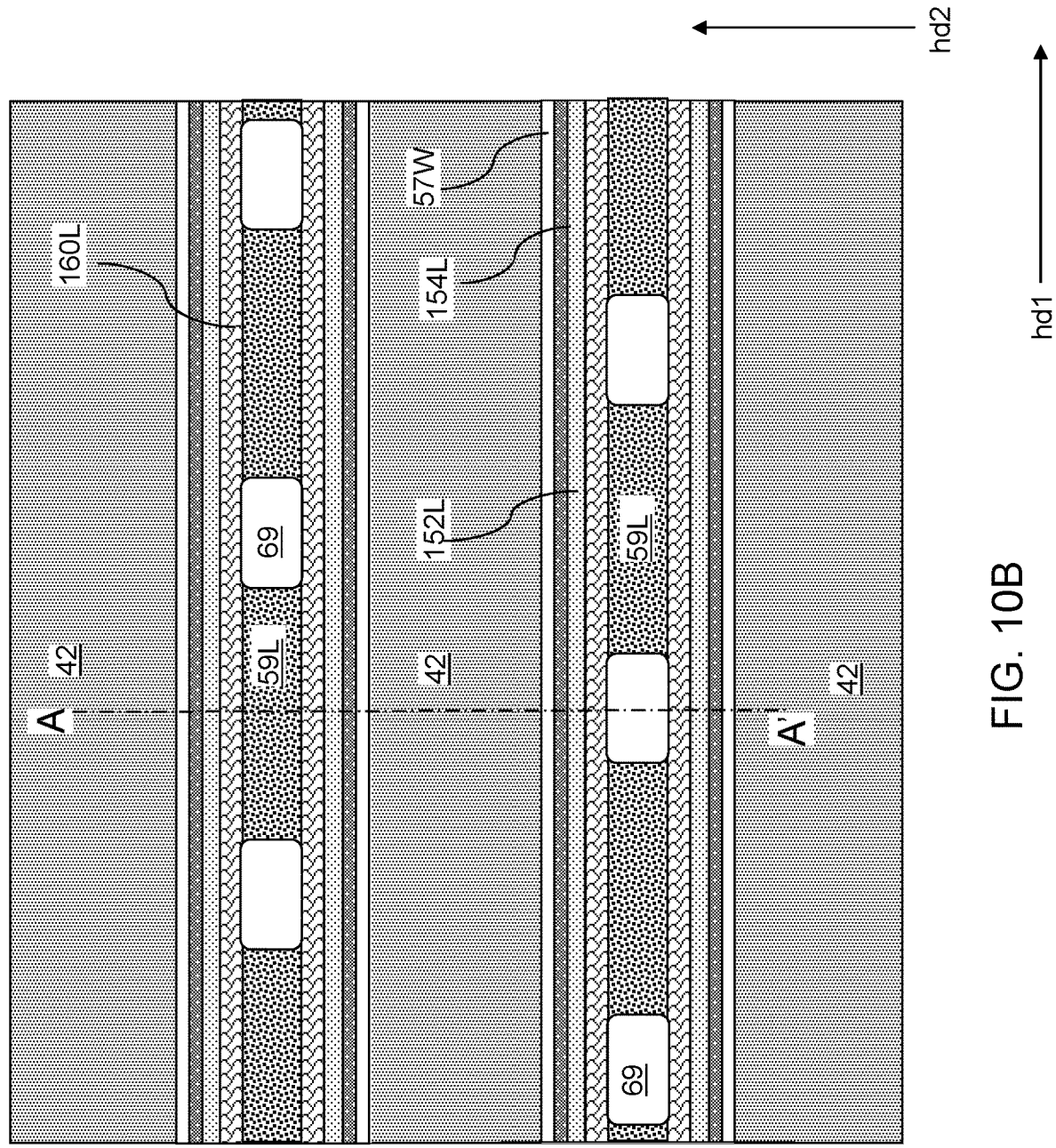
FIG. 10B is a horizontal cross-sectional view of the region of the exemplary structure along the plane B-B' of FIG. 10A.

Referring to FIGS. 10A and 10B, the patterned photoresist layer 67 can be removed selective to the semiconductor channel material layer 160C, for example, by dissolution in an organic solvent.

Figure 11B:
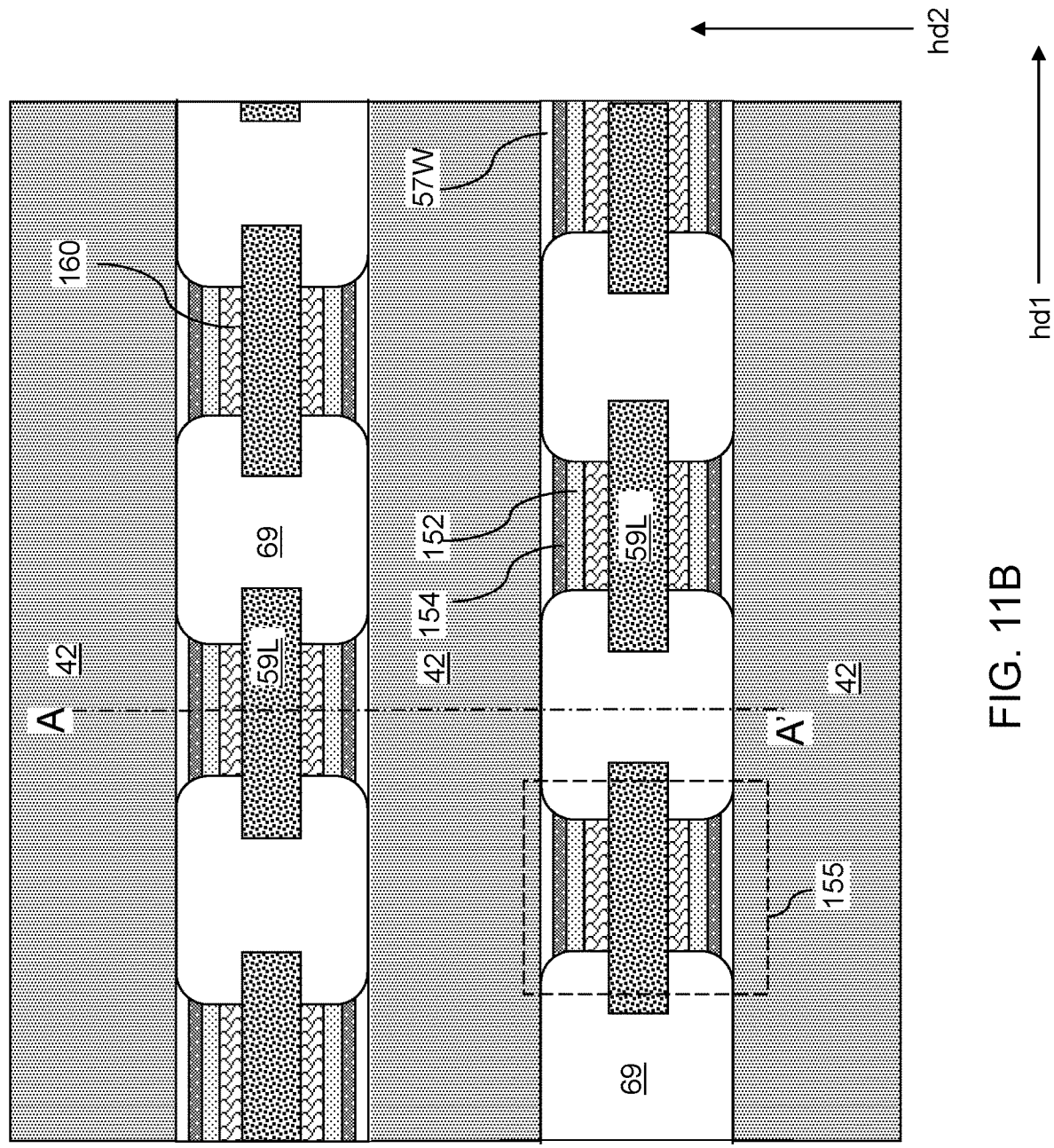
FIG. 11B is a horizontal cross-sectional view of the region of the exemplary structure along the plane B-B' of FIG. 11A.

Referring to FIGS. 11A and 11B, portions of the semiconductor channel material layer 160C, the continuous blocking dielectric material layer 152C, and the continuous charge storage material layer 154C are removed from each vertical cavity (69, 69'). In one embodiment, the portions of the semiconductor channel material layer 160C, the continuous blocking dielectric material layer 152C, and the continuous charge storage material layer 154C can be sequentially etched around each vertical cavity (69, 69') by a sequence of etch processes. The duration of each etch process can be selected such that the etch distance is within a range from the thickness of each etched material layer to twice the thickness of the etched material layer. The sequence of etch processes can include a first wet etch process that etches the material of the semiconductor channel material layer 160C, a second wet etch process that etches the material of the continuous blocking dielectric material layer 152C, and a third wet etch process that etches the material of the continuous charge storage material layer 154C. In an illustrative example, the semiconductor channel material layer 160C can include amorphous silicon or polysilicon, and the first wet etch process can employ hot trimethyl-2 hydroxyethyl ammonium hydroxide ("hot TMY") or tetramethyl ammonium hydroxide (TMAH). The continuous blocking dielectric material layer 152C can include aluminum oxide and/or silicon oxide and the second wet etch process can employ a mixture of at least two of ammonium hydroxide, phosphoric acid, methyl hydroxide, bromine, hydrogen peroxide, and deionized water for aluminum oxide and/or dilute hydrofluoric acid for silicon oxide. The continuous charge storage material layer 154C can include silicon nitride, and the third wet etch process can include hot phosphoric acid or a mixture of at least two of potassium hydroxide, ammonium fluoride, hydrofluoric acid, glycerin, and deionized water. In one embodiment, the isotropic etch processes may be selective to the material of the sacrificial line trench fill material layers 59L. Regions of the word-line-level cover silicon oxide portions 57W adjacent to the pillar cavities 69 or the line trenches 69' can be collaterally etched during the isotropic etch processes. Regions of the word-line-level cover silicon oxide portions 57W that are covered by the remaining portions of the continuous charge storage material layer 154C are not removed.

Each of the semiconductor channel material layer 160C, the continuous blocking dielectric material layer 152C, and the continuous charge storage material layer 154C is divided into multiple discrete portions by the sequence of isotropic etch processes. Each remaining portion of the semiconductor channel material layer 160L constitutes a vertical semiconductor channel layer 160. Each remaining portion of the continuous blocking dielectric material layer 152L constitutes a blocking dielectric 152. Each remaining portion of the continuous charge storage material layer 154C constitutes an in-process charge storage layer 154, which is subsequently combined with a set of charge storage regions to form a charge storage layer.

Each contiguous set of a blocking dielectric 152 and an in-process charge storage layer 154 constitutes an in-process memory film 150, which is subsequently modified to form a completed memory film. Each contiguous set of a vertical semiconductor channel layer 160, an in-process memory film 150, and word-line-level cover silicon oxide portions 57W constitutes an in-process memory stack structure 155, which is subsequently modified to form a completed memory stack structure. Thus, each contiguous set of remaining portions of the semiconductor channel material layer 160L, the continuous blocking dielectric material layer 152L, the continuous charge storage material layer 154C, and the word-line-level cover silicon oxide portions 57W constitutes a respective one of the in-process memory stack structures 155.

Figure 12A:
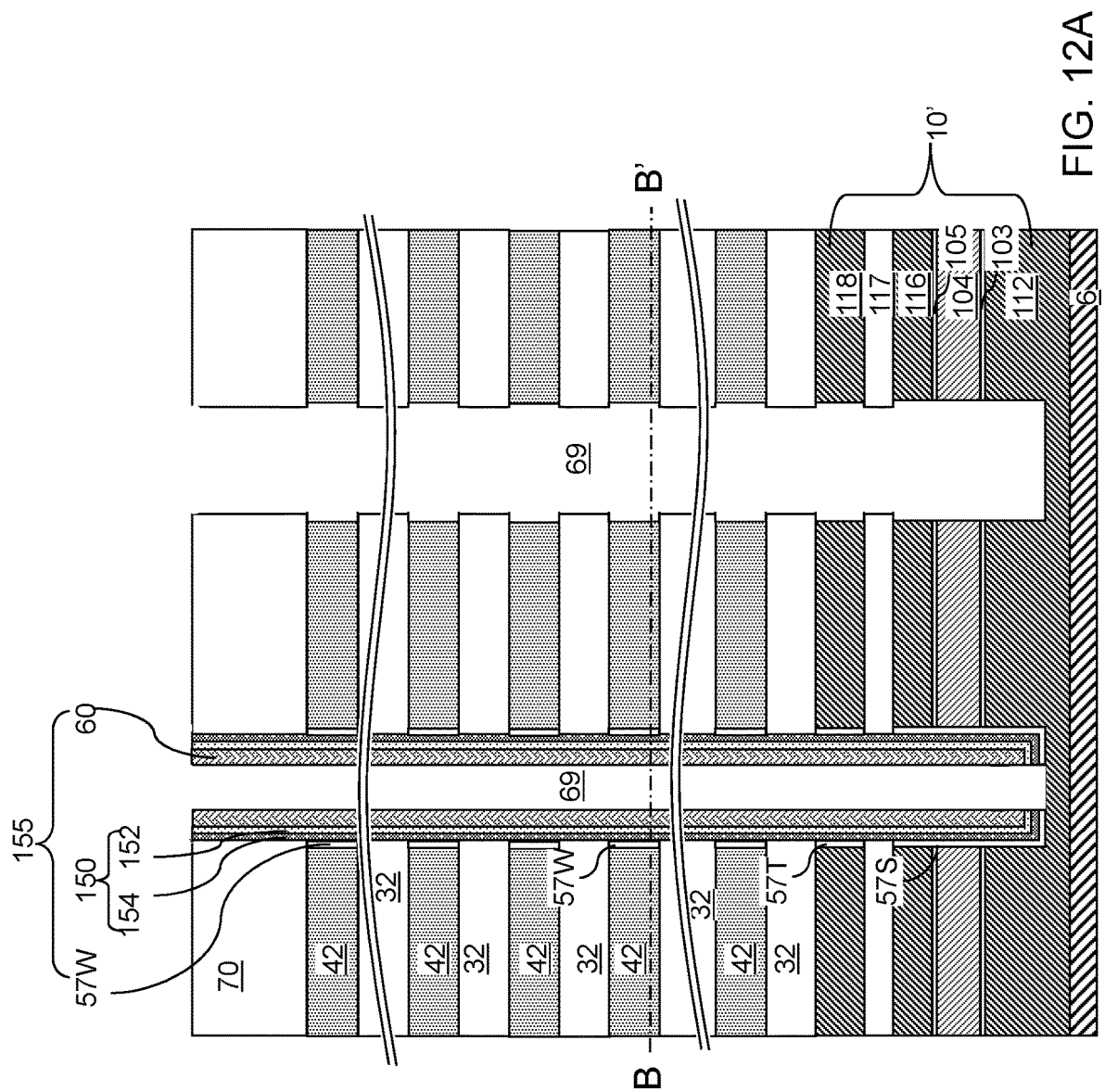
FIG. 12A is a vertical cross-sectional view of a region of the exemplary structure after formation of line cavities by removal of remaining portions of the sacrificial line trench fill material layer according to an embodiment of the present disclosure.
Figure 12B:
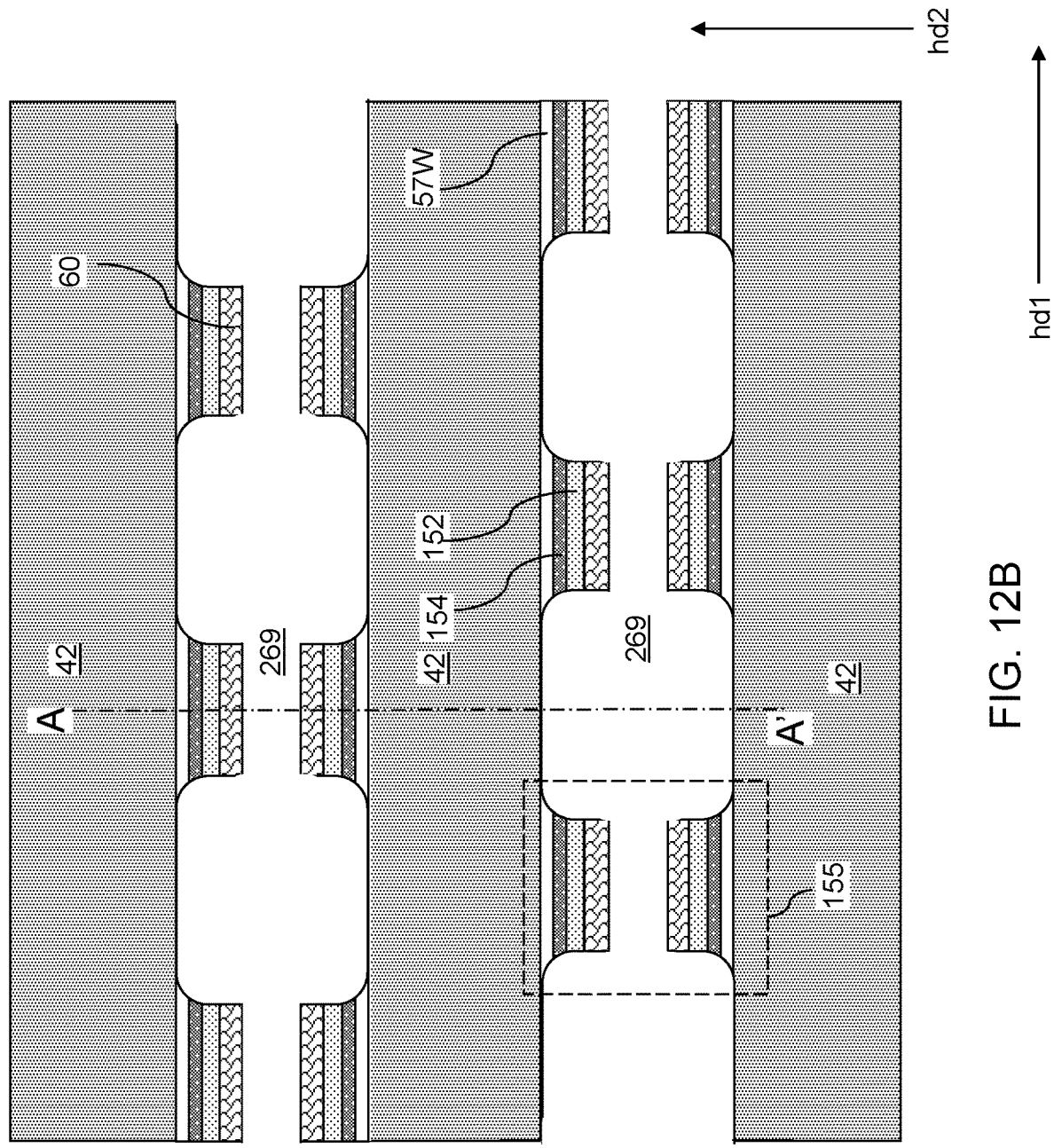
FIG. 12B is a horizontal cross-sectional view of the region of the exemplary structure along the plane B-B' of FIG. 12A.
Figure 13A:
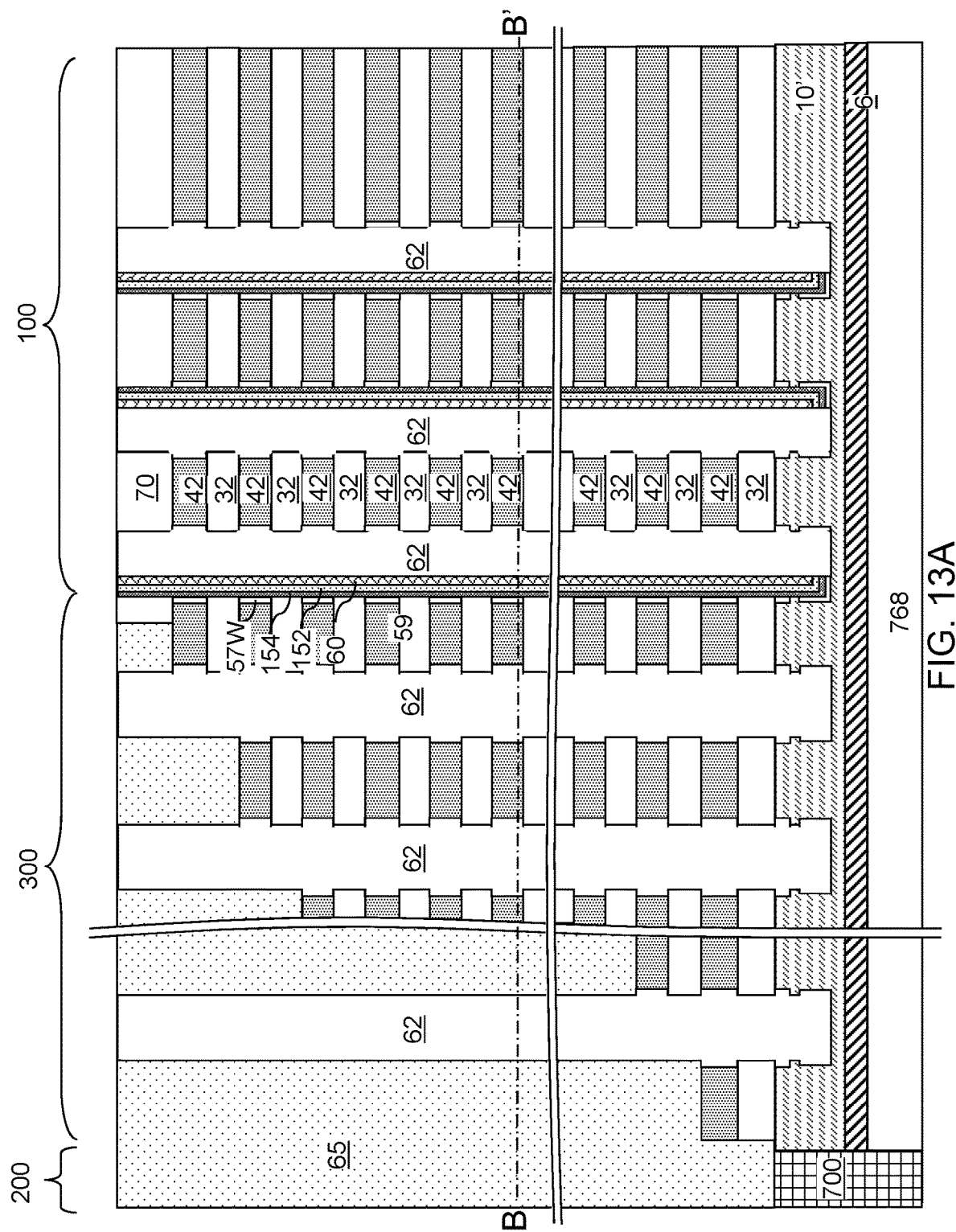
FIG. 13A is a vertical cross-sectional view of the exemplary structure after formation of a laterally undulating dielectric rail within each line cavity according to an embodiment of the present disclosure.
Figure 13B:
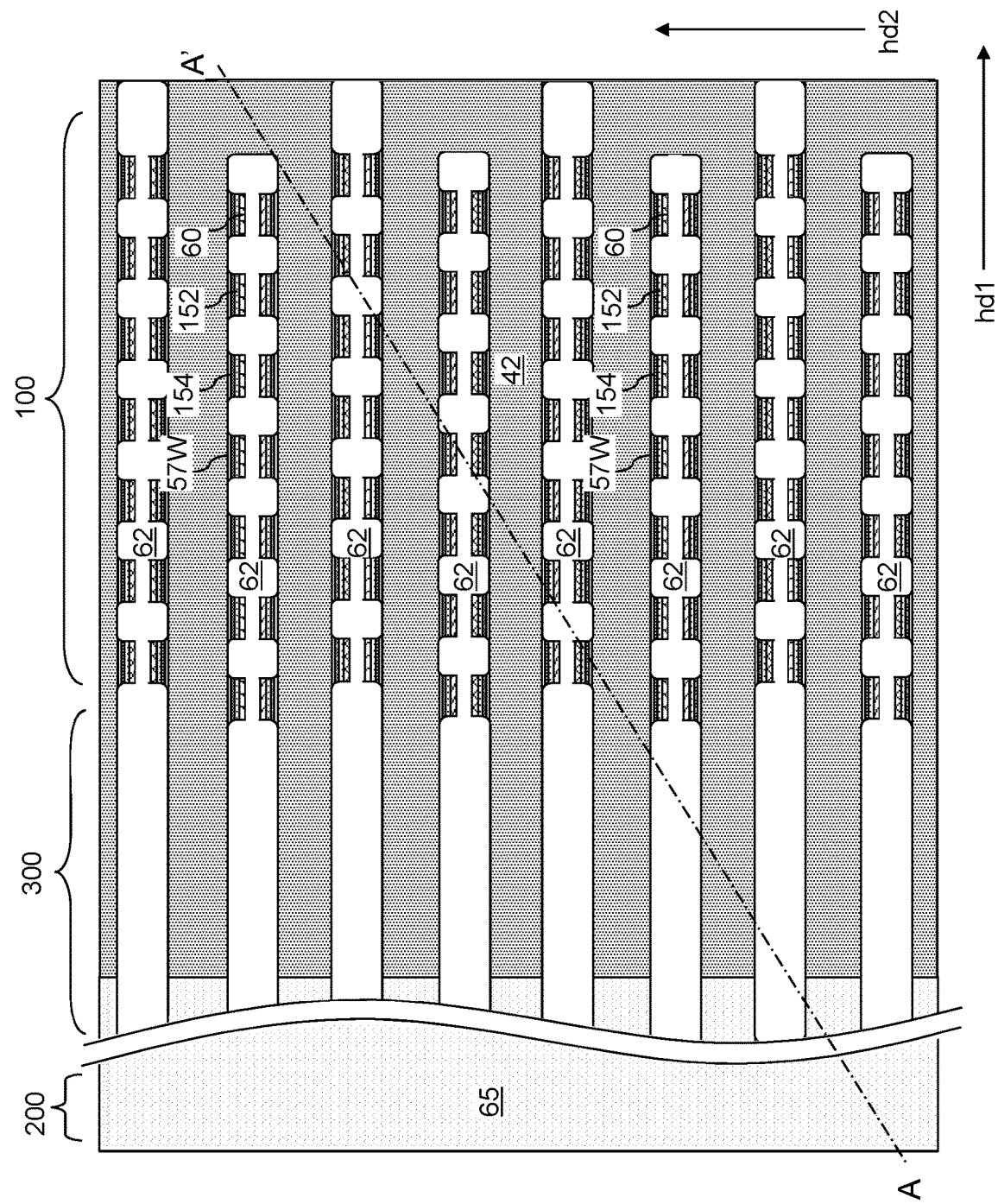
FIG. 13B is a top-down view of the exemplary structure of FIG. 13A. The vertical plane A-A' is the plane of the cross-section for FIG. 13A.
Figure 13C:
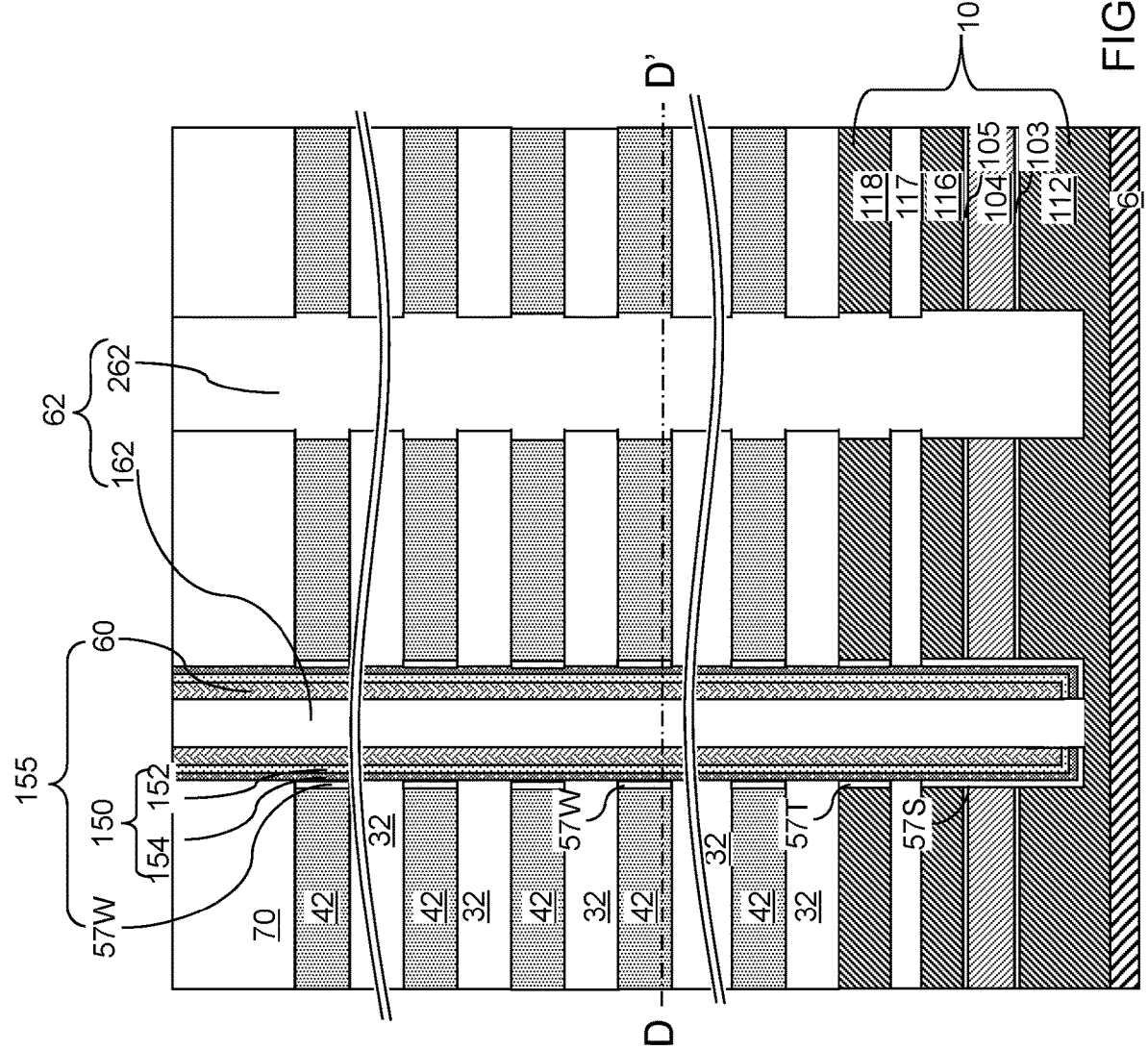
FIG. 13C is a vertical cross-sectional view of a region of the exemplary structure of FIG. 13A.
Figure 13D:
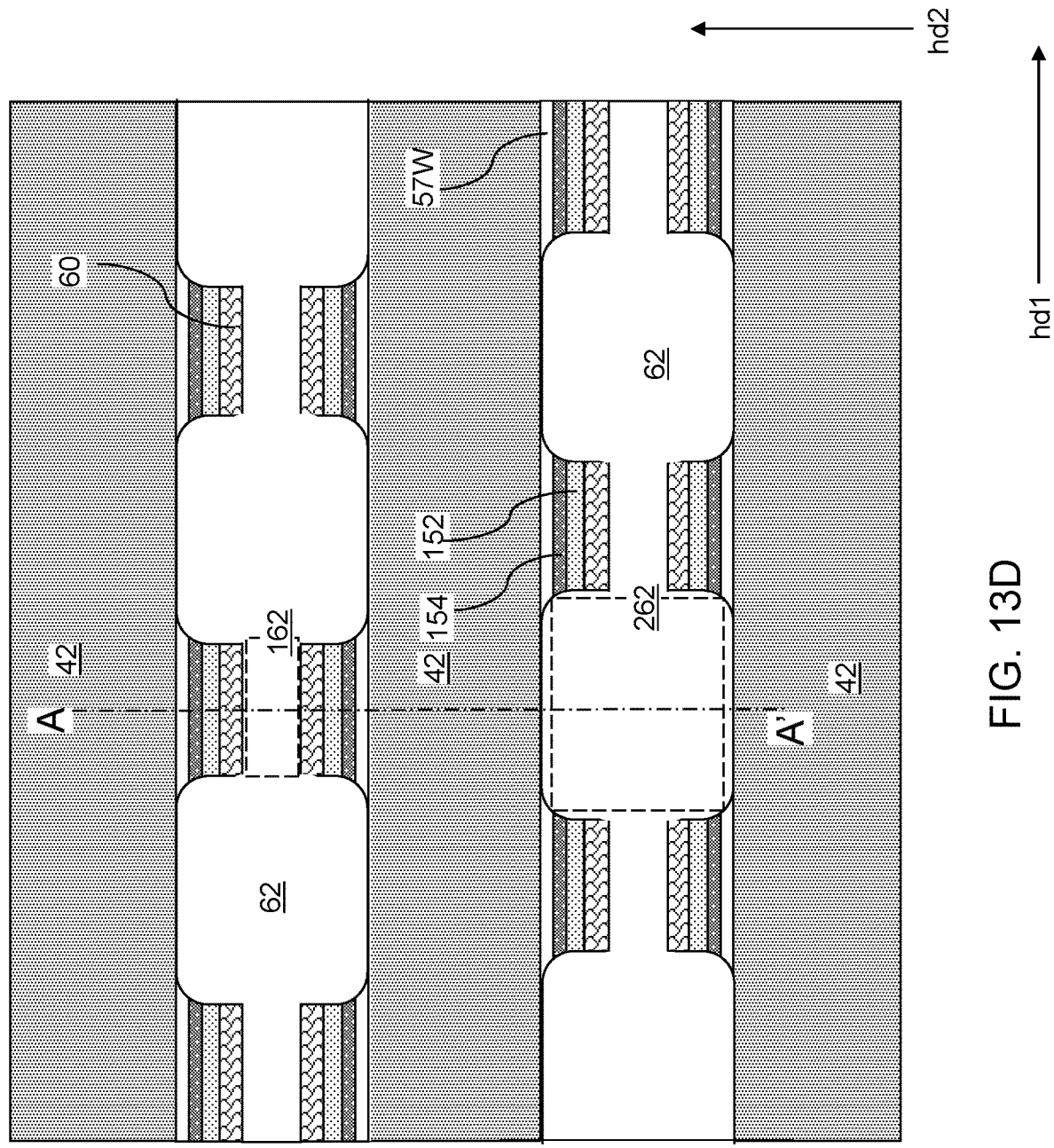
FIG. 13D is a horizontal cross-sectional view along the plane D-D' of FIG. 13C. The vertical plane C-C' is the plane of the cross-section for FIG. 13C.

Referring to FIGS. 12A and 12B, the sacrificial line trench fill material layers 59L can be removed selective to the in-process memory stack structures 155 and the vertically alternating sequence (32, 42). For example, the sacrificial line trench fill material layer 59L may be removed by ashing or by dissolution in an organic solvent. Upon removal of the sacrificial line trench fill material layer 59L, continuous line cavities 269 are formed within the unfilled volumes of the line trenches 149. Each continuous line cavity 269 has a laterally undulating width, and is formed within a respective one of the line trenches 149. The volumes of the continuous line trenches 269 include all volumes of the pillar cavities 69 and the line cavities 169 and all volumes of the removed sacrificial line trench fill material layer 59L that was present in the line trenches 149 at the processing steps of FIGS. 11A and 11B. Each continuous line trench 269 can laterally extend along the first horizontal direction hd1 and can have a periodically undulating width along the second horizontal direction hd2 within the memory array region 100. Each continuous line trench 269 can laterally extend through the memory array region 100 and the contact region 300 along the first horizontal direction hd1. An anisotropic etch is performed to remove horizontal portions of the memory stack structures 155 exposed at the bottom of the continuous line trenches 269 and located over the insulating cap layer 70. The anisotropic etch separates the vertical semiconductor channel layer 160 into a pair of separated vertically extending sidewall spacers that function as vertical semiconductor channels 60.

Referring to FIGS. 13A-13D, a dielectric material such as undoped silicate glass or a doped silicate glass is deposited in each continuous line cavity 269 by a conformal deposition process or a self-planarizing deposition process. For example, low pressure chemical vapor deposition (LPCVD) may be employed to conformally deposit a silicate glass material, or spin coating may be employed to deposit a spin-on glass. Optionally, an anneal process may be performed to densify or reflow the silicate glass material. Excess portions of the dielectric material can be removed from above the horizontal plane including the top surface of the insulating cap layer 70 by a planarization process, which can include a recess etch or chemical mechanical planarization. Remaining portions of the dielectric material constitute laterally undulating dielectric rails 62. Each laterally undulating dielectric rail 62 is formed within a respective one of the line trenches 149, and has a width along the second horizontal direction hd2 that varies along the first horizontal direction hd1. The minimum width of each laterally undulating dielectric rail 62 can be a lateral separation distance between a pair of inner sidewalls of a vertical semiconductor channel 60 in a neck region 162 shown in FIGS. 13C and 13D, and the maximum width of each laterally undulating dielectric rail 62 can be the same as, or greater than, the lateral separation distance between a neighboring pair of sidewalls of insulating layers 32 spaced by the continuous line trench 269 in the bulbous region 162 shown in FIGS. 13C and 13D. The lateral undulation of the width of the laterally undulating dielectric rails 62 can be periodic along the first horizontal direction hd1 within the memory array region 100. Each region of the laterally undulating dielectric rail 62 located between a pair of vertical sidewalls of a vertical semiconductor channel 60 is herein referred to as the neck region 162, and each region of the laterally undulating dielectric rail 62 located between a neighboring pair of neck regions is herein referred to as the bulbous region 262.

Each set of material portions that fill a line trench 149 is herein referred to as a line trench fill structure (155, 62, 57S, 57T). Each line trench fill structure (155, 62, 57S, 57T) comprises a laterally undulating dielectric rail 62 having a laterally undulating width along the second horizontal direction hd2 and extending along the first horizontal direction hd1 and a row of in-process memory stack structures 155 located at neck regions of the laterally undulating dielectric rail 62 and comprising a respective in-process charge storage layer 154.

Figure 14A:
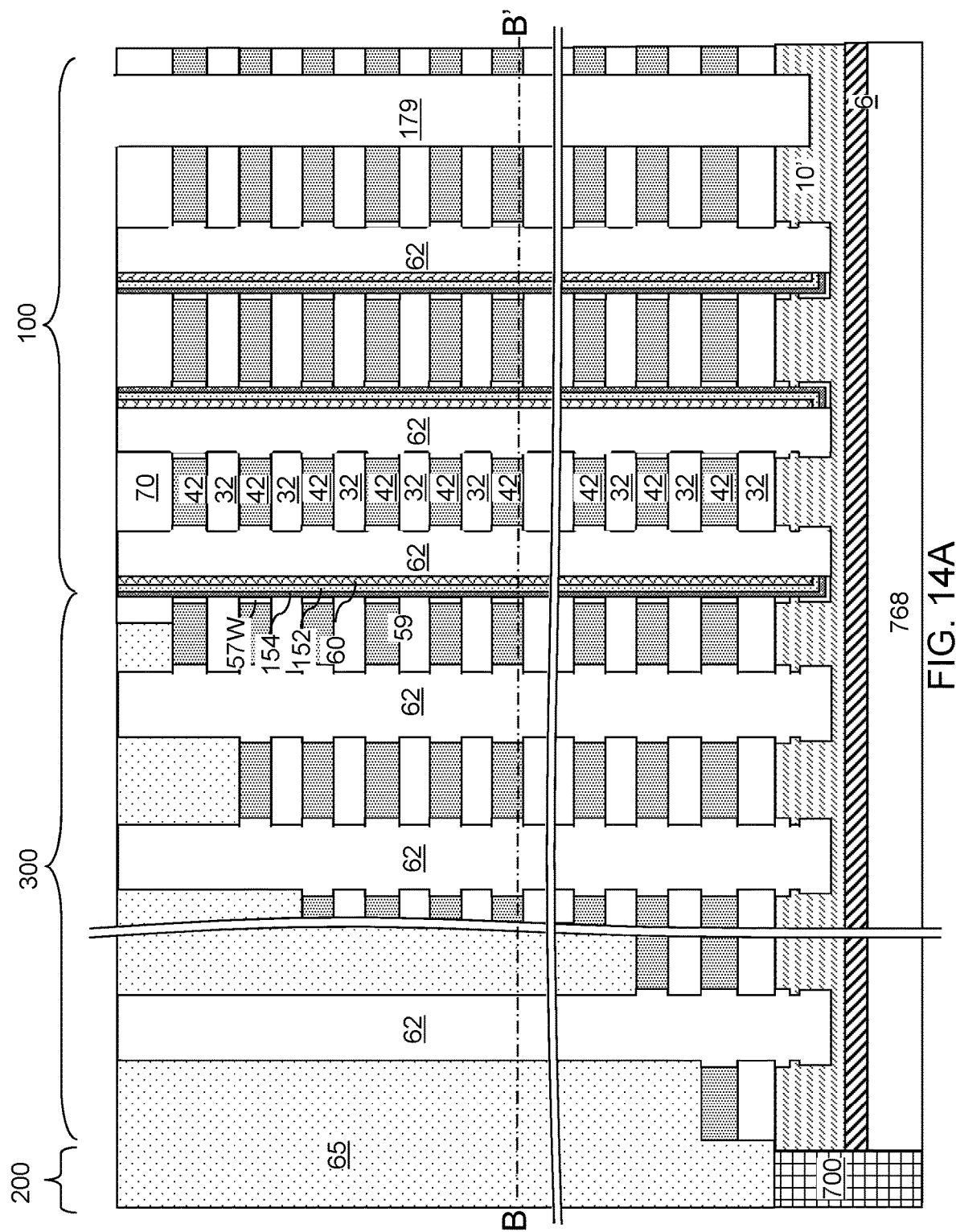
FIG. 14A is a vertical cross-sectional view of the exemplary structure after formation of backside via cavities according to an embodiment of the present disclosure.
Figure 14B:
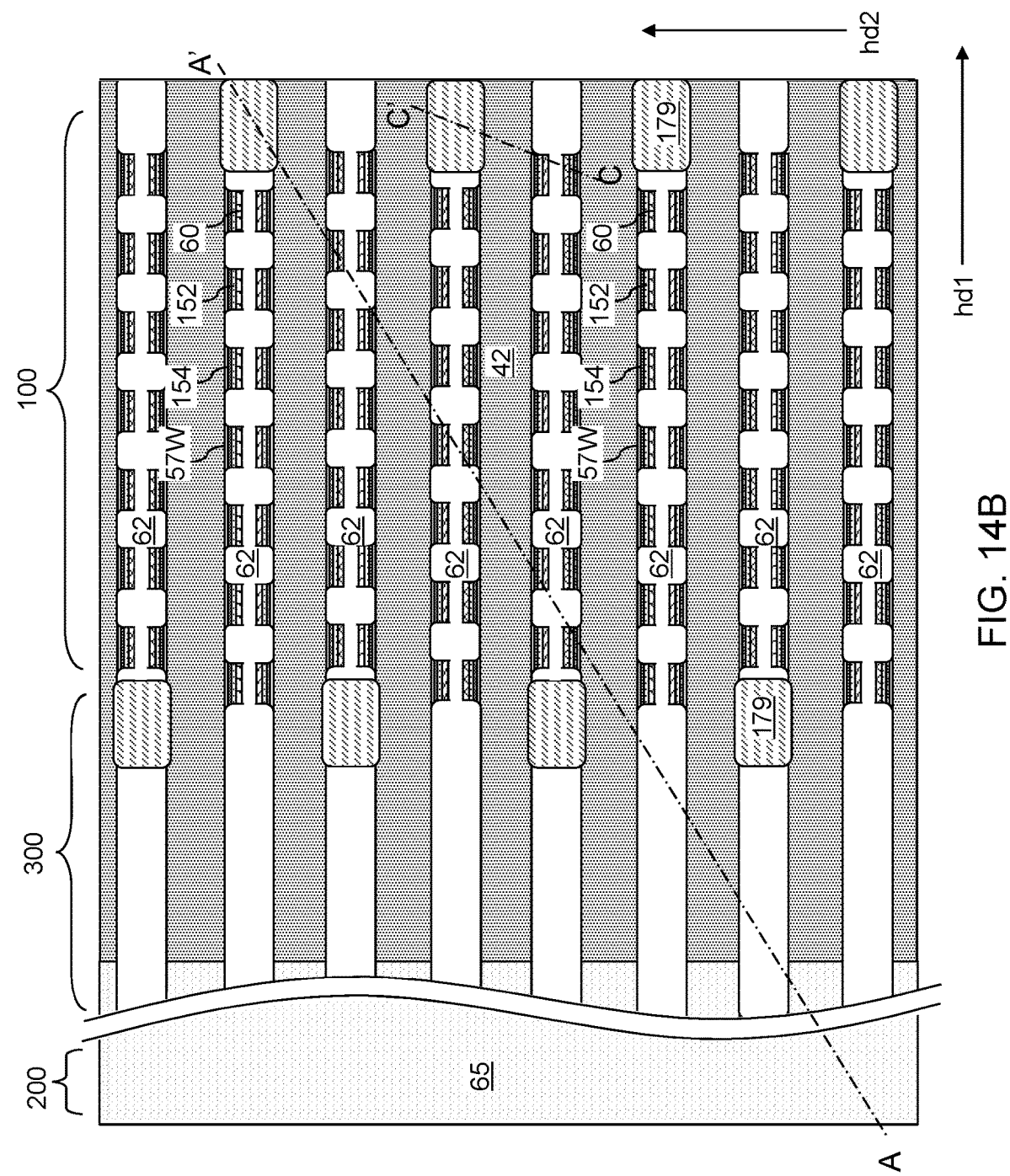
FIG. 14B is a top-down view of the exemplary structure of FIG. 14A. The vertical plane A-A' is the plane of the cross-section for FIG. 14A.
Figure 14C:
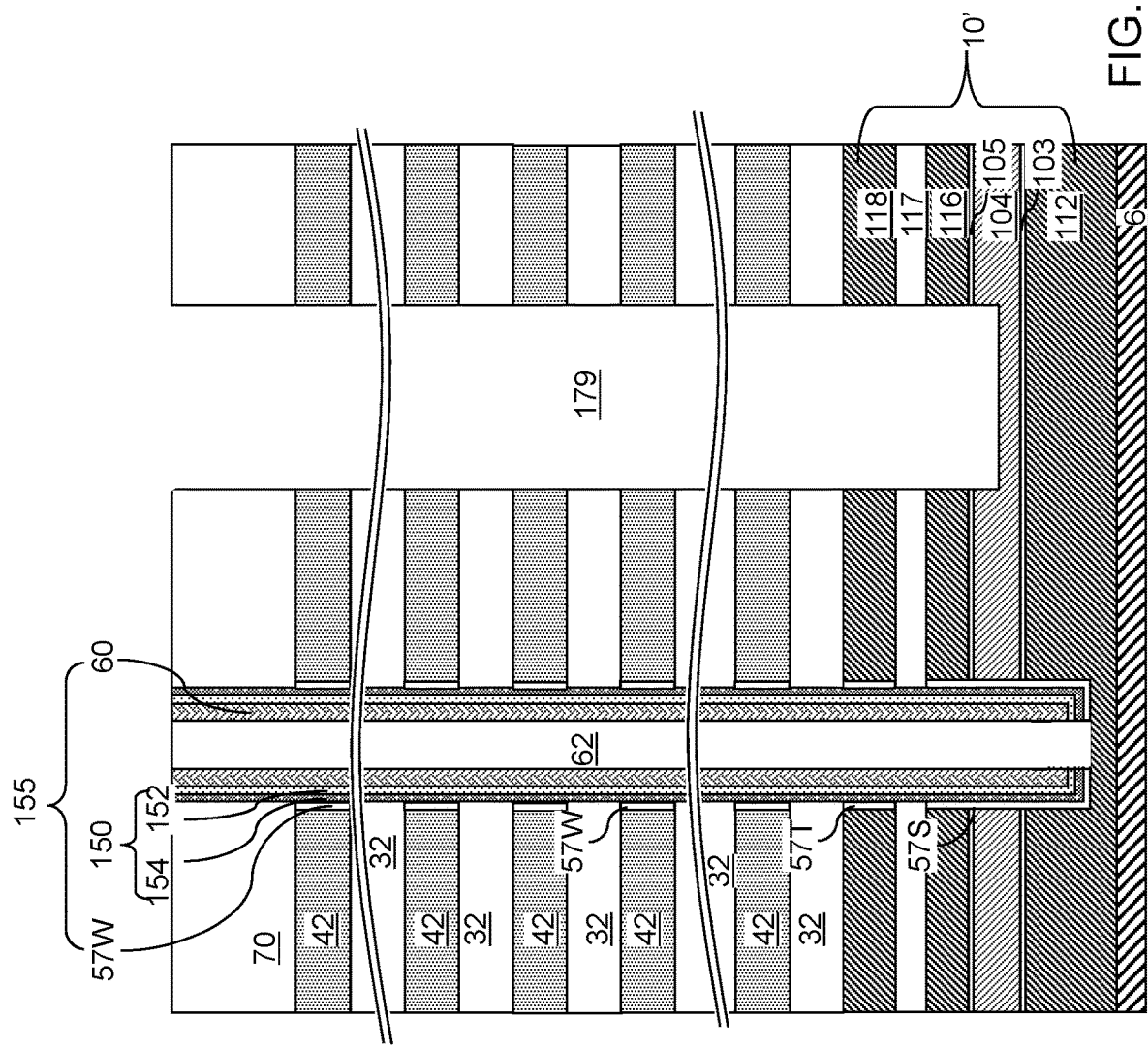
FIG. 14C is a vertical cross-sectional view of a region of the exemplary structure along the vertical plane C-C' of FIG. 14C.

Referring to FIGS. 14A-14C, backside via cavities 179 can be formed through discrete regions of the laterally undulating dielectric rail 62 and through regions of the vertically alternating sequence (32, 42) that are located in proximity to end regions of the laterally undulating dielectric rail 62. In one embodiment, a first subset of the backside via cavities 179 can be formed within areas of lateral extension of the line trenches 149 along the first horizontal direction hd1 within the memory array region 100. Further, a second subset of the backside via cavities 179 can be formed within areas that overlap with the laterally undulating dielectric rails 62, and/or within the areas of lateral extension of the line trenches 149 along the first horizontal direction hd1 within the contact region 300. Thus, the combination of the line trenches 149 and the first subset of the backside via cavities 179 can divide the vertically alternating sequence of the insulating layers 32 and the sacrificial material layers 42 into a plurality of alternating stacks of insulating strips and sacrificial material strips. Each patterned portion of the insulating layers 32 constitutes an insulating strip, and each patterned portion of the sacrificial material layers 42 constitutes a sacrificial material strip. As such, each insulating strip is henceforth referred to employing the same reference numeral as the insulating layers 32, and each sacrificial material strip is henceforth referred to employing the same reference numeral as the sacrificial material layers 42.

The locations of the backside via cavities 179 can be selected such that each point within the sacrificial material strips 42 is laterally spaced from a most proximal one of the backside via cavities 179 by a lateral distance that does not exceed a lateral etch distance during a subsequent etch process that etches the material of the sacrificial material strips 42 selective to the materials of the insulating strips 32 and the word-line-level cover silicon oxide portions 57W. The width of each backside via cavity 179 along the second horizontal direction hd2 may be the same as, or greater than, the width of the line trenches 149 along the second horizontal direction hd2, and is less than the pitch of the line trenches 149 along the second horizontal direction hd2. The length of each backside via cavity 179 along the first horizontal direction hd1 may be the same as, less than, or greater than, the length of the bulbous regions of the laterally undulating dielectric rails 62.

The insulating strips 32 and the sacrificial material strips 42, i.e., the remaining portions of the vertically alternating sequence, comprise alternating stacks of insulating strips 32 and sacrificial material strips 42. Within each alternating stack of insulating strips 32 and sacrificial material strips 42, the insulating strips 32 and the sacrificial material strips 42 alternate vertically, and laterally extend along the first horizontal direction hd1. The alternating stacks of insulating strips 32 and sacrificial material strips 42 and the line trench fill structures (155, 62, 57S, 57T) are formed over a substrate 8. The alternating stacks (32, 42) laterally extend along a first horizontal direction hd1 and are laterally spaced apart among one another by the line trench fill structures (155, 62, 57S, 57T) along a second horizontal direction hd2. The alternating stacks (32, 42) and the line trench fill structures (155, 62, 57S, 57T) laterally alternate along the second horizontal direction hd2.

Figure 15A:
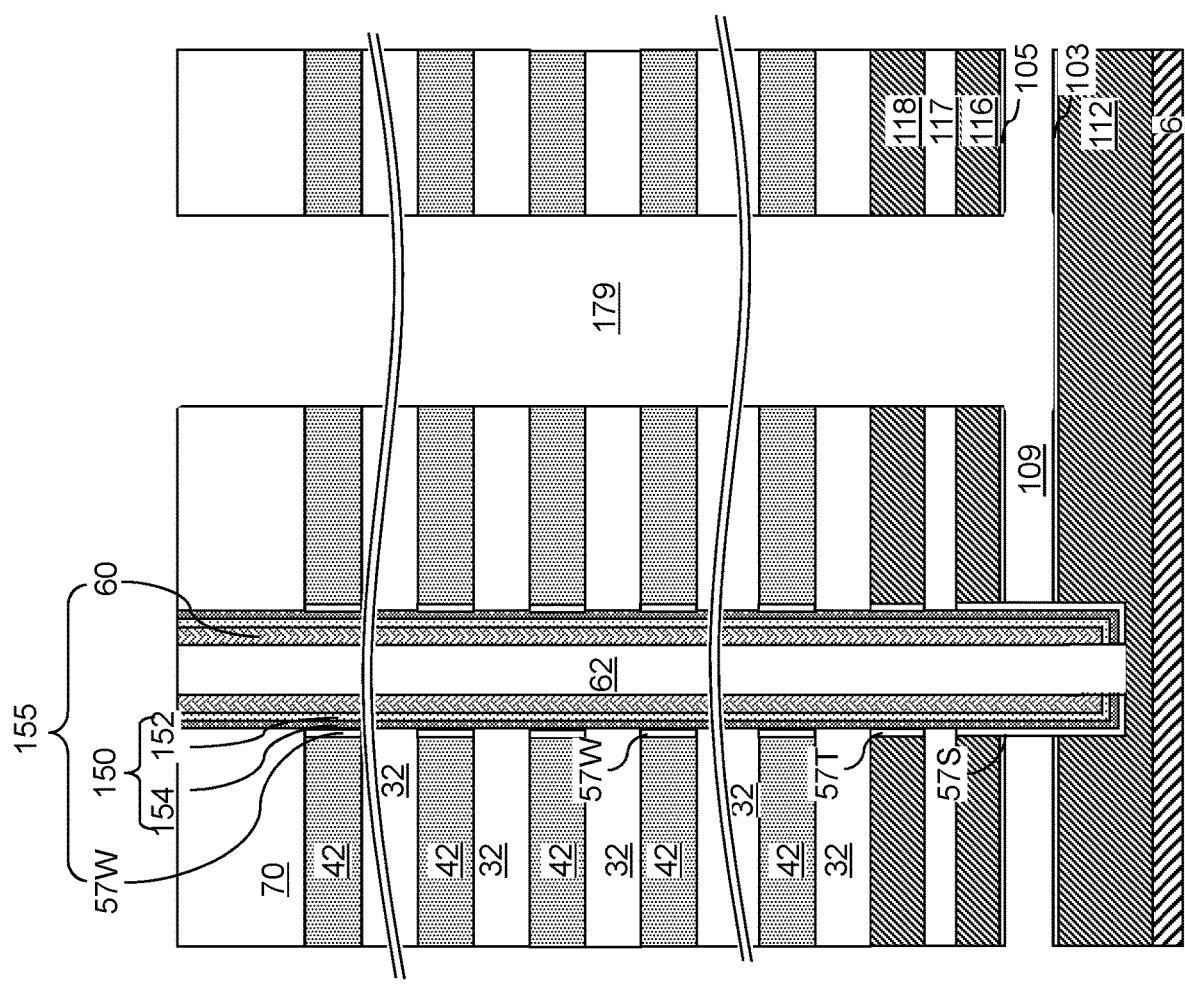
FIGS. 15A-15C are sequential vertical cross-sectional views of a region of the exemplary structure during replacement of in-process source-level material layers with source-level material layers according to an embodiment of the present disclosure.
Figure 15B:
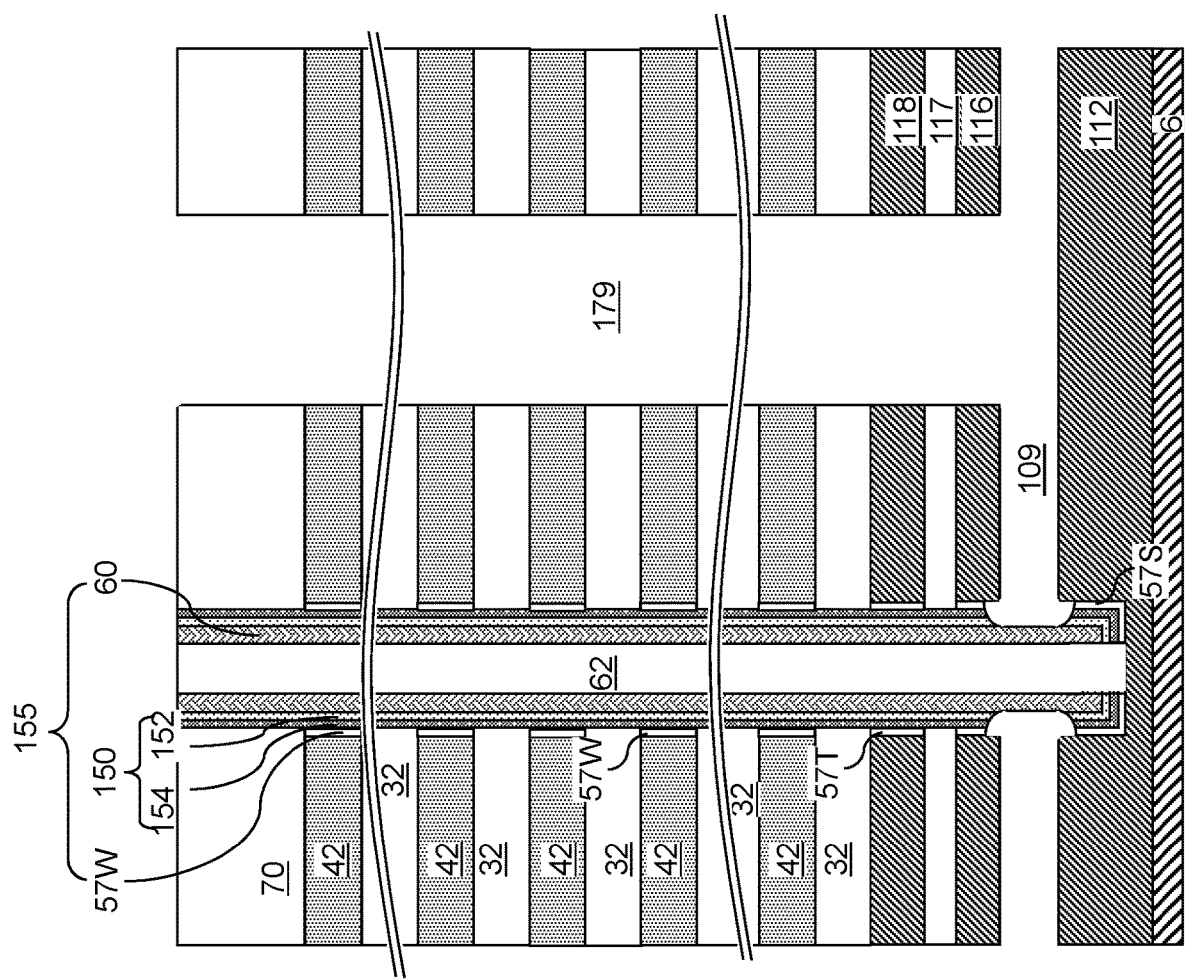
Figure 15C:
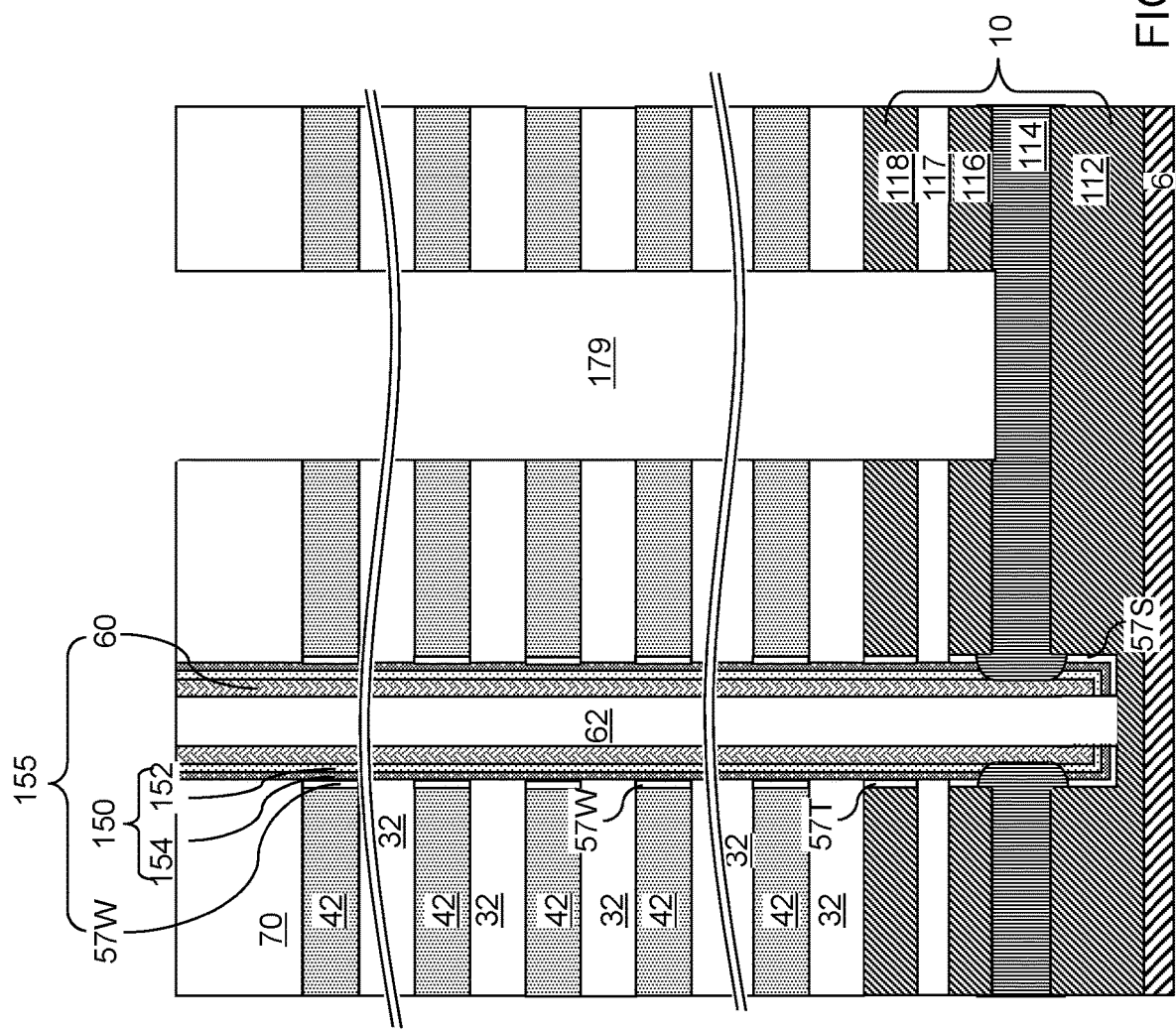

FIGS. 15A-15C are sequential vertical cross-sectional views of a region of the exemplary structure during replacement of in-process source-level material layers 10' with source-level material layers according to an embodiment of the present disclosure.

Referring to FIG. 15A, an etchant that etches the material of the source-level sacrificial layer 104 selective to the materials of the lower source layer 112, the upper source layer 116, the optional source-select-level conductive layer 118, the alternating stack (32, 42), the insulating cap layer 70, and the source-level insulating strip 117 can be introduced into the backside trenches in an isotropic etch process. For example, if the source-level sacrificial layer 104 includes undoped amorphous silicon or an undoped amorphous silicon-germanium alloy, the lower source layer 112, the upper source layer 116, and the optional source-select-level conductive layer 118 include heavily n-doped silicon, and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the lower source layer 112, the upper source layer 116, the optional source-select-level conductive layer 118, the alternating stack (32, 42), the insulating cap layer 70, and the source-level insulating strip 117, and the upper and lower sacrificial liners (105, 103). A source cavity 109 is formed in the volume from which the source-level sacrificial layer 104 is removed.

Referring to FIG. 15B, a sequence of isotropic etchants, such as wet etchants, can be applied to the physically exposed portions of the in-process memory films 150 to sequentially etch physically exposed regions of the source-level cover silicon oxide portions 57S and the various component layers of the in-process memory films 150 from outside to inside, and to physically expose cylindrical surfaces of the vertical semiconductor channels 60 at the level of the source cavity 109. The upper and lower sacrificial liners (105, 103) can be collaterally etched during removal of the portions of the in-process memory films 150 located at the level of the source cavity 109. The source cavity 109 can be expanded in volume by removal of the portions of the in-process memory films 150 at the level of the source cavity 109 and the upper and lower sacrificial liners (105, 103). A top surface of the lower source layer 112 and a bottom surface of the upper source layer 116 can be physically exposed to the source cavity 109.

Referring to FIG. 15C, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity 109 is filled with the source contact layer 114. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating strip 117, and the optional source-select-level conductive layer 118 constitutes source-level material layers 10, which replaces the in-process source-level material layers 10'. Optionally, an oxidation process can be performed to convert a surface portion of the source contact layer 114 into a semiconductor oxide portion (not illustrated) underneath each backside via cavity 179. The surface portion of each semiconductor layer (114, 116, 118) exposed in each backside via cavity 179 can optionally be oxidized to form semiconductor oxide (e.g., silicon oxide) cover portions.

Figure 16:
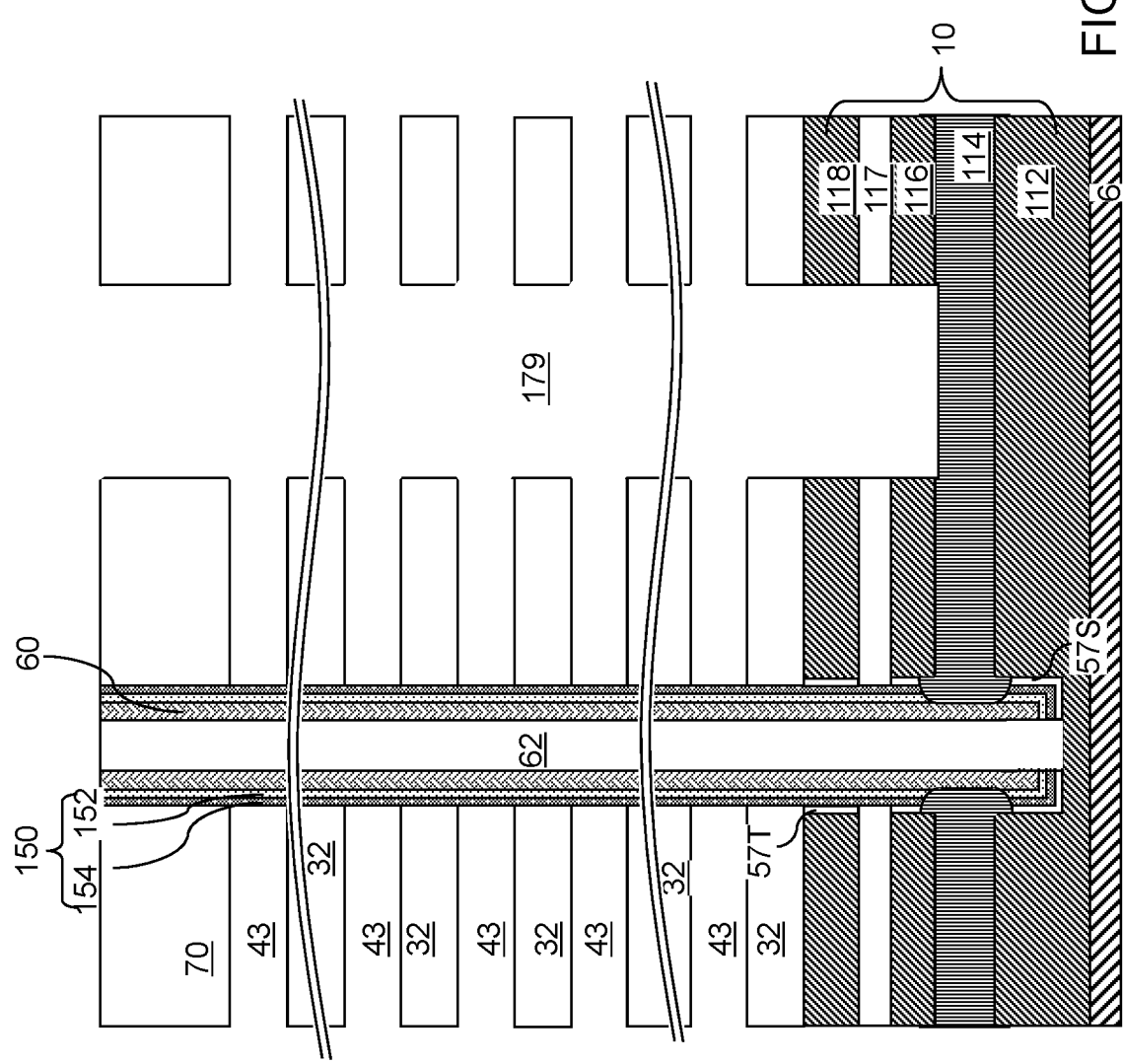
FIG. 16 is a vertical cross-sectional view of a region of the exemplary structure after formation of backside recesses according to an embodiment of the present disclosure.

Referring to FIG. 16, an etchant that selectively etches the second material of the sacrificial material strips 42 with respect to the first material of the insulating strips 32 and the source-level material layers 10 can be introduced into the backside via cavities 179, for example, employing an isotropic etch process. Backside recesses 43 are formed in volumes from which the sacrificial material strips 42 are removed. The removal of the second material of the sacrificial material strips 42 can be selective to the first material of the insulating strips 32, the silicon oxide material (or the silicon oxynitride material) of the word-line-level cover silicon oxide portions 57W, the material of the retro-stepped dielectric material portion 65, and the materials of the source-level material layers 10.

The isotropic etch process that removes the second material selective to the first material and the outermost layer of the in-process memory films 150 can be a wet etch process employing a wet etch solution, or can be a gas phase (dry) etch process in which the etchant is introduced in a vapor phase into the backside via cavities 179. For example, if the sacrificial material strips 42 include silicon nitride, and if the materials of the insulating strips 32, the retro-stepped dielectric material portion 65, and the word-line-level cover silicon oxide portions 57W include silicon oxide/oxynitride materials such as undoped silicate glass and/or a doped silicate glass and/or thermal silicon oxide or oxynitride, the etch process can be a wet etch process in which the exemplary structure is immersed within a wet etch tank including phosphoric acid, which etches silicon nitride selective to silicon oxide. The duration of the isotropic etch process can be selected such that the sacrificial material strips 42 are completely removed from each alternating stack (32, 42) of insulating strips 32 and sacrificial material strips 42. Each backside recess 43 can be a laterally extending cavity having a lateral dimension that is greater than the vertical extent of the cavity. In other words, the lateral dimension of each backside recess 43 can be greater than the height of the backside recess 43.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface 7 of the substrate 8. A backside recess 43 can be vertically bounded by a top surface of an underlying insulating strip 32 and a bottom surface of an overlying insulating strip 32. In one embodiment, each backside recess 43 can have a uniform height throughout.

Subsequently, an isotropic etch process can be performed to remove the word-line-level cover silicon oxide portions 57W selective to the in-process charge storage layers 154 of the in-process memory films 150. For example, a wet etch process can be performed to remove the word-line-level cover silicon oxide portions 57W without etching the silicon nitride material of the in-process charge storage layer 154. The wet etch process can employ, for example, dilute hydrofluoric acid. Portions of outer sidewalls of the in-process charge storage layers 154 are physically exposed at each level of the backside recesses 43.

Figure 17:
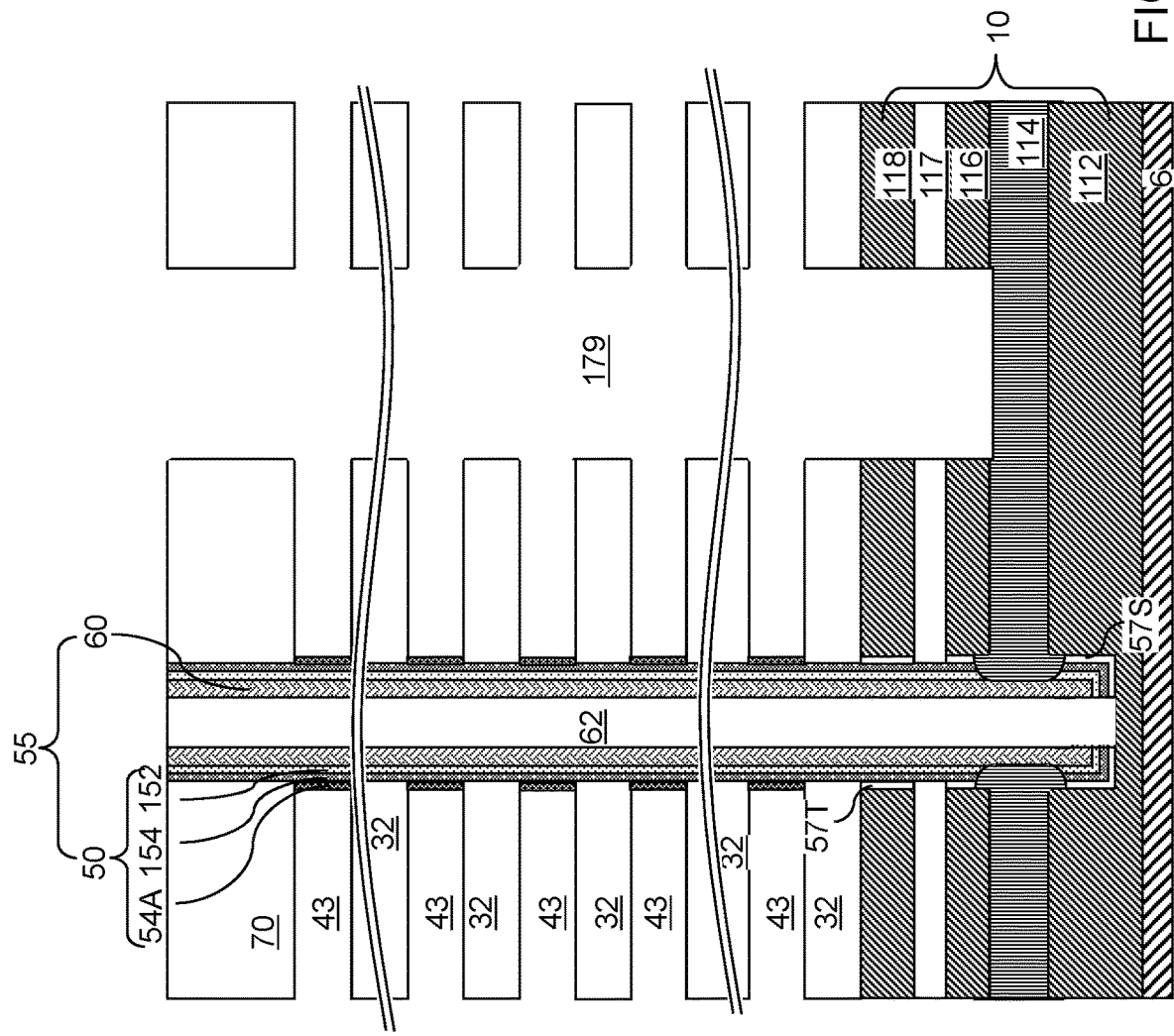
FIG. 17 is a vertical cross-sectional view of a region of the exemplary structure after selective growth of a charge storage material according to an embodiment of the present disclosure.

Referring to FIG. 17, a charge storage material can be selectively grown on physically exposed surfaces of the in-process charge storage layers 154. For example, a low pressure chemical vapor deposition (LPCVD) process employing dichlorosilane and ammonia as reactants can be employed to deposit silicon nitride, which grows on silicon nitride surfaces with no incubation time but has a finite incubation time on silicon oxide surfaces such as the surfaces of the insulating strips 32 and the insulating cap layer 70. In one embodiment, the insulating strips 32 comprise silicon oxide, and the selectively grown charge storage material is deposited on the physically exposed surfaces of the in-process charge storage layers 154 without growth on surfaces of the insulating strips 32 employing a conformal silicon nitride deposition process that provides a longer incubation time on silicon oxide surfaces than on silicon nitride surfaces. The incubation time can be in a range from 5 seconds to 20 seconds.

Optionally, an isotropic etch-back process such as a chemical downstream etch can be performed to remove silicon nitride nucleation islands from the surfaces of the insulating strips 32 and the insulating cap layer 70. In this case, an isotropic etchant such as $NF_3$ or $CF_4$ can be employing in combination with $O_2$ in a chemical downstream etch. In one embodiment, the selective deposition process is performed once to form selectively grown portions of the charge storage material on the outer surfaces of the in-process charge storage layer 154. In another embodiment, the selective deposition process employing differential incubation times on different surfaces and the isotropic etch-back process can be repeated multiple times to provide sufficient thickness for the selectively grown portions of the charge storage material.

The selectively grown portions of the charge storage material constitute annular charge storage spacers 54A, which are tubular structures located on an outer sidewall of a respective one of the in-process charge storage layers 154. The annular charge storage spacers 54A comprise the above described partially discrete charge storage elements because they contact the respective charge storage layers 154 on only one edge. The thickness of each annular charge storage spacer 54A can be in a range from 0.5 nm to 10 nm, such as from 1 nm to 6 nm and/or from 1.5 nm to 4 nm, although lesser and greater thicknesses can also be employed. Each contiguous combination of an in-process charge storage layer 154 and selectively grown portions of the charge storage material (i.e., annular charge storage spacers 54A) constitutes a charge storage layer (154, 54A). In one embodiment, the selectively grown charge storage material and the in-process charge storage layers 154 comprise, and/or consist essentially of, silicon nitride.

Charge storage layers (154, 54A) having a vertical thickness modulation is provided. The charge storage layers (154, 54A) have a greater thickness at the levels of the backside recesses 43, which are levels of word lines to be subsequently formed, and has a lesser thickness at the levels of insulating strips 32. The portions of the charge storage layers (154, 54A) to store electrical charges can be formed with a sufficient lateral thickness, while the portions of the continuous portions 154 of the charge storage layers (154, 54A) located at the levels of the insulating strips 32 (i.e., located between the portions of the charge storage layers (154, 54A) to be employed to store electrical charges) have a lesser thickness to suppress charge diffusion therethrough. Thus, charge leakage through the portions of the charge storage layers (154, 54A) located at the levels of the insulating strips 32 can be reduced through the vertically undulating thickness profile of the charge storage layers (154, 54A) of the present disclosure.

Each contiguous combination of the charge storage layers (154, 54A) and the blocking dielectrics 152 constitutes a memory film 50. Thus, each memory film 50 includes a blocking dielectric 152, a continuous charge storage material liner having a uniform thickness (i.e., an in-process charge storage layer 154), and a plurality of annular charge storage spacers 54A. Each contiguous combination of a memory film 50 and vertical semiconductor channels 60 constitutes a memory stack structure 55 in which electrical charges can be stored at multiple levels. Thus, each memory stack structure 55 includes a memory film 50 and a vertical semiconductor channels 60 laterally surrounded by the memory film 50.

Figure 18:
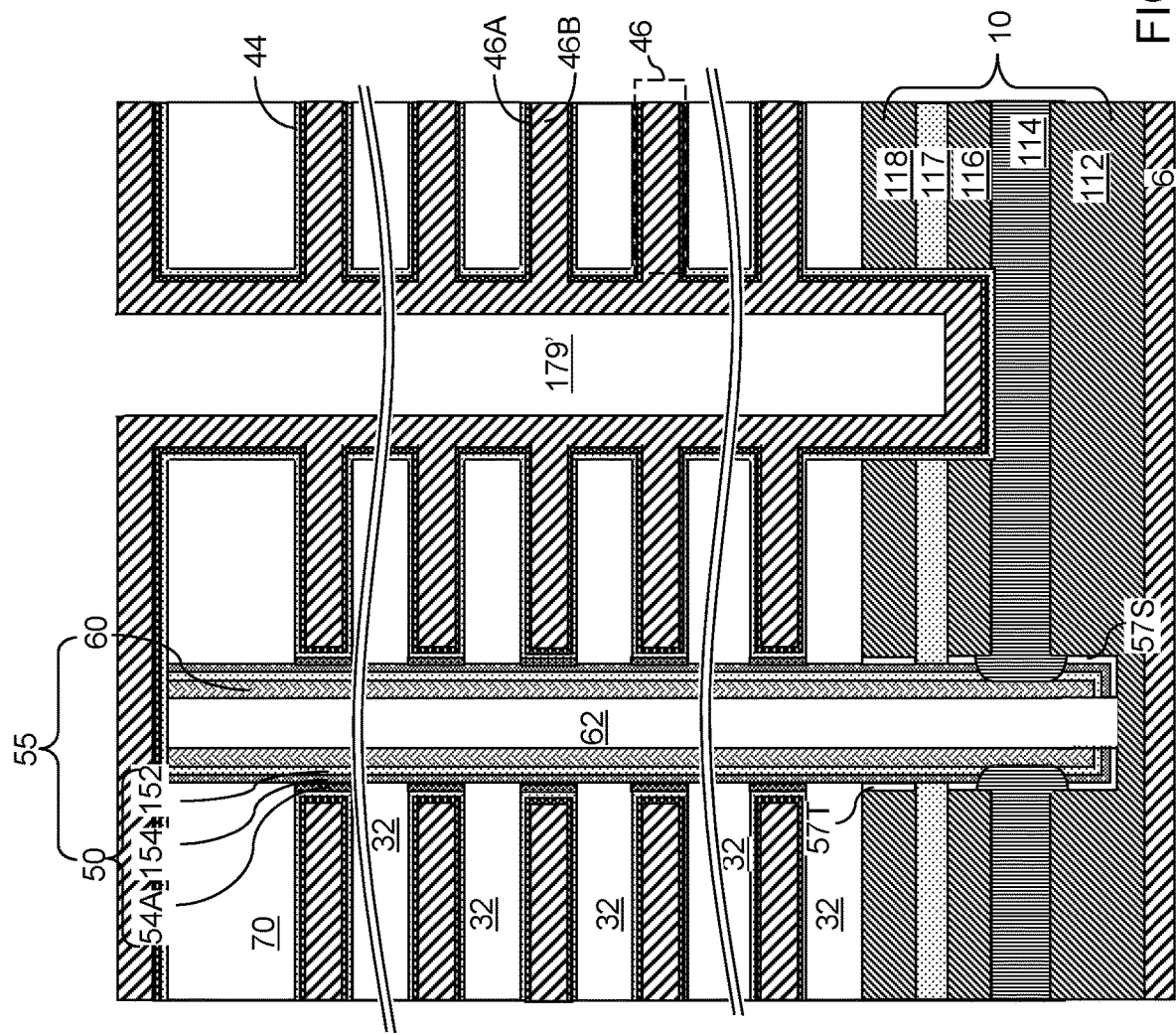
FIG. 18 is a vertical cross-sectional view of a region of the exemplary structure after deposition of a tunneling dielectric and at least one electrically conductive material according to an embodiment of the present disclosure.

Referring to FIG. 18, a tunneling dielectric 44 can be formed on the physically exposed surfaces of the charge storage layers (154, 54A) by at least one conformal dielectric deposition process. The tunneling dielectric 44 includes at least one dielectric material through which charge tunneling can be performed under suitable electrical bias conditions. The charge tunneling may be performed by Fowler-Nordheim tunneling. The tunneling dielectric 44 can include silicon oxide, silicon nitride, silicon oxynitride, dielectric metal oxides (such as aluminum oxide or hafnium oxide), dielectric metal oxynitride, dielectric metal silicates, alloys thereof, and/or combinations thereof. In one embodiment, the tunneling dielectric 44 can include a stack of a first silicon oxide layer, a silicon oxynitride layer, and a second silicon oxide layer, which is commonly known as an ONO stack. In one embodiment, the tunneling dielectric 44 can include a silicon oxide layer that is substantially free of carbon or a silicon oxynitride layer that is substantially free of carbon. The thickness of the tunneling dielectric 44 can be in a range from 2 nm to 20 nm, although lesser and greater thicknesses can also be employed.

The tunneling dielectric 44 can have a uniform thickness, which is herein referred to as a tunneling dielectric thickness $d_t$. The tunneling dielectric 44 has an effective dielectric constant, which is herein referred to as a tunneling dielectric constant $\varepsilon_t$. In case the tunneling dielectric 44 includes multiple component layers, the tunneling dielectric constant $\varepsilon_t$ is defined by the following equation:

$$\frac{d_t}{\varepsilon_t} = \sum_{i=1}^{N} \frac{d_{ti}}{\varepsilon_{ti}},$$

in which the tunneling dielectric 44 has N component dielectric layers, $d_{ti}$ is the thickness of the i-th component dielectric layer, and $\varepsilon_{ti}$ is the dielectric constant of the i-th component dielectric layer. The ratio of the tunneling dielectric constant $\varepsilon_t$ to the tunneling dielectric thickness $d_t$ is the capacitance per unit area of a capacitor including a pair of electrodes separated by the tunneling dielectric 44.

Each blocking dielectric 152 can have a uniform thickness, which is herein referred to as a blocking dielectric thickness $d_b$. Each blocking dielectric 152 has an effective dielectric constant, which is herein referred to as a blocking dielectric constant $\varepsilon_b$. In case each blocking dielectric 152 includes multiple component layers, the blocking dielectric constant $\varepsilon_b$ is defined by the following equation:

$$\frac{d_b}{\varepsilon_b} = \sum_{i=1}^{M} \frac{d_{bi}}{\varepsilon_{bi}},$$

In which each blocking dielectric 152 has M component dielectric layers, $d_{bi}$ is the thickness of the i-th component dielectric layer, and $\varepsilon_{ti}$ is the dielectric constant of the i-th component dielectric layer. The ratio of the blocking dielectric constant $\varepsilon_b$ to the blocking dielectric thickness $d_b$ is the capacitance per unit area of a capacitor including a pair of electrodes separated by each blocking dielectric 152.

According to an aspect of the present disclosure, the ratio of the blocking dielectric constant $\varepsilon_b$ to the blocking dielectric thickness $d_b$ is greater than a ratio of the tunneling dielectric constant $\varepsilon_t$ to the tunneling dielectric thickness $d_t$. Thus, the capacitance per unit area of a planar capacitor employing a blocking dielectric 152 as a capacitor dielectric is greater than the capacitance per unit area of a planar capacitor employing the tunneling dielectric 44 as a capacitor dielectric, and charge tunneling occurs through the tunneling dielectric 44 at a lower voltage bias than through a blocking dielectric 152.

A metallic barrier layer 46A can be deposited in the backside recesses 43 directly on the physically exposed outer sidewalls of the tunneling dielectric 44. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in remaining volumes of backside recesses 43, on the sidewalls of the at least one the backside via cavity 179, and over the top surface of the insulating cap layer 70 to form a metallic fill material portion 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material portion 46B can consist essentially of at least one elemental metal. The at least one elemental metal of the metallic fill material portion 46B can be selected, for example, from tungsten, cobalt, ruthenium, titanium, and tantalum. In one embodiment, the metallic fill material portion 46B can consist essentially of a single elemental metal. In one embodiment, the metallic fill material portion 46B can be deposited employing a fluorine-containing precursor gas such as $WF_6$. In one embodiment, the metallic fill material portion 46B can be a tungsten layer including a residual level of fluorine atoms as impurities.

A plurality of electrically conductive strips 46 (i.e., electrically conductive strips having strip shapes) can be formed in the plurality of backside recesses 43, and a continuous metallic material layer can be formed on the sidewalls of each backside via cavity 179 and over the insulating cap layer 70. Each electrically conductive strip 46 includes a portion of the metallic barrier layer 46A and a metallic fill material portion 46B that are located between a vertically neighboring pair of dielectric material strips such as a pair of insulating strips 32.

Figure 19:
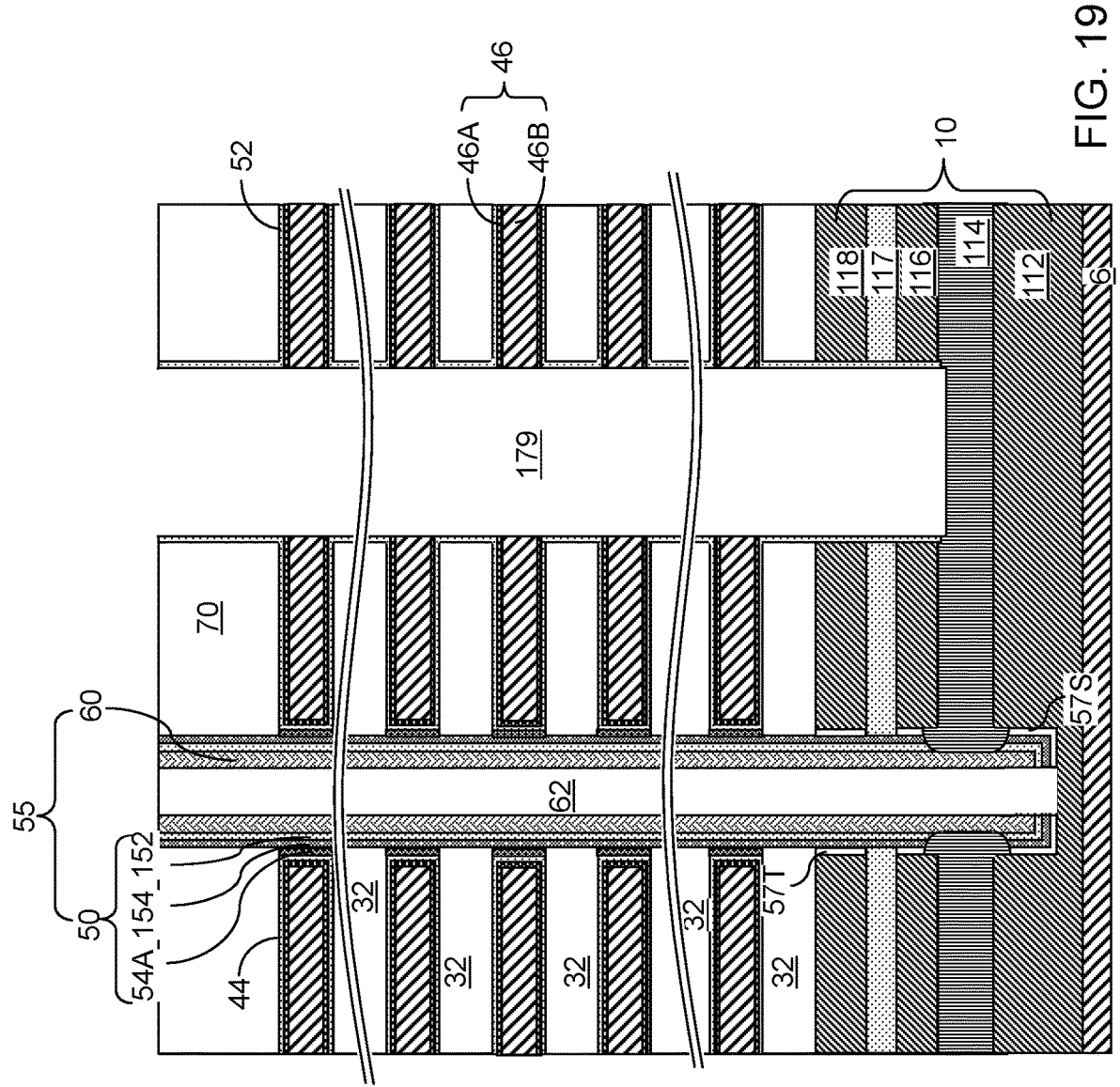
FIG. 19 is a vertical cross-sectional view of a region of the exemplary structure after formation of electrically conductive strips according to an embodiment of the present disclosure.

Referring to FIG. 19, the deposited metallic material of the continuous electrically conductive material layer is etched back from the sidewalls of each backside via cavity 179 and from above the insulating cap layer, for example, by an isotropic wet etch, an anisotropic dry etch, or a combination thereof. Each remaining portion of the deposited metallic material in the backside recesses 43 constitutes an electrically conductive strip 46. Each electrically conductive strip 46 can be a conductive line structure. Thus, the sacrificial material strips 42 are replaced with the electrically conductive strips 46.

Each electrically conductive strip 46 can function as a combination of a plurality of control gate electrodes located at a same level and a word line electrically interconnecting, i.e., electrically shorting, the plurality of control gate electrodes located at the same level. The plurality of control gate electrodes within each electrically conductive strip 46 are the control gate electrodes for the vertical memory devices including the memory stack structures 155. In other words, each electrically conductive strip 46 can be a word line that functions as a common control gate electrode for the plurality of vertical memory devices.

While the present disclosure is described employing an embodiment in which the division of a vertically alternating sequence into multiple alternating stacks of insulating strips 32 and sacrificial material strips 42 occurs upon formation of the backside via cavities 179, embodiments are expressly contemplated herein in which the division of the vertically alternating sequence into multiple alternating stacks of insulating strips 32 and sacrificial material strips 42 occurs at different processing steps. In one embodiment, division of a vertically alternating sequence into multiple alternating stacks of insulating strips 32 and spacer material strips 42 can occur upon formation of the line trenches 149 (i.e., at the processing steps of FIGS. 4A and 4B in case the line trenches 149 extend through the entire length of the contact region 300 along the first horizontal direction hd1).

Generally, the electrically conductive strips 46 of the present disclosure can be formed directly on sidewalls of the tunneling dielectric 44. The electrically conductive strips 46 can comprise at least one conductive material selected from a metal (such as a conductive metallic nitride material, tungsten, cobalt, molybdenum, and/or copper) and a doped semiconductor material including electrical dopants at an atomic concentration of at least $1.0 \times 10^{20}/cm^3$. The vertical semiconductor channels 60 can include a semiconducting material including electrical dopants at an atomic concentration in a range from $1.0 \times 10^{14}/cm^3$ to $1.0 \times 10^{18}/cm^3$.

Figure 20A:
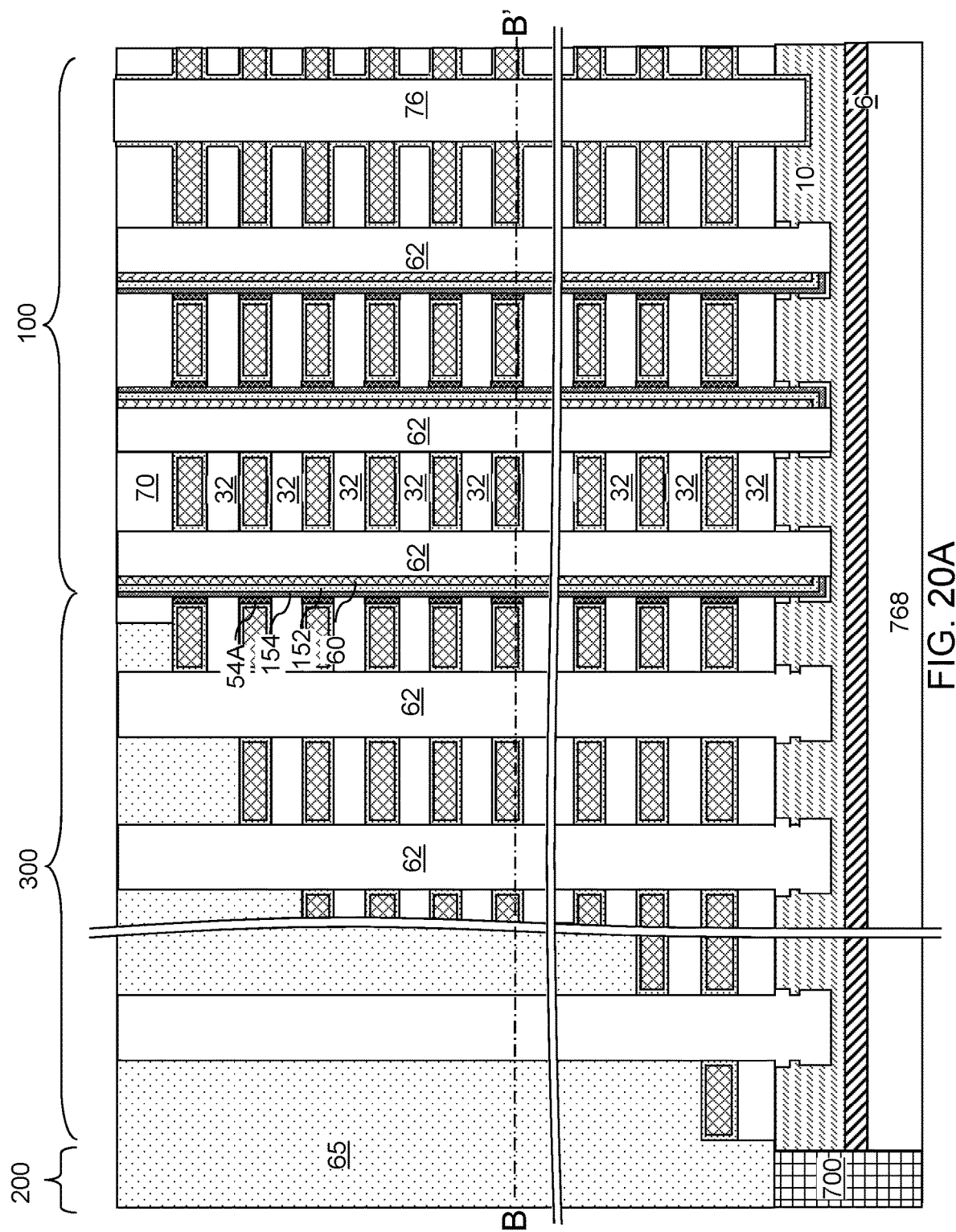
FIG. 20A is a vertical cross-sectional view of the exemplary structure after formation of dielectric pillar structures in the backside via cavities according to an embodiment of the present disclosure.
Figure 20B:
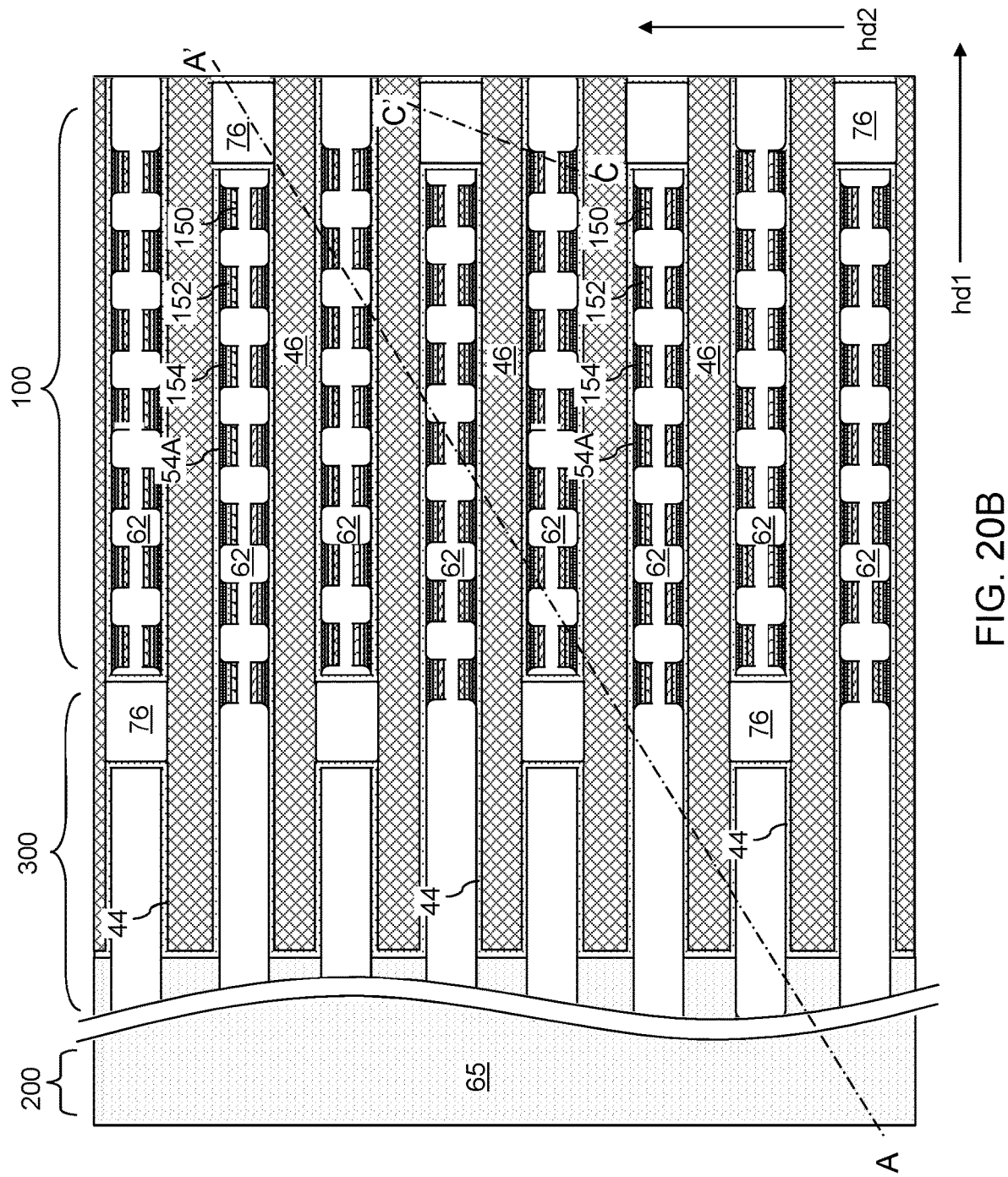
FIG. 20B is a top-down view of the exemplary structure of FIG. 20A. The vertical plane A-A' is the plane of the cross-section for FIG. 20A.
Figure 20C:
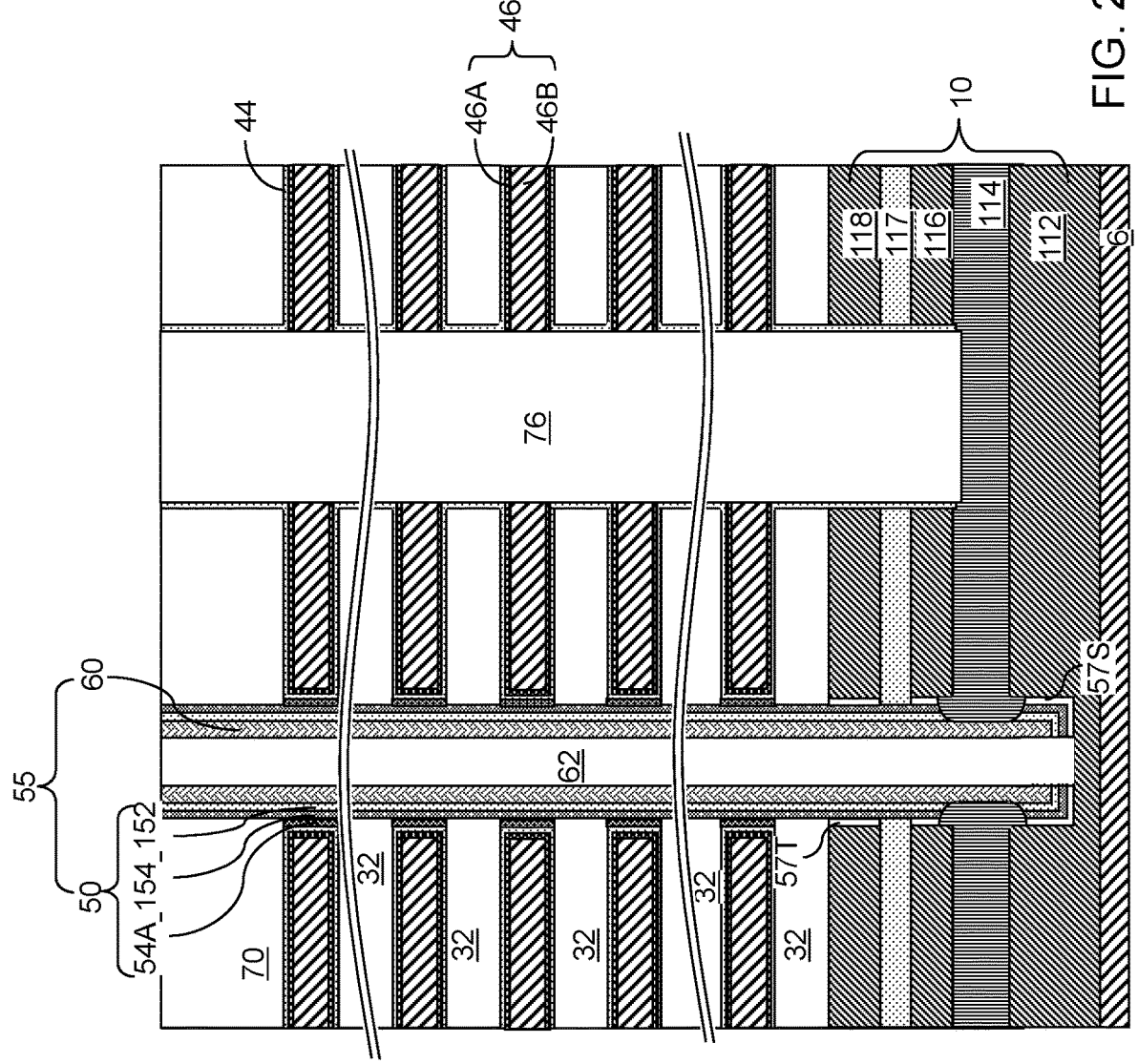
FIG. 20C is a vertical cross-sectional view of a region of the exemplary structure along the vertical plane C-C' of FIG. 20B.

Referring to FIGS. 20A-20C, an insulating material can be formed in the backside via cavities 179 and over the insulating cap layer 70 by a conformal deposition process or a self-planarizing process. Exemplary conformal deposition processes include, but are not limited to, chemical vapor deposition and atomic layer deposition. An exemplary self-planarizing process is spin coating. The insulating material can include silicon oxide, silicon nitride, a dielectric metal oxide, an organosilicate glass, or a combination thereof. In one embodiment, the insulating material can include silicon oxide. Optionally, excess portions of the insulating material may be removed from above the horizontal plane including the top surface of the insulating cap layer 70 by a recess etch or chemical mechanical planarization. Each remaining portion of the insulating material constitutes a dielectric pillar structure 76.

Figure 21A:
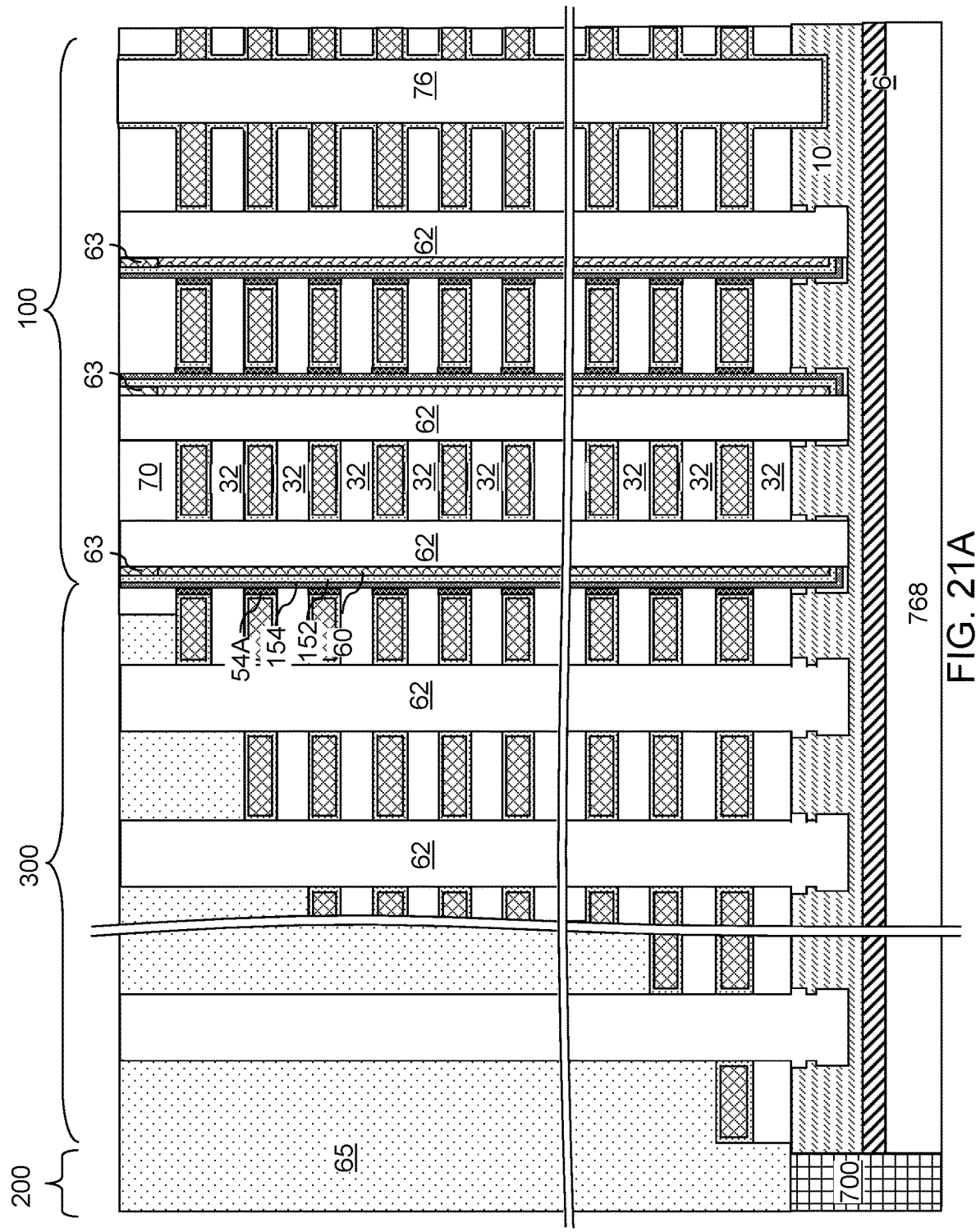
FIG. 21A is a vertical cross-sectional view of the exemplary structure after formation of drain regions according to an embodiment of the present disclosure.
Figure 21B:
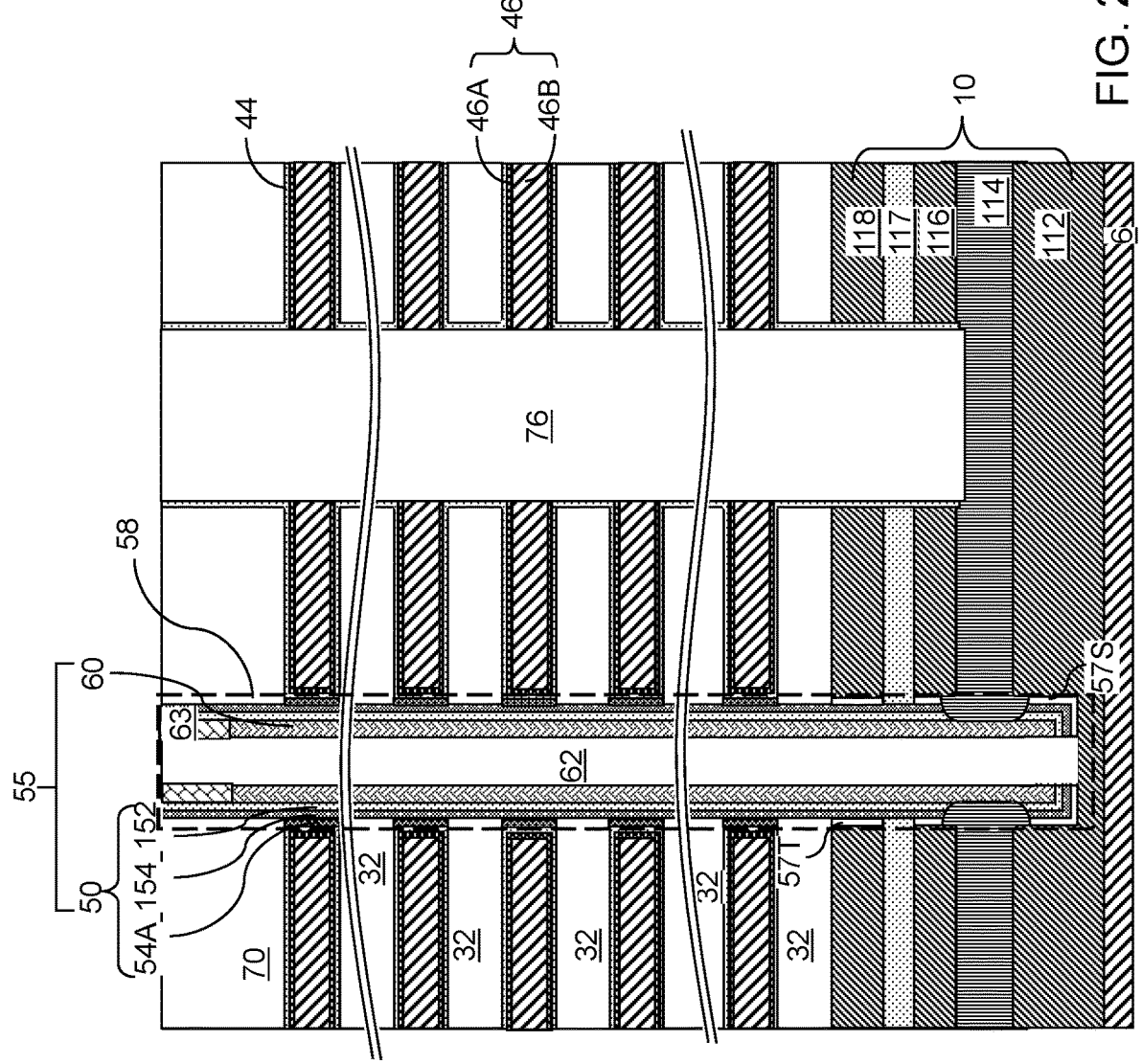
FIG. 21B is a vertical cross-sectional view of a region of the exemplary structure of FIG. 21A.

Referring to FIGS. 21A and 21B, a drain region 63 including a doped semiconductor material having a doping of the second conductivity type can be formed in contact with each of the vertical semiconductor channels 60. The drain regions 63 can be formed by implanting dopants of the second conductivity type into the top portions of each of the vertical semiconductor channels 60. Alternatively, each of the vertical semiconductor channels 60 can be recessed by a selective recess etch followed by depositing a doped semiconductor material having a doping of the second conductivity type into the recesses above the vertical semiconductor channels 60 to form the drain regions 63. Optionally, dopants of the second conductivity type can be implanted into the drain regions 63 to increase the dopant concentration therein. The atomic concentration of dopants of the second conductivity type in the drain regions 63 can be in a range from $5.0 \times 10^{19}/cm^3$ to $2.0 \times 10^{21}/cm^3$, although lesser and greater atomic concentrations can also be employed. Each contiguous set of a memory stack structure 55 and a drain region 63 constitutes a memory stack assembly 58.

Figure 22A:
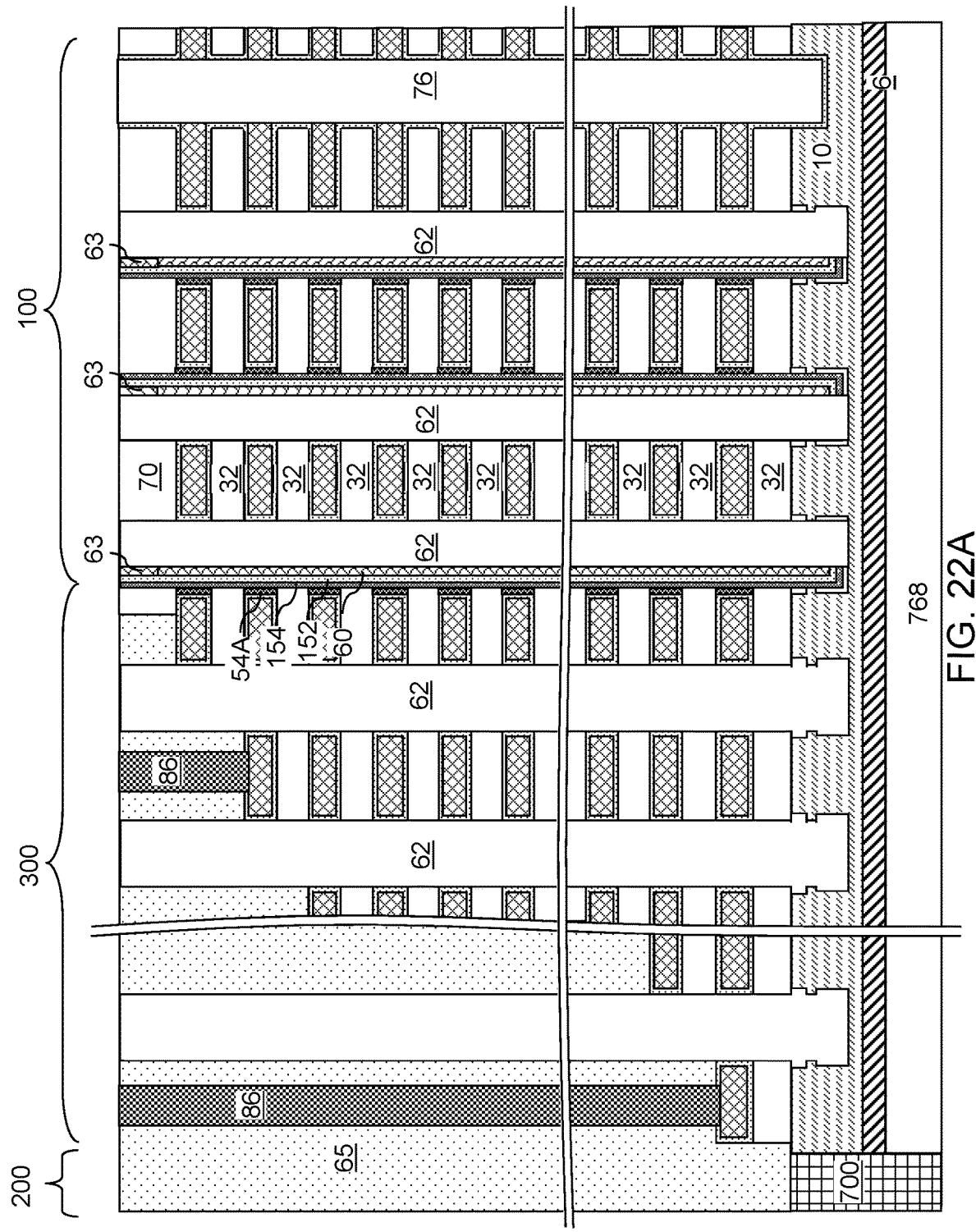
FIG. 22A is a schematic vertical cross-sectional view of the exemplary structure after formation of word line contact via structures according to an embodiment of the present disclosure.
Figure 22B:
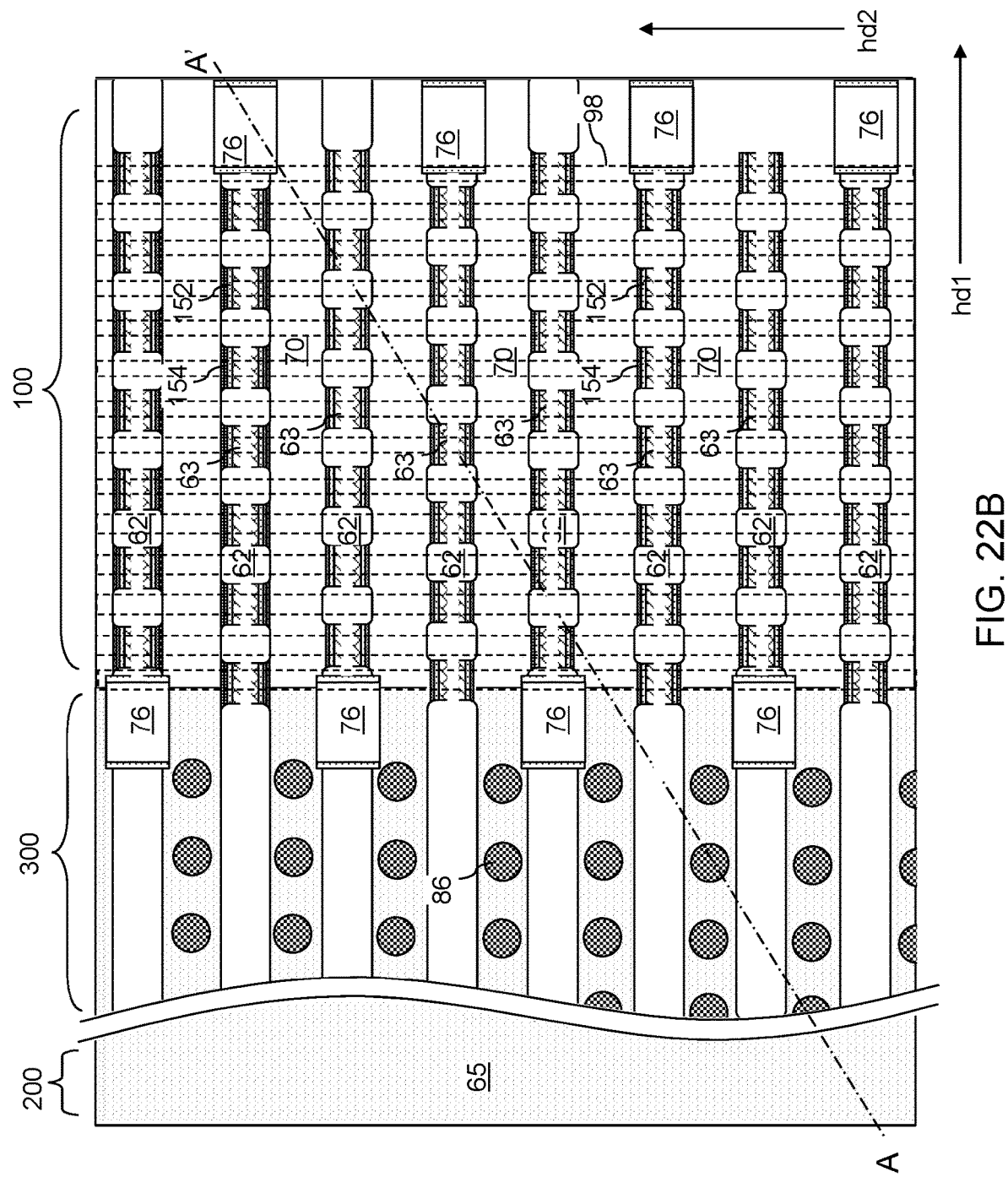
FIG. 22B is a top-down view of the exemplary structure of FIG. 22A. The vertical plane A-A' is the plane of the cross-section for FIG. 22A.

Referring to FIGS. 22A and 22B, contact via structures 86 (which are herein referred to as word line contact via structures) can be formed on the electrically conductive strips 46 through the retro-stepped dielectric material portion 65. A two-dimensional array of contact via structures 86 can be formed on a top surface of a respective one of the electrically conductive strips 46 in the contact region 300.

Additional contact via structures and additional dielectric material layers can be formed over the insulating cap layer 70. For example, drain contact via structures (not expressly illustrated) can be formed on a top surface of each drain region 63. Bit lines 98 can be formed to electrically contact every other drain region 63 along the second horizontal direction hd2, i.e., a respective set of drain regions 63 located within every other line trench 149 along the second horizontal direction hd2. An exemplary layout for the bit lines 98 is illustrated in FIG. 22B. In this configuration, each electrically conductive strip 46, functioning as a word line, activates only a single portion of the memory cell (e.g., a single portion of the memory film 50) per bit line 98, and can program or read the uniquely selected memory cell corresponding to a single activated portion of one of the memory films 50.

Referring to all drawings and according to all embodiments of the present disclosure, a three-dimensional memory device is provided. The three-dimensional memory device comprises: alternating stacks of insulating strips 32 and electrically conductive strips 46 located over a substrate 8 and laterally spaced apart among one another by line trenches 149, wherein the line trenches 149 laterally extend along a first horizontal direction hd1 and are spaced apart along a second horizontal direction hd2; and line trench fill structures (55, 63, 62, 57S, 57T) located in the line trenches 149, wherein each line trench fill structure (55, 63, 62, 57S, 57T) comprises a laterally undulating dielectric rail 62 having a laterally undulating width along the second horizontal direction hd2 and extending along the first horizontal direction hd1 and a row of memory stack structures 55 located at (and on both sides of each of) neck regions of the laterally undulating dielectric rail 62, wherein each memory stack structure 55 comprises a vertical semiconductor channel 60, a blocking dielectric 152 contacting an outer sidewall of the vertical semiconductor channel 60, and a charge storage layer (154, 54A) contacting an outer sidewall of the blocking dielectric 152, vertically extending continuously through each level of the electrically conductive strips 46, and having a vertically modulating lateral thickness (i.e., a lateral thickness that modulates with the distance from the top surface 7 of the substrate 8).

In one embodiment, each charge storage layer (154, 54A) has a first thickness (i.e., the thickness of a continuous charge storage material liner 154 (which is an in-process charge storage layer)) at each level of the insulating strips 32 and a second thickness at each level of the electrically conductive strips 46; and the second thickness is greater than the first thickness. The second thickness can be the sum of the thickness of the continuous charge storage material liner 154 and an annular charge storage spacer 54A.

In one embodiment, each charge storage layer (154, 54A) has a straight inner sidewall that vertically extends continuously through each level of the electrically conductive strips 46, and a laterally undulating outer sidewall that protrudes outward from the straight inner sidewall by a greater distance at each level of the electrically conductive strips 46 than at levels of the insulating strips 32.

In one embodiment, each charge storage layer (154, 54A) contacts a sidewall of a respective insulating strip 32 at each level of the insulating strips 32. In one embodiment, each charge storage layer (154, 54A) contacts a tunneling dielectric 44 at each level of the electrically conductive strips 46. In one embodiment, each tunneling dielectric 44 comprises: vertical portions that laterally surround a respective one of the memory stack structures 55 (and contacting sidewalls of a respective one of the electrically conductive layers 46); an upper horizontal portion adjoined to the vertical portions at a respective top end thereof (and contacting a top surface of the respective one of the electrically conductive layers 46); and a lower horizontal portion adjoined to the vertical portions at a respective bottom end thereof (and contacting a bottom surface of the respective one of the electrically conductive layers 46).

In one embodiment, each of the electrically conductive strips 46 comprises: a metallic nitride liner 46A contacting a respective tunneling dielectric 44; and a metal fill portion 46B comprising at least one elemental metal and embedded within the metallic nitride liner 46A. In one embodiment, the upper horizontal portions and the lower horizontal portions of the tunneling dielectric 44 contact horizontal surfaces of the insulating strips 32; and the vertical portions of the tunneling dielectric 44 contact cylindrical outer sidewalls of the charge storage layers (154, 54A).

In one embodiment, material compositions and thicknesses of the blocking dielectrics 152 and the tunneling dielectrics 44 are selected such that charge tunneling occurs through a tunneling dielectric 44 adjoining a selected memory stack structure 55 while charge tunneling does not occur through any blocking dielectric 152 of the selected memory stack structure 55 upon application of an electrical bias within a programming voltage range across a vertical semiconductor channel 60 of the selected memory stack structure 55 and an adjacent electrically conductive strip 46. Thus, the memory stack structures 55 are operated in a reverse programming mode. In one embodiment, the tunneling dielectric 44 contacts sidewalls of at least two laterally undulating dielectric rails 62, which can be laterally spaced apart along the second horizontal direction hd2.

In one embodiment, the neck regions of the laterally undulating dielectric rails 62 contacts a respective vertical semiconductor channel 60; each laterally undulating dielectric rail 62 includes bulbous regions that contact sidewalls of the insulating strips 32; and insulating strips 32 within a same alternating stack (32, 46) contact a laterally undulating dielectric rail 62 and a set of charge storage layers (154, 54A) (i.e., outer sidewalls of continuous charge storage material liners 154) within a planar two-dimensional vertical plane (which includes vertical interfaces between the insulating strips 32 and the continuous charge storage material liners 154 that are portions of the set of charge storage layers (154, 54A)).

In one embodiment, a buried source line (112, 114, 116) is located below the alternating stacks (32, 46), wherein each vertical semiconductor channel 60 includes a respective side surface that contacts the buried source line (112, 114, 116).

In one embodiment, the three-dimensional memory device comprises: a contact region 300 in which each alternating stack (32, 46) has respective stepped surfaces that extend from a bottommost strip to a topmost strip within a respective alternating stack (32, 46); and a two-dimensional array of contact via structures 86 contacting a top surface of a respective one of the electrically conductive strips 46 within the alternating stacks (32, 46) in the contact region 300.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
alternating stacks of insulating strips and electrically conductive strips located over a substrate and laterally spaced apart among one another by line trenches, wherein the line trenches having sidewalls that laterally extend along a first horizontal direction and are spaced apart along a second horizontal direction; and
line trench fill structures located in the line trenches, wherein each line trench fill structure comprises a laterally undulating dielectric rail having a laterally undulating width along the second horizontal direction and extending along the first horizontal direction and a row of memory stack structures located at a plurality of neck regions of the laterally undulating dielectric rail,
wherein each memory stack structure comprises a vertical semiconductor channel, a blocking dielectric contacting an outer sidewall of the vertical semiconductor channel, and a charge storage layer contacting an outer sidewall of the blocking dielectric, vertically extending continuously through each level of the electrically conductive strips, and having a vertically undulating lateral thickness.

2. The three-dimensional memory device of claim 1, wherein:
each charge storage layer has a first thickness at each level of the insulating strips and a second thickness at each level of the electrically conductive strips; and
the second thickness is greater than the first thickness.

3. The three-dimensional memory device of claim 2, wherein each charge storage layer has a straight inner sidewall that vertically extends continuously through each level of the electrically conductive strips, and annular charge storage spacers that form a laterally undulating outer sidewall of the charge storage layer that protrudes outward from the straight inner sidewall by a greater distance at each level of the electrically conductive strips than at levels of the insulating strips.

4. The three-dimensional memory device of claim 1, wherein each charge storage layer contacts a sidewall of a respective insulating strip at each level of the insulating strips.

5. The three-dimensional memory device of claim 1, further comprising a tunneling dielectric located between the electrically conductive strips and the charge storage layer, wherein each charge storage layer contacts the tunneling dielectric at each level of the electrically conductive strips.

6. The three-dimensional memory device of claim 5, wherein each tunneling dielectric comprises:
vertical portions that laterally surround a respective one of the memory stack structures;
an upper horizontal portion adjoined to the vertical portions at a respective top end thereof; and
a lower horizontal portion adjoined to the vertical portions at a respective bottom end thereof.

7. The three-dimensional memory device of claim 6, wherein each of the electrically conductive strips comprises:
a metallic nitride liner contacting a respective tunneling dielectric; and
a metal fill portion comprising at least one elemental metal and embedded within the metallic nitride liner.

8. The three-dimensional memory device of claim 6, wherein:
the upper horizontal portions and the lower horizontal portions of the tunneling dielectric contact horizontal surfaces of the insulating strips; and
the vertical portions of the tunneling dielectric contact cylindrical outer sidewalls of the charge storage layers.

9. The three-dimensional memory device of claim 5, wherein material compositions and thicknesses of the blocking dielectrics and the tunneling dielectrics are selected such that charge tunneling occurs through the tunneling dielectric adjoining a selected memory stack structure while charge tunneling does not occur through any blocking dielectric of the selected memory stack structure upon application of an electrical bias within a programming voltage range across a vertical semiconductor channel of the selected memory stack structure and an adjacent electrically conductive strip.

10. The three-dimensional memory device of claim 5, wherein the tunneling dielectric contacts sidewalls of at least two laterally undulating dielectric rails.

11. The three-dimensional memory device of claim 1, wherein:
the plurality of neck regions of the laterally undulating dielectric rails contacts a respective vertical semiconductor channel;
each laterally undulating dielectric rail includes a plurality of bulbous regions that contact sidewalls of the insulating strips; and
insulating strips within a same alternating stack contact a laterally undulating dielectric rail and a set of charge storage layers within a planar two-dimensional vertical plane.

12. The three-dimensional memory device of claim 1, further comprising a buried source line located below the alternating stacks, wherein each vertical semiconductor channel includes a respective side surface that contacts the buried source line.

13. The three-dimensional memory device of claim 1, further comprising:
a contact region in which each alternating stack has respective stepped surfaces that extend from a bottommost strip to a topmost strip within a respective alternating stack; and
a two-dimensional array of contact via structures contacting a top surface of a respective one of the electrically conductive strips within the alternating stacks in the contact region.

14. The three-dimensional memory device of claim 1, wherein the laterally undulating dielectric rail within each the line trench fill structure has a minimum width along the second horizontal direction at the plurality of neck regions, and has a maximum width along the second horizontal direction at a plurality of bulbous regions that are interlaced with the plurality of neck regions along the first horizontal direction.

15. The three-dimensional memory device of claim 14, wherein the minimum width is a lateral separation distance between a pair of sidewalls of one of the vertical semiconductor channels.

16. The three-dimensional memory device of claim 14, wherein the maximum with is the same as a lateral separation distance between a neighboring pair of sidewalls of insulating strips within a neighboring pair among the alternating stacks of insulating strips and electrically conductive strips.

17. The three-dimensional memory device of claim 14, wherein each of the plurality of neck regions and the plurality of bulbous regions has a respective pair of straight sidewalls that are parallel to the sidewalls of the straight sidewalls of the line trenches.

18. The three-dimensional memory device of claim 1, wherein lateral undulation of the laterally undulating width within each line trench fill structure is periodic along the first horizontal direction.

19. The three-dimensional memory device of claim 1, wherein the line trenches have a respective pair of straight sidewalls that laterally extend along the first horizontal direction and are spaced apart along the second horizontal direction.

20. The three-dimensional memory device of claim 1, wherein the electrically conductive strips do not include any hole therethrough.

* * * * *